US012660715B2

(12) United States Patent
Simsek-Ege et al.

(10) Patent No.: US 12,660,715 B2
(45) Date of Patent: Jun. 16, 2026

(54) METHODS OF FORMING MICROELECTRONIC DEVICES

(71) Applicant: Micron Technology, Inc., Boise, ID (US)

(72) Inventors: Fatma Arzum Simsek-Ege, Boise, ID (US); Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 119 days.

(21) Appl. No.: 18/491,694

(22) Filed: Oct. 20, 2023

(65) Prior Publication Data

US 2024/0047450 A1 Feb. 8, 2024

Related U.S. Application Data

(62) Division of application No. 17/364,377, filed on Jun. 30, 2021, now Pat. No. 11,842,990.

(51) Int. Cl.
*H01L 25/18* (2023.01)
*H10B 12/00* (2023.01)
(Continued)

(52) U.S. Cl.
CPC .......... *H10W 90/00* (2026.01); *H10B 12/036* (2023.02); *H10B 12/33* (2023.02);
(Continued)

(58) Field of Classification Search
CPC . H01L 2224/29186; H01L 2224/32145; H01L 2224/83193; H01L 2224/83895;
(Continued)

(56) References Cited

U.S. PATENT DOCUMENTS 5,953,630 A 9/1999 Maeda et al.
6,125,070 A 9/2000 Tomishima
(Continued)

FOREIGN PATENT DOCUMENTS

CN 112614853 A 4/2021
CN 112802855 A 5/2021
(Continued)

OTHER PUBLICATIONS

International Search Report for International Application No. PCT/US2022/072842, mailed Oct. 11, 2022, 3 pages.
(Continued)

*Primary Examiner* — Britt Hanley
*Assistant Examiner* — Kevin Quinto
(74) *Attorney, Agent, or Firm* — TraskBritt

(57) ABSTRACT

A method of forming a microelectronic device comprises forming a microelectronic device structure assembly comprising memory cells, digit lines coupled to the memory cells, word lines coupled to the memory cells, and isolation material overlying the memory cells, the digit lines, and the word lines. An additional microelectronic device structure assembly comprising control logic devices and additional isolation material overlying the control logic devices is formed. The additional isolation material of the additional microelectronic device structure assembly is bonded to the isolation material of the microelectronic device structure assembly to attach the additional microelectronic device structure assembly to the microelectronic device structure assembly. The memory cells are electrically connected to at least some of the control logic devices after bonding the additional isolation material to the isolation material. Microelectronic devices, electronic systems, and additional methods are also described.

17 Claims, 29 Drawing Sheets

(51) Int. Cl.
*H10W 90/00* (2026.01)
*H10W 72/00* (2026.01)

(52) U.S. Cl.
CPC ......... *H10B 12/482* (2023.02); *H10B 12/485* (2023.02); *H10B 12/488* (2023.02); *H10W 72/07331* (2026.01)

(58) Field of Classification Search
CPC . H01L 2224/83896; H01L 2225/06527; H01L 24/29; H01L 24/32; H01L 24/83; H01L 25/0657; H01L 25/18; H01L 25/50; H10B 12/033; H10B 12/036; H10B 12/315; H10B 12/33; H10B 12/482; H10B 12/485; H10B 12/488
See application file for complete search history.

(56) References Cited

U.S. PATENT DOCUMENTS

| | | | |
|---|---|---|---|
| 8,067,286 | B2 | 11/2011 | Parekh et al. |
| 8,153,499 | B2 | 4/2012 | Or-Bach et al. |
| 8,184,471 | B2 | 5/2012 | Woo et al. |
| 8,546,188 | B2 | 10/2013 | Liu et al. |
| 8,716,116 | B2 | 5/2014 | Parekh et al. |
| 9,012,292 | B2 | 4/2015 | Lee |
| 9,543,433 | B2 | 1/2017 | Anathan et al. |
| 10,510,738 | B2 | 12/2019 | Kim et al. |
| 11,114,335 | B1 | 9/2021 | Lu |
| 11,557,572 | B2 | 1/2023 | Huang |
| 11,562,985 | B2 | 1/2023 | Liu et al. |
| 2002/0127846 | A1 | 9/2002 | Burrell et al. |
| 2004/0089357 | A1* | 5/2004 | Dube .................. B01L 3/50273 137/884 |
| 2008/0253095 | A1* | 10/2008 | Baraton ................ H01L 23/481 361/752 |
| 2009/0108318 | A1 | 4/2009 | Yoon et al. |
| 2009/0168482 | A1 | 7/2009 | Park et al. |
| 2010/0155932 | A1 | 6/2010 | Gambino et al. |
| 2010/0230724 | A1 | 9/2010 | Sinha et al. |
| 2012/0003808 | A1* | 1/2012 | Lee ........................ H10D 1/042 257/E21.09 |
| 2014/0117420 | A1 | 5/2014 | Chen et al. |
| 2016/0260756 | A1 | 9/2016 | Yamagishi |
| 2019/0043836 | A1 | 2/2019 | Fastow et al. |
| 2019/0074277 | A1 | 3/2019 | Ramaswamy |
| 2019/0103302 | A1 | 4/2019 | Yoon |
| 2019/0104260 | A1 | 4/2019 | Izuhara |
| 2019/0164914 | A1 | 5/2019 | Hu et al. |
| 2019/0214560 | A1 | 7/2019 | Brightsky |
| 2019/0244933 | A1 | 8/2019 | Or-Bach et al. |
| 2020/0066730 | A1 | 2/2020 | Guo et al. |
| 2020/0083229 | A1 | 3/2020 | Kim et al. |
| 2020/0111793 | A1 | 4/2020 | Kim et al. |
| 2020/0203272 | A1 | 6/2020 | Doebler et al. |
| 2020/0258876 | A1 | 8/2020 | Hosoda et al. |
| 2020/0286875 | A1 | 9/2020 | Nishida et al. |
| 2020/0328186 | A1 | 10/2020 | Liu |
| 2020/0328188 | A1 | 10/2020 | Liu et al. |
| 2020/0350014 | A1 | 11/2020 | Liu |
| 2020/0395328 | A1 | 12/2020 | Fastow et al. |
| 2020/0411524 | A1 | 12/2020 | Arslan et al. |
| 2021/0036015 | A1 | 2/2021 | Lim et al. |
| 2021/0043606 | A1 | 2/2021 | Bowers et al. |
| 2021/0118887 | A1 | 4/2021 | Kuo |
| 2021/0118890 | A1 | 4/2021 | Kim et al. |
| 2021/0143115 | A1 | 5/2021 | Wu et al. |
| 2021/0159216 | A1 | 5/2021 | Wu et al. |
| 2021/0183996 | A1 | 6/2021 | Lee et al. |
| 2021/0217716 | A1 | 7/2021 | Wu et al. |
| 2021/0257266 | A1 | 8/2021 | Lae |
| 2021/0265295 | A1 | 8/2021 | Liu et al. |
| 2021/0296284 | A1 | 9/2021 | Sharangpani et al. |
| 2021/0383874 | A1 | 12/2021 | Oh et al. |
| 2021/0398967 | A1 | 12/2021 | Parekh |
| 2021/0407980 | A1 | 12/2021 | Young et al. |
| 2022/0005820 | A1 | 1/2022 | Kim et al. |
| 2022/0052010 | A1 | 2/2022 | Goda et al. |
| 2022/0077090 | A1 | 3/2022 | Setta |
| 2022/0077129 | A1 | 3/2022 | Sung et al. |
| 2022/0085048 | A1 | 3/2022 | Lee et al. |
| 2022/0123006 | A1 | 4/2022 | Ahn et al. |
| 2022/0216239 | A1 | 7/2022 | Yoo et al. |
| 2022/0302150 | A1 | 9/2022 | Zhang et al. |
| 2022/0328493 | A1 | 10/2022 | Wang et al. |
| 2022/0367505 | A1 | 11/2022 | Chen et al. |
| 2022/0399309 | A1 | 12/2022 | Simsek-Ege |
| 2023/0015040 | A1 | 1/2023 | Or-Bach et al. |

FOREIGN PATENT DOCUMENTS

| | | | |
|---|---|---|---|
| CN | 113053435 | A | 6/2021 |
| TW | 201523855 | A | 6/2015 |
| TW | 202040800 | A | 11/2020 |
| TW | 202125778 | A | 7/2021 |
| WO | 2008/063251 | A2 | 5/2008 |
| WO | 2020/211272 | A1 | 10/2020 |

OTHER PUBLICATIONS

International Written Opinion for International Application No. PCT/US2022/072842, mailed Oct. 11, 2022, 4 pages.
Simsek-Ege et al., U.S. Appl. No. 17/364,476 (Year: 2021).
Taiwanese Search Report and Office Action from Taiwanese Application No. 111123372, dated Jun. 14, 2023, 10 pages with English translation.
European Extended Search Report and Opinion for European Application No. 22834365.3, dated Dec. 10, 2024, 10 pages.

\* cited by examiner

METHODS OF FORMING MICROELECTRONIC DEVICES

CROSS-REFERENCE TO RELATED APPLICATIONS

This application is a divisional of U.S. patent application Ser. No. 17/364,377, filed Jun. 30, 2021, now U.S. Pat. No. 11,842,990, issued Dec. 12, 2023, which is related to U.S. patent application Ser. No. 17/364,281, filed Jun. 30, 2021, now U.S. Pat. No. 11,785,764, issued Oct. 10, 2023, listing Fatma Arzum Simsek-Ege, Kunal R. Parekh, Terrence B. McDaniel, and Beau D. Barry as inventors, for "METHODS OF FORMING MICROELECTRONIC DEVICES," to U.S. patent application Ser. No. 17/364,335, filed Jun. 30, 2021, now U.S. Pat. No. 11,996,377, issued May 28, 2024, listing Fatma Arzum Simsek-Ege, Kunal R. Parekh, and Beau D. Barry as inventors, for "MICROELECTRONIC DEVICES AND ELECTRONIC SYSTEMS," to U.S. patent application Ser. No. 17/364,429, filed Jun. 30, 2021, now U.S. Pat. No. 11,776,925, issued Oct. 3, 2023, listing Fatma Arzum Simsek-Ege as inventor, for "METHODS OF FORMING MICROELECTRONIC DEVICES, AND RELATED MICROELECTRONIC DEVICES AND ELECTRONIC SYSTEMS," to U.S. patent application Ser. No. 17/364,476, filed Jun. 30, 2021, now U.S. Pat. No. 11,837,594, issued Dec. 5, 2023, listing Fatma Arzum Simsek-Ege and Kunal R. Parekh as inventors, for "MICROELECTRONIC DEVICES AND ELECTRONIC SYSTEMS," and to U.S. patent application Ser. No. 17/364,379, filed Jun. 30, 2021, now U.S. Pat. No. 11,930,637, issued Mar. 12, 2024, listing Fatma Arzum Simsek-Ege as inventor, for "METHODS OF FORMING MICROELECTRONIC DEVICES." The disclosure of each of the foregoing documents is hereby incorporated herein in its entirety by reference.

TECHNICAL FIELD

The disclosure, in various embodiments, relates generally to the field of microelectronic device design and fabrication. More specifically, the disclosure relates to methods of forming microelectronic devices and memory devices, and to related microelectronic devices, memory devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified, easier and less expensive to fabricate designs.

One example of a microelectronic device is a memory device. Memory devices are generally provided as internal integrated circuits in computers or other electronic devices. There are many types of memory devices including, but not limited to, volatile memory devices. One type of volatile memory device is a dynamic random-access memory (DRAM) device. A DRAM device may include a memory array including DRAM cells arranged in rows extending in a first horizontal direction and columns extending in a second horizontal direction. In one design configuration, an individual DRAM cell includes an access device (e.g., a transistor) and a storage node device (e.g., a capacitor)

electrically connected to the access device. The DRAM cells of a DRAM device are electrically accessible through digit lines and word lines arranged along the rows and columns of the memory array and in electrical communication with control logic devices within a base control logic structure of the DRAM device.

Control logic devices within a base control logic structure underlying a memory array of a DRAM device have been used to control operations on the DRAM cells of the DRAM device. Control logic devices of the base control logic structure can be provided in electrical communication with digit lines and word lines coupled to the DRAM cells by way of routing and contact structures. Unfortunately, processing conditions (e.g., temperatures, pressures, materials) for the formation of the memory array over the base control logic structure can limit the configurations and performance of the control logic devices within the base control logic structure. In addition, the quantities, dimensions, and arrangements of the different control logic devices employed within the base control logic structure can also undesirably impede reductions to the size (e.g., horizontal footprint) of a memory device, and/or improvements in the performance (e.g., faster memory cell ON/OFF speed, lower threshold switching voltage requirements, faster data transfer rates, lower power consumption) of the DRAM device.

DETAILED DESCRIPTION

Figure 1:
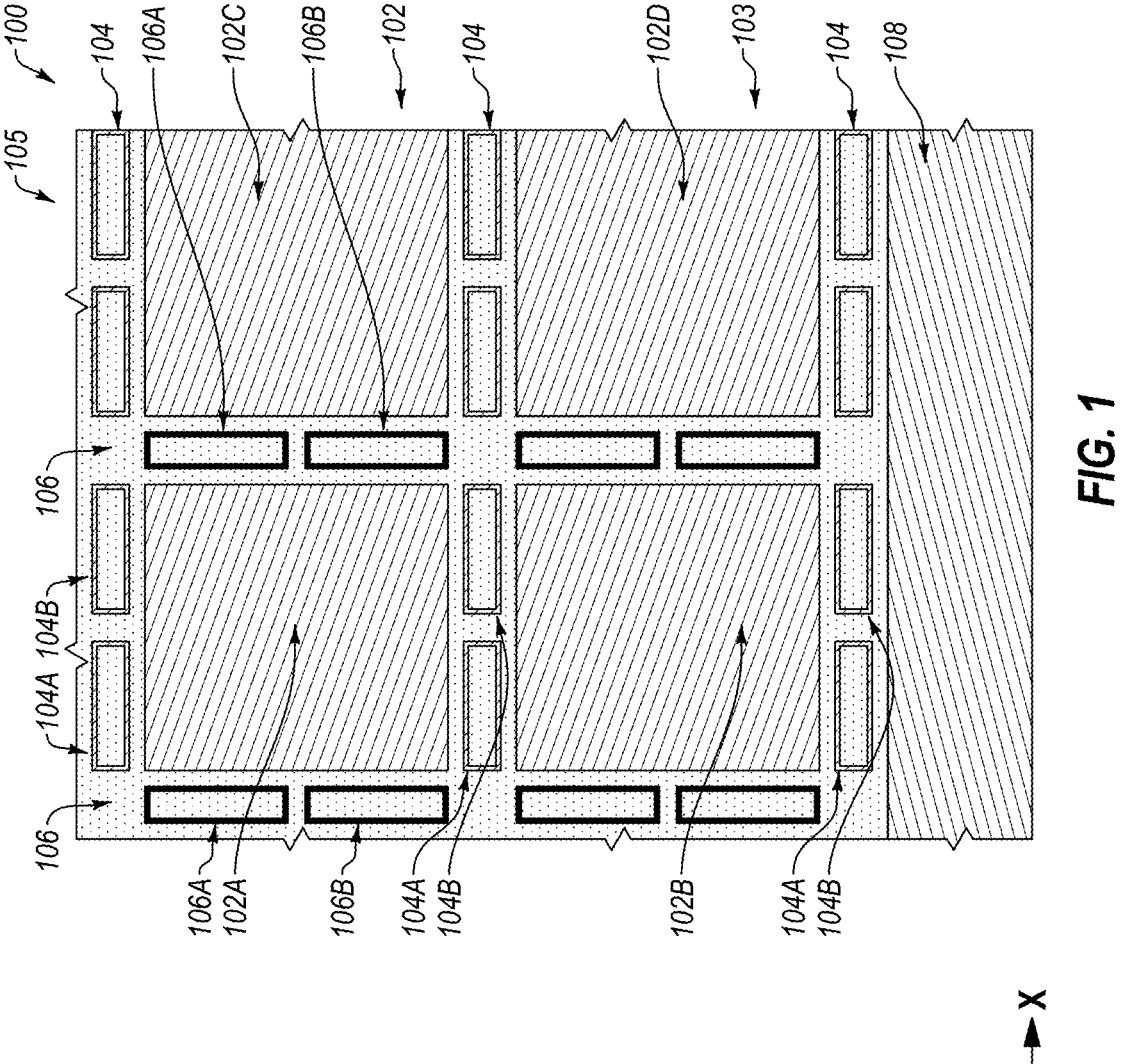
FIG. 1 is a simplified plan view of a microelectronic device structure at a processing stage of a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details.

Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory; conventional non-volatile memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g, horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively doped polysilicon, conductively doped germanium (Ge), conductively doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, SiOxCzNy) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIGS. 1 through 15 are various views (described in further detail below) illustrating different processing stages of a method of forming a microelectronic device (e.g., a memory device, such as a DRAM device), in accordance with embodiments of the disclosure. With the description provided below, it will be readily apparent to one of ordinary skill in the art that the methods described herein may be used for forming various devices. In other words, the methods of the disclosure may be used whenever it is desired to form a microelectronic device. With the description provided below, it will be readily apparent to one of ordinary skill in the art that the methods and structures described herein may be used to form various devices and electronic systems.

FIG. 1 shows a simplified plan view of a first microelectronic device structure 100 (e.g., a first wafer) at an early processing stage of a method of forming a microelectronic device (e.g., a memory device, such as a DRAM device), in accordance with embodiments of the disclosure. As shown in FIG. 1, the first microelectronic device structure 100 may be formed to include array regions 102, digit line exit regions 104 (also referred to as "digit line contact socket regions") interposed between pairs of the array regions 102 horizontally neighboring one another in a first horizontal direction (e.g., the Y-direction), word line exit regions 106 (also referred to as "word line contact socket regions") interposed between additional pairs of the array regions 102 horizontally neighboring one another in a second horizontal direction (e.g., the X-direction) orthogonal to the first horizontal direction, and one or more socket regions 108 (also referred to as "back end of line (BEOL) contact socket regions") horizontally neighboring some of the array regions 102 in one or more of the first horizontal direction and the second horizontal direction. The array regions 102, the digit line exit regions 104, the word line exit regions 106, and the socket regions 108 are each described in further detail below.

The array regions 102 of the first microelectronic device structure 100 may comprise horizontal areas of the first microelectronic device structure 100 configured and positioned to have arrays of memory cells (e.g., arrays of DRAM cells) subsequently formed within horizontal boundaries thereof, as described in further detail below. In addition, the array regions 102 may also be configured and positioned to have desirable arrangements of control logic devices subsequently formed within horizontal boundaries thereof, as also described in further detail below. The control logic devices to be formed within the horizontal boundaries of the array regions 102 may be formed to be vertically offset (e.g., in the Z-direction) from the memory cells to be formed within the horizontal boundaries of the array regions 102.

The first microelectronic device structure 100 may be formed to include a desired quantity of the array regions 102. For clarity and ease of understanding of the drawings and related description, FIG. 1 depicts the first microelectronic device structure 100 as being formed to include four (4) array regions 102: a first array region 102A, a second array region 102B, a third array region 102C, and a fourth array region 102D. As shown in FIG. 1, the second array region 102B may horizontally neighbor the first array region 102A in the Y-direction, and may horizontally neighbor the fourth array region 102D in the X-direction; the third array region 102C may horizontally neighbor the first array region 102A in the X-direction, and may horizontally neighbor the fourth array region 102D in the Y-direction; and the fourth array region 102D may horizontally neighbor the third array region 102C in the Y-direction, and may horizontally neighbor the second array region 102B in the Y-direction. In additional embodiments, the first microelectronic device structure 100 is formed to include a different number of array regions 102. For example, the first microelectronic device structure 100 may be formed to include greater than four (4) array regions 102, such as greater than or equal to eight (8) array regions 102, greater than or equal to sixteen (16) array regions 102, greater than or equal to thirty-two (32) array regions 102, greater than or equal to sixty-four (64) array regions 102, greater than or equal to one hundred twenty-eight (128) array regions 102, greater than or equal to two hundred fifty-six (256) array regions 102, greater than or equal to five hundred twelve (512) array regions 102, or greater than or equal to one thousand twenty-four (1024) array regions 102.

In addition, the first microelectronic device structure 100 may be formed to include a desired distribution of the array regions 102. As shown in FIG. 1, in some embodiments, the first microelectronic device structure 100 is formed to include rows 103 of the array regions 102 extending in the X-direction, and columns 105 of the array regions 102 extending in the Y-direction. The rows 103 of the array regions 102 may, for example, include a first row including the first array region 102A and the third array region 102C, and a second row including the second array region 102B and the fourth array region 102D. The columns 105 of the array regions 102 may, for example, include a first column including the first array region 102A and the second array region 102B, and a second column including the third array region 102C and the fourth array region 102D.

With continued reference to FIG. 1, the digit line exit regions 104 of the first microelectronic device structure 100 may comprise horizontal areas of the first microelectronic device structure 100 configured and positioned to have at least some subsequently formed digit lines (e.g., bit lines, data lines) horizontally terminate therein. For an individual digit line exit region 104, at least some subsequently formed digit lines operatively associated with the array regions 102 flanking (e.g., at opposing boundaries in the Y-direction) the digit line exit region 104 may have ends within the horizontal boundaries of the digit line exit region 104. In addition, the digit line exit regions 104 may also be configured and positioned to include contact structures and routing structures with the horizontal boundaries thereof that are operatively associated with at least some of the subsequently formed digit lines. As described in further detail below, some of the contact structures to be formed within the digit line exit regions 104 may couple the subsequently formed digit lines to control logic circuitry of control logic devices (e.g., sense amplifier (SA) devices) to subsequently be formed within the array regions 102. As shown in FIG. 1, in some embodiments, the digit line exit regions 104 horizontally extend in the X-direction and are horizontally interposed between horizontally neighboring rows of the array regions 102 in the Y-direction. The digit line exit regions 104 may, for example, horizontally alternate with the rows of the array regions 102 in the Y-direction.

An individual digit line exit region 104 may be divided into multiple subregions. For example, as shown in FIG. 1, an individual digit line exit region 104 may include first digit line exit subregions 104A and second digit line exit subregions 104B. In some embodiments, the first digit line exit subregions 104A horizontally alternate with the second digit line exit subregions 104B in the X-direction. A pair (e.g., two (2)) of horizontally neighboring array regions 102 within an individual column of the array regions 102 may include one (1) of the first digit line exit subregions 104A and one (1) of the second digit line exit subregions 104B positioned horizontally therebetween in the Y-direction. By way of non-limiting example, the first array region 102A and the second array region 102B of a first column of the array regions 102 may include one (1) of the first digit line exit subregions 104A and one (1) of the second digit line exit subregions 104B positioned therebetween in the Y-direction. The one (1) of the first digit line exit subregions 104A and the one (1) of the second digit line exit subregions 104B may be at least partially (e.g., substantially) confined with horizontal boundaries in the X-direction of the first array region 102A and the second array region 102B.

As described in further detail below, an individual first digit line exit subregion 104A may be configured and positioned to facilitate electrical connections between a group of digit lines (e.g., odd digit lines or even digit lines) and a group of control logic devices (e.g., odd SA devices or even SA devices) operatively associated with a portion (e.g., a half portion in the X-direction) of one (1) array region 102 (e.g., the first array region 102A) of a pair of horizontally neighboring array regions 102, and to also facilitate electrical connections between a group of additional digit lines (e.g., additional odd digit lines or additional even digit lines) and a group of additional control logic devices (e.g., additional odd SA devices or additional even SA devices) operatively associated with a corresponding portion (e.g., a corresponding half portion in the X-direction) of an additional array region 102 (e.g., the second array region 102B) of the pair of horizontally neighboring array regions 102. In addition, as also described in further detail below, an individual second digit line exit subregion 104B may be configured and positioned to facilitate electrical connections between a group of further digit lines and a group of further control logic devices operatively associated with another portion (e.g., another half portion in the X-direction) of the one (1) array region 102 (e.g., the first array region 102A), and to also facilitate electrical connections between a group of yet further digit lines and a group of yet further control logic devices operatively associated with a corresponding another portion (e.g., a corresponding another half portion in the X-direction) of the additional array region 102 (e.g., the second array region 102B).

Still referring to FIG. 1, the word line exit regions 106 of the first microelectronic device structure 100 may comprise horizontal areas of the first microelectronic device structure 100 configured and positioned to have at least some subsequently formed word lines (e.g., access lines) horizontally terminate therein. For an individual word line exit region 106, at least some subsequently formed word lines operatively associated with the array regions 102 flanking (e.g., at opposing boundaries in the X-direction) the word line exit region 106 may have ends within the horizontal boundaries of the word line exit region 106. In addition, the word line exit regions 106 may also be configured and positioned to include contact structures and routing structures within the horizontal boundaries thereof that are operatively associated with the subsequently formed word lines. As described in further detail below, some of the contact structures to be formed within the word line exit regions 106 may couple the subsequently formed word lines to control logic circuitry of additional control logic devices (e.g., sub-word line driver (SWD) devices) to subsequently be formed within the array regions 102. As shown in FIG. 1, in some embodiments, the word line exit regions 106 horizontally extend in the Y-direction and are horizontally interposed between horizontally neighboring columns of the array regions 102 in the X-direction. The word line exit regions 106 may, for example, horizontally alternate with the columns of the array regions 102 in the X-direction.

An individual word line exit region 106 may be divided into multiple subregions. For example, as shown in FIG. 1, an individual word line exit region 106 may include first word line exit subregions 106A and second word line exit subregions 106B. In some embodiments, the first word line exit subregions 106A horizontally alternate with the second word line exit subregions 106B in the Y-direction. A pair (e.g., two (2)) of horizontally neighboring array regions 102 within an individual row of the array regions 102 may include one (1) of the first word line exit subregions 106A and one (1) of the second word line exit subregions 106B positioned horizontally therebetween in the X-direction. By way of non-limiting example, the first array region 102A and the third array region 102C of a first row of the array regions 102 may include one (1) of the first word line exit subregions 106A and one (1) of the second word line exit subregions 106B positioned therebetween in the X-direction. The one (1) of the first word line exit subregions 106A and the one (1) of the second word line exit subregions 106B may be at least partially (e.g., substantially) confined with horizontal boundaries in the Y-direction of the first array region 102A and the third array region 102C.

As described in further detail below, an individual first word line exit subregion 106A may be configured and positioned to facilitate electrical connections between a group of word lines (e.g., odd word lines or even word lines) and a group of control logic devices (e.g., odd SWD devices or even SWD devices) operatively associated with a portion (e.g., a half portion in the Y-direction) of one (1) array region 102 (e.g., the first array region 102A) of a pair of horizontally neighboring array regions 102, and to also facilitate electrical connections between a group of additional word lines (e.g., additional odd word lines or additional even word lines) and a group of additional control logic devices (e.g., additional odd SWD devices or additional even SWD devices) operatively associated with a corresponding portion (e.g., a corresponding half portion in the Y-direction) of a further array region 102 (e.g., the third array region 102C) of the pair of horizontally neighboring array regions 102. In addition, as also described in further detail below, an individual second word line exit subregion 106B may be configured and positioned to facilitate electrical connections between a group of further word lines and a group of further control logic devices operatively associated with another portion (e.g., another half portion in the Y-direction) of the one (1) array region 102 (e.g., the first array region 102A), and to also facilitate electrical connections between a group of yet further word lines and a group of yet further control logic devices operatively associated with a corresponding another portion (e.g., a corresponding another half portion in the Y-direction) of the further array region 102 (e.g., the third array region 102C).

With continued reference to FIG. 1, the socket regions 108 of the first microelectronic device structure 100 may comprise horizontal areas of the first microelectronic device structure 100 configured and positioned to facilitate electrical connections (e.g., by way of contact structures and routing structures formed within horizontal boundaries thereof) between subsequently formed control logic circuitry and additional subsequently formed structures (e.g., BEOL structures), as described in further detail below. The socket regions 108 may horizontally neighbor one or more peripheral horizontal boundaries (e.g., in the Y-direction, in the X-direction) of one or more groups of the array regions 102. For clarity and ease of understanding of the drawings and related description, FIG. 1 depicts the first microelectronic device structure 100 as being formed to include one (1) socket region 108 horizontally neighboring a shared horizontal boundary of the second array region 102B and the fourth array region 102D. However, the first microelectronic device structure 100 may be formed to include one or more of a different quantity and a different horizontal position of socket region(s) 108. As a non-limiting example, the socket region 108 may horizontally neighbor a shared horizontal boundary of a different group of the array regions 102 (e.g., a shared horizontal boundary of the third array region 102C and the fourth array region 102D, a shared horizontal boundary of the first array region 102A and the third array region 102C, a shared horizontal boundary of the first array region 102A and the second array region 102B). As another non-limiting example, the first microelectronic device structure 100 may be formed to include multiple (e.g., a plurality of, more than one) socket regions 108 horizontally neighboring different groups of the array regions 102 than one another. In some embodiments, multiple socket regions 108 collectively substantially horizontally surround (e.g., substantially horizontally circumscribe) the array regions 102.

Figure 2B:
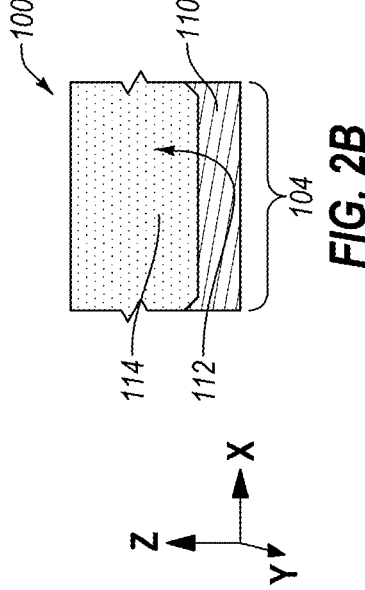
FIGS. 2A through 2D are simplified, partial longitudinal cross-sectional views of an array region (FIG. 2A), a digit line exit region (FIG. 2B), a word line exit region (FIG. 2C), and a socket region (FIG. 2D) of the microelectronic device structure shown in FIG. 1 at the processing stage of FIG. 1.
Figure 2A:
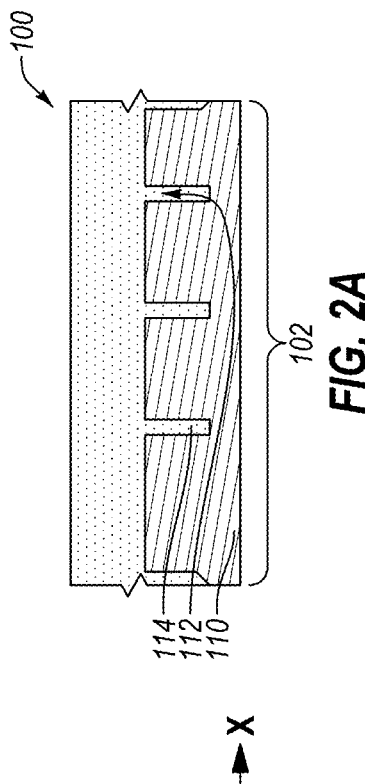
Figure 2D:
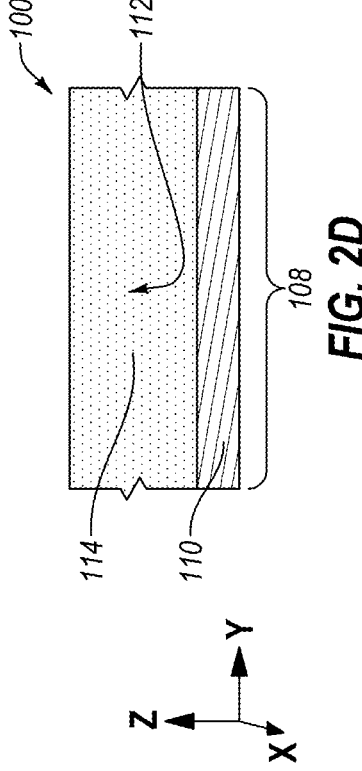
Figure 2C:
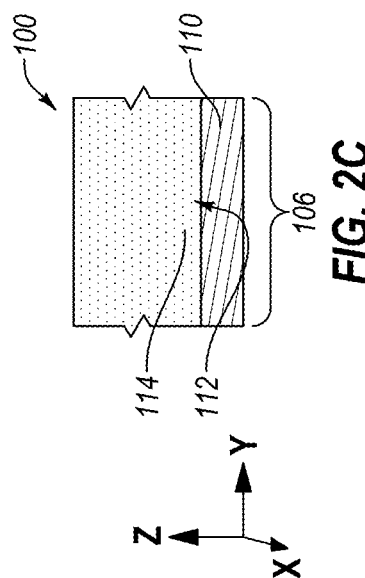

FIGS. 2A through 2D illustrate simplified, partial longitudinal cross-sectional views of different regions of the first microelectronic device structure 100 previously described with reference to FIG. 1. FIG. 2A illustrates a simplified, partial longitudinal cross-sectional view from the perspective of the Y-direction (so as to depict an XZ-plane) of one of the array regions 102 (e.g., the first array region 102A) of the first microelectronic device structure 100 shown in FIG. 1. FIG. 2B illustrates a simplified, partial longitudinal cross-sectional view from the perspective of the Y-direction (so as to depict an XZ-plane) of one of the digit line exit regions 104 of the first microelectronic device structure 100 shown in FIG. 1. FIG. 2C illustrates a simplified, partial longitudinal cross-sectional view from the perspective of the X-direction (so as to depict a YZ-plane) of one of the word line exit regions 106 of the first microelectronic device structure 100 shown in FIG. 1. FIG. 2D illustrates a simplified, partial longitudinal cross-sectional view from the perspective of the X-direction (so as to depict a YZ-plane) of one of socket regions 108 of the first microelectronic device structure 100 shown in FIG. 1.

Referring collectively to FIGS. 2A through 2D, the first microelectronic device structure 100 may be formed to include a first base semiconductor structure 110, filled trenches 112, and a first isolation material 114. The filled trenches 112 vertically extend (e.g., in the Z-direction) into the first base semiconductor structure 110. The first isolation material 114 covers and surrounds surfaces of the first base semiconductor structure 110.

The first base semiconductor structure 110 comprises a base material or construction upon which additional features (e.g., materials, structures, devices) of the first microelectronic device structure 100 are formed. The first base semiconductor structure 110 may comprise a semiconductor structure (e.g., a semiconductor wafer), or a base semiconductor material on a supporting structure. For example, the first base semiconductor structure 110 may comprise a conventional silicon substrate (e.g., a conventional silicon wafer), or another bulk substrate comprising a semiconductor material. In some embodiments, the first base semiconductor structure 110 comprises a silicon wafer. The first base semiconductor structure 110 may include one or more layers, structures, and/or regions formed therein and/or thereon.

The filled trenches 112 may comprise trenches (e.g., openings, vias, apertures) within the first base semiconductor structure 110 that are at least partially (e.g., substantially) filled with the first isolation material 114. The filled trenches 112 may, for example, be employed as shallow trench isolation (STI) structures within the first base semiconductor structure 110. The filled trenches 112 may be formed to vertically extend partially (e.g., less than completely) through the first base semiconductor structure 110. Each of the filled trenches 112 may be formed to exhibit substantially the same dimensions and shape as each other of the filled trenches 112, or at least one of the filled trenches 112 may be formed to exhibit one or more of different dimensions and a different shape than at least one other of the filled trenches 112. As a non-limiting example, each of the filled trenches 112 may be formed to exhibit substantially the same vertical dimension(s) and substantially the same vertical cross-sectional shape(s) as each other of the filled trenches 112; or at least one of the filled trenches 112 may be formed to exhibit one or more of different vertical dimension(s) and different vertical cross-sectional shape(s) than at least one other of the filled trenches 112. In some embodiments, the filled trenches 112 are all formed to vertically extend to and terminate at substantially the same depth within the first base semiconductor structure 110. In additional embodiments, at least one of the filled trenches 112 is formed to vertically extend to and terminate at a relatively deeper depth within the first base semiconductor structure 110 than at least one other of the filled trenches 112. As another non-limiting example, each of the filled trenches 112 may be formed to exhibit substantially the same horizontal dimension(s) and substantially the same horizontal cross-sectional shape(s) as each other of the filled trenches 112; or at least one of the filled trenches 112 may be formed to exhibit one or more of different horizontal dimension(s) (e.g., relatively larger horizontal dimension(s), relatively smaller horizontal dimension(s)) and different horizontal cross-sectional shape(s) than at least one other of the filled trenches 112. In some embodiments, at least one of the filled trenches 112 is formed to have one or more different horizontal dimensions (e.g., in the X-direction and/or in the Y-direction) than at least one other of the filled trenches 112.

The first isolation material 114 may be formed of and include at least one insulative material. By way of non-limiting example, the first isolation material 114 may be formed of and include one or more of at least one dielectric oxide material (e.g., one or more of $SiO_x$, phosphosilicate glass, borosilicate glass, borophosphosilicate glass, fluoro-silicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the first isolation material 114 is formed of and includes $SiO_x$ (e.g., $SiO_2$). The first isolation material 114 may be substantially homogeneous, or the first isolation material 114 may be heterogeneous. In some embodiments, the first isolation material 114 is sub-stantially homogeneous. In additional embodiments, the first isolation material 114 is heterogeneous. The first isolation material 114 may, for example, be formed of and include a stack of at least two different dielectric materials.

Figure 3B:
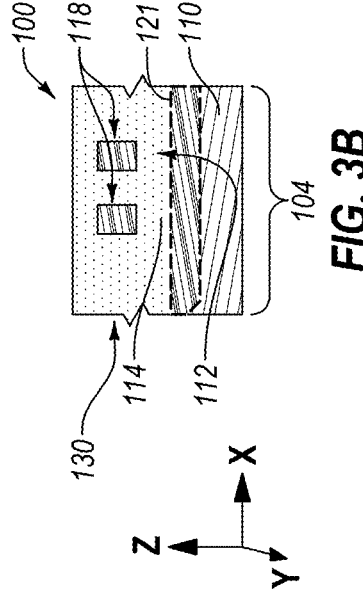
FIGS. 3A through 3D are simplified, partial longitudinal cross-sectional views of the array region (FIG. 3A), the digit line exit region (FIG. 3B), the word line exit region (FIG. 3C), and the socket region (FIG. 3D) shown in FIGS. 2A through 2D, respectively, at another processing stage of the method of forming the microelectronic device following the processing stage of FIGS. 2A through 2D.
Figure 3A:
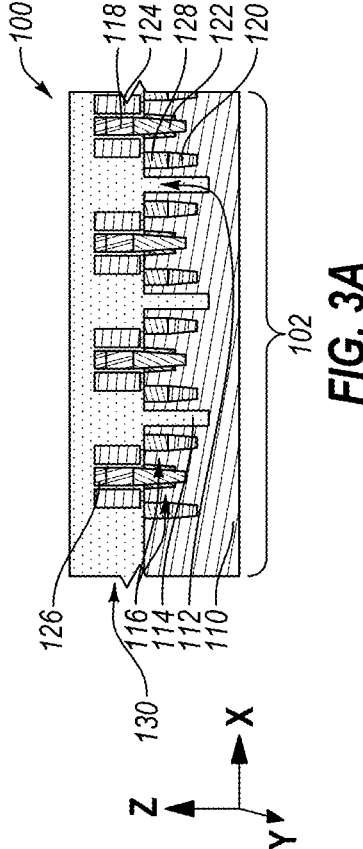
Figure 3D:
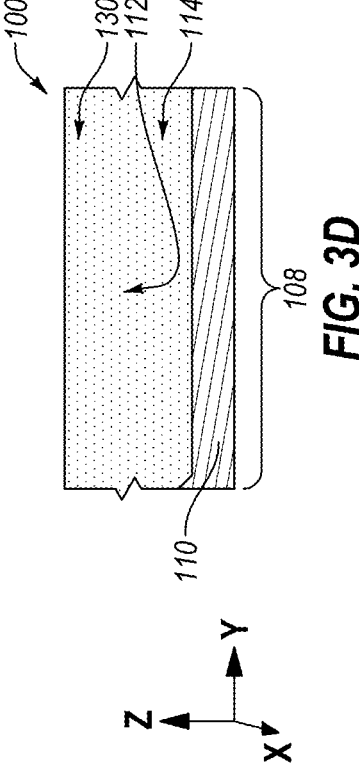
Figure 3C:
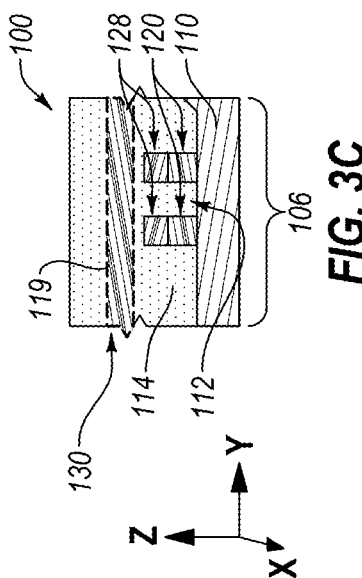

Referring next to FIGS. 3A through 3D, illustrated are simplified, partial longitudinal cross-sectional views, from the directional perspectives previously described, of the array region 102 (FIG. 3A), the digit line exit region 104 (FIG. 3B), the word line exit region 106 (FIG. 3C), and the socket region 108 (FIG. 3D) at a processing stage of the method of forming the microelectronic device following the processing stage previously described with reference to FIGS. 1 and 2A through 2D. As collectively depicted in FIGS. 3A through 3D, access devices 116 (FIG. 3A) (e.g., access transistors) may be formed within the array region 102 (FIG. 3A). In addition, digit lines 118 (FIGS. 3A and 3B) (e.g., data lines, bit lines) may be formed to be coupled to the access devices 116 (FIG. 3A) and to horizontally extend in the Y-direction through the array region 102 (FIG. 3A). At least some of the digit lines 118 (FIGS. 3A and 3B) may terminate (e.g., end) within the digit line exit region 104 (FIG. 3B). Furthermore, word lines 120 (e.g., access lines) may be formed to be coupled to the access devices 116 (FIG. 3A) and to horizontally extend in the X-direction through the array region 102 (FIG. 3A). At least some of the word lines 120 (FIGS. 3A and 3C) may terminate within the word line exit region 106 (FIG. 3C).

Referring to FIG. 3A, the access devices 116 formed within the array region 102 may be employed as components of memory cells (e.g., DRAM cells) to be formed within the array region 102. By way of non-limiting example, each access device 116 may individually be formed to include a channel region comprising a portion of the first base semi-conductor structure 110; a source region and a drain region each individually comprising one or more of at least one conductively doped portion of the first base semiconductor structure 110 and/or at least one conductive structure formed in, on, or over the first base semiconductor structure 110; and at least one gate structure comprising a portion of at least one of the word lines 120. Each access device 116 may also include a gate dielectric material (e.g., a dielectric oxide material) formed to be interposed between the channel region thereof and the gate structure thereof.

The digit lines 118 may exhibit horizontally elongate shapes extending in parallel in the Y-direction; and the word lines 120 may exhibit horizontally elongate shapes extend-ing in parallel in the X-direction orthogonal to the Y-direc-tion. As used herein, the term "parallel" means substantially parallel. The digit lines 118 and the word lines 120 may each individually be formed of and include conductive material. By way of non-limiting example, the digit lines 118 and the word lines 120 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the digit lines 118 and the word lines 120 are each individually formed of and include one or more of W, Ru, Mo, and titanium nitride ($TiN_y$). Each of the digit lines 118 and each of the word lines 120 may individually be substantially homogeneous, or one or more of the digit lines 118 and/or one or more of the word lines 120 may individu-ally be substantially heterogeneous. In some embodiments, each of the digit lines 118 and each of the word lines 120 are formed to be substantially homogeneous.

Still referring to FIG. 3A, within the array region 102, additional features (e.g., structures, materials) are also formed on, over, and/or between the access devices 116, the digit lines 118, and the word lines 120. For example, as shown in FIG. 3A, first contact structures 122 (e.g., digit line contact structures, also referred to as so-called "bitcon" structures) may be formed to vertically extend between and couple the access devices 116 to the digit lines 118; second contact structures 124 (e.g., cell contact structures, also referred to as so-called "cellcon" structures) may be formed in contact with the access devices 116 and may be config-ured and positioned to couple the access devices 116 to subsequently formed storage node devices (e.g., capacitors); dielectric cap structures 126 may be formed on or over the digit lines 118; and additional dielectric cap structures 128 may be formed on or over the word lines 120. In addition, dielectric structures (e.g., dielectric spacers, such as low-k dielectric spacers formed of and including one or more low-k dielectric materials) may be formed to intervene (e.g., horizontally intervene) between and isolate the second con-tact structures 124 and digit lines 118; and further dielectric structures (e.g., gate dielectric structures, such as gate dielectric oxide structures) may be formed to intervene (e.g., horizontally intervene) between and isolate the first contact structures 122 and the word lines 120.

The first contact structures 122 and the second contact structures 124 may individually be formed of and include at least one conductive material. In some embodiments, the first contact structures 122 and the second contact structures 124 are individually formed of and include one or more of at least one metal (e.g., W), at least one alloy, at least one conductive metal silicide (e.g., one or more of titanium silicide ($TiSi_x$), cobalt silicide ($CoSi_x$), tungsten silicide ($WSi_x$), tantalum silicide ($TaSi_x$), molybdenum silicide ($MoSi_x$), and nickel silicide ($NiSi_x$)), and at least one con-ductive metal nitride (e.g., one or more of $TiN_y$, tungsten nitride ($WN_y$), tantalum nitride ($TaN_y$), cobalt nitride ($CoN_y$), molybdenum nitride ($MoN_y$), and nickel nitride ($NiN_y$)). In addition, the dielectric cap structures 126 and the additional dielectric cap structures 128 may individually be formed of and include at least one insulative material. In some embodiments, the dielectric cap structures 126 and the additional dielectric cap structures 128 are individually formed of and include a dielectric nitride material (e.g., $SiN_y$, such as $Si_3N_4$).

Referring to FIG. 3B, within the digit line exit region 104, at least some of the digit lines 118 may horizontally termi-nate (e.g., end) in the Y-direction. Each of the digit lines 118 horizontally extending through the array region 102 (FIG. 3A) and horizontally terminating within the digit line exit region 104 may be formed to terminate at substantially the same horizontal position in the Y-direction; or at least one of the digit lines 118 horizontally terminating within the digit line exit region 104 may be formed to terminate at a different horizontal position in the Y-direction within the digit line exit region 104 than at least one other of the digit lines 118 horizontally terminating within the digit line exit region 104. In some embodiments, at least some digit lines 118 horizontally neighboring one another in the X-direction have terminal ends (e.g., terminal surfaces) horizontally offset from one another in the Y-direction. Horizontally offsetting the terminal ends of some of the digit lines 118 from the terminal ends of some other of the digit lines 118 within the digit line exit region 104 may, for example, promote or facilitate desirable contact structure arrangements within the digit line exit region 104.

As shown in FIG. 3B, within the digit line exit region 104, dummy word lines 121 may, optionally, be formed vertically below the digit lines 118. If formed, the dummy word lines 121 may be formed at substantially the same vertical position (e.g., vertical elevation) within the first microelectronic device structure 100 (e.g., within the first base semiconductor structure 110 thereof) as the word lines 120 (FIGS. 3A and 3C) and may be formed to horizontally extend orthogonal to the digit lines 118 (e.g., in the X-direction). A material composition of the dummy word lines 121 may be substantially the same as a material composition of the word lines 120 (FIGS. 3A and 3C). If formed, the dummy word lines 121 may be electrically isolated from one another and other components (e.g., the word lines 120 (FIGS. 3A and 3C), the digit lines 118) of the first microelectronic device structure 100. The dummy word lines 121 (if any) within the digit line exit region 104 may not be employed as part of data paths during use and operation of a microelectronic device formed through the methods of the disclosure. In additional embodiments, the dummy word lines 121 are absent (e.g., omitted) from the digit line exit region 104.

Referring next to FIG. 3C, within the word line exit region 106, at least some of the word lines 120 may horizontally terminate (e.g., end) in the X-direction. Each of the word lines 120 horizontally extending through the array region 102 (FIG. 3A) and horizontally terminating within the word line exit region 106 may be formed to terminate at substantially the same horizontal position in the X-direction; or at least one of the word lines 120 horizontally terminating within the word line exit region 106 may be formed to terminate at a different horizontal position in the X-direction within the word line exit region 106 than at least one other of the word lines 120 horizontally terminating within the word line exit region 106. In some embodiments, at least some word lines 120 horizontally neighboring one another in the Y-direction have terminal ends (e.g., terminal surfaces) horizontally offset from one another in the X-direction. Horizontally offsetting the terminal ends of some of the word lines 120 from the terminal ends of some other of the word lines 120 within the word line exit region 106 may, for example, promote or facilitate desirable contact structure arrangements within the word line exit region 106.

As shown in FIG. 3C, within the word line exit region 106, dummy digit lines 119 may, optionally, be formed vertically above the word lines 120. If formed, the dummy digit lines 119 may be formed at substantially the same vertical position (e.g., vertical elevation) within the first microelectronic device structure 100 (e.g., within the second isolation material 130 thereof) as the digit lines 118 (FIGS. 3A and 3B) and may be formed to horizontally extend orthogonal to the word lines 120 (e.g., in the Y-direction). A material composition of the dummy digit lines 119 may be substantially the same as a material composition of the digit lines 118 (FIGS. 3A and 3B). If formed, the dummy digit lines 119 may be electrically isolated from one another and the other components (e.g., the digit lines 118 (FIGS. 3A and 3B), the word lines 120) of the first microelectronic device structure 100. The dummy digit lines 119 (if any) within the word line exit region 106 may not be employed as part of data paths during use and operation of a microelectronic device formed through the methods of the disclosure. In additional embodiments, the dummy digit lines 119 are absent (e.g., omitted) from the word line exit region 106.

Referring collectively to FIGS. 3A through 3D, the second isolation material 130 may be formed on or over portions of at least the first base semiconductor structure 110, the access devices 116 (FIG. 3A), the digit lines 118 (FIGS. 3A and 3B), the word lines 120 (FIGS. 3A and 3C), the second contact structures 124, and the first isolation material 114. The second isolation material 130 may be formed of and include at least one insulative material. A material composition of second isolation material 130 may be substantially the same as a material composition of the first isolation material 114, or the material composition of the second isolation material 130 may be different than the material composition of the first isolation material 114. In some embodiments, the second isolation material 130 is formed of and includes a dielectric oxide material, such as $SiO_x$ (e.g., $SiO_2$). The second isolation material 130 may be substantially homogeneous, or the second isolation material 130 may be heterogeneous. In some embodiments, the second isolation material 130 is substantially homogeneous. In additional embodiments, the second isolation material 130 is heterogeneous. The second isolation material 130 may, for example, be formed of and include a stack of at least two different dielectric materials.

Figure 4B:
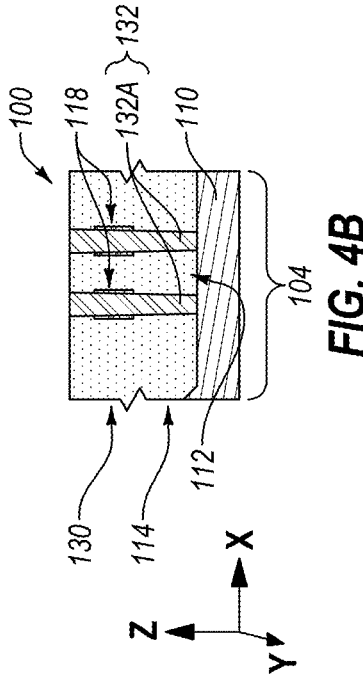
FIGS. 4A through 4D are simplified, partial longitudinal cross-sectional views of the array region (FIG. 4A), the digit line exit region (FIG. 4B), the word line exit region (FIG. 4C), and the socket region (FIG. 4D) shown in FIGS. 2A through 2D, respectively, at another processing stage of the method of forming the microelectronic device following the processing stage of FIGS. 3A through 3D.
Figure 4A:
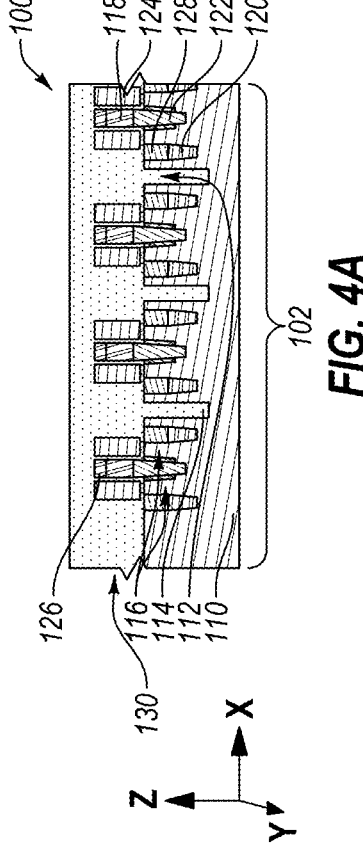
Figure 4D:
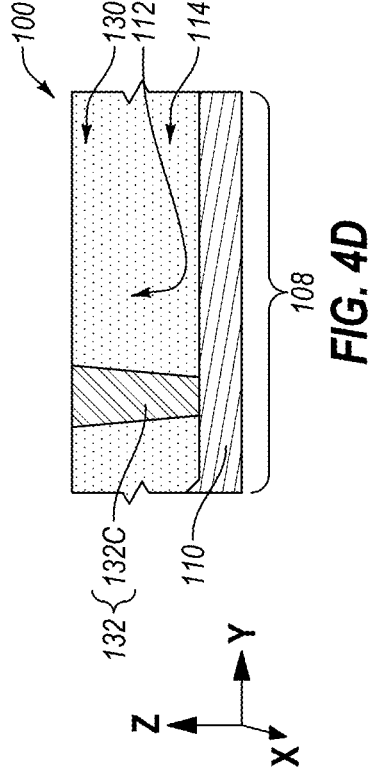
Figure 4C:
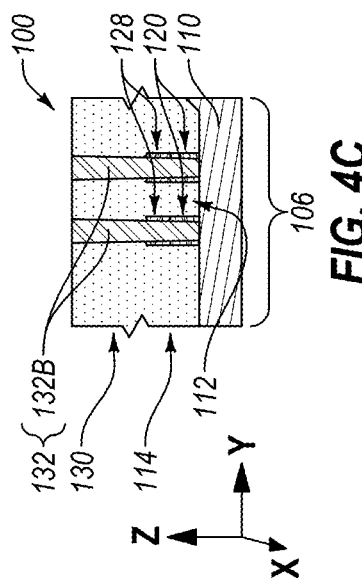

Referring next to FIGS. 4A through 4D, illustrated are simplified, partial longitudinal cross-sectional views, from the directional perspectives previously described, of the array region 102 (FIG. 4A), the digit line exit region 104 (FIG. 4B), the word line exit region 106 (FIG. 4C), and the socket region 108 (FIG. 4D) at a processing stage of the method of forming the microelectronic device following the processing stage previously described with reference to FIGS. 3A through 3D. As collectively depicted in FIGS. 4A through 4D, third contact structures 132 may be formed within each of the digit line exit region 104 (FIG. 4B), the word line exit region 106 (FIG. 4C), and the socket region 108 (FIG. 4D). The third contact structures 132 may be formed to vertically extend (e.g., in the Z-direction) to and contact the first base semiconductor structure 110. In addition, as described in further detail below, some of the third contact structures 132 may be formed to contact portions of the digit lines 118 (FIG. 4B) within the digit line exit region 104 (FIG. 4B), and some other of the third contact structures 132 may be formed to contact portions of the word lines 120 (FIG. 4C) within the word line exit region 106 (FIG. 4C).

Referring to FIG. 4B, within the digit line exit region 104, a first group 132A of the third contact structures 132 may be formed to contact at least some of the digit lines 118 horizontally extending (e.g., in the Y-direction) into the digit line exit region 104. Each third contact structure 132 of the first group 132A of third contact structures 132 may be considered to be a digit line contact structure (e.g., a so-called "edge of array" digit line contact structure). As shown in FIG. 4B, each third contact structure 132 of the first group 132A of third contact structures 132 may be formed to physically contact and vertically extend completely through an individual digit line 118. For example, within the digit line exit region 104, each third contact structure 132 of the first group 132A may be formed to physically contact and vertically extend through each of the second isolation material 130, one of the digit lines 118, and the first isolation material 114. Accordingly, each third contact structure 132 of the first group 132A may be formed to be coupled to one of the digit lines 118. In some embodiments, outer sidewalls of each third contact structure 132 of the first group 132A of the third contact structures 132 physically contact inner sidewalls of an individual digit line 118. In addition, each third contact structure 132 of the first group 132A may be formed to vertically terminate on or within the first base semiconductor structure 110, such as on or within a portion of the first base semiconductor structure 110 vertically underlying one of the filled trenches 112 within the digit line exit region 104.

Referring next to FIG. 4C, within the word line exit region 106, a second group 132B of the third contact structures 132 may be formed to contact at least some of the word lines 120 horizontally extending (e.g., in the X-direction) into the word line exit region 106. Each third contact structure 132 of the second group 132B of third contact structures 132 may be considered to be a word line contact structure (e.g., a so-called "edge of array" word line contact structure). As shown in FIG. 4C, each third contact structure 132 of the second group 132B of third contact structures 132 may be formed to physically contact and vertically extend completely through an individual word line 120. For example, within the word line exit region 106, each third contact structure 132 of the second group 132B may be formed to physically contact and vertically extend through each of the second isolation material 130, one of the word lines 120, and the first isolation material 114. Accordingly, each third contact structure 132 of the second group 132B may be formed to be coupled to one of the word lines 120. In some embodiments, outer sidewalls of each third contact structure 132 of the second group 132B of the third contact structures 132 physically contact inner sidewalls of an individual word line 120. In addition, each third contact structure 132 of the second group 132B may be formed to vertically terminate on or within the first base semiconductor structure 110, such as on or within a portion of the first base semiconductor structure 110 vertically underlying one of the filled trenches 112 within the word line exit region 106.

Referring next to FIG. 4D, within the socket region 108, a third group 132C of the third contact structures 132 may be formed to vertically extend to portions of the first base semiconductor structure 110 located within the socket region 108. Each third contact structure 132 of the third group 132C of third contact structures 132 may be considered to be a deep contact structure (e.g., a deep contact structure to be electrically connected to one or more BEOL structures to subsequently be formed). Within the socket region 108, each third contact structure 132 of the third group 132C may be formed to physically contact and vertically extend through each of the second isolation material 130 and the first isolation material 114; and may vertically terminate on or within the first base semiconductor structure 110, such as on or within a portion of the first base semiconductor structure 110 vertically underlying one of the filled trenches 112 within the socket region 108.

Collectively referring again to FIGS. 4A through 4D, the third contact structures 132, including the first group 132A (FIG. 4B), the second group 132B (FIG. 4C), and the third group 132C (FIG. 4D) thereof, may be formed of and include conductive material. By way of non-limiting example, the third contact structures 132 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the third contact structures 132 are each individually formed of and include W. Each of the third contact structures 132 may be substantially homogeneous, or one or more of the third contact structures 132 may individually be heterogeneous. In some embodiments, each of the third contact structures 132 is substantially homogeneous. In additional embodiments, each of the third contact structures 132 is heterogeneous. Each third contact structure 132 may, for example, be formed of and include a stack of at least two different conductive materials.

Referring next to FIGS. 5A through 5D, illustrated are simplified, partial longitudinal cross-sectional views, from the directional perspectives previously described, of the array region 102 (FIG. 5A), the digit line exit region 104 (FIG. 5B), the word line exit region 106 (FIG. 5C), and the socket region 108 (FIG. 5D) at a processing stage of the method of forming the microelectronic device following the processing stage previously described with reference to FIGS. 4A through 4D. As collectively depicted in FIGS. 5A through 5D, at least one first routing tier 134 including first routing structures 136 may be formed over the access devices 116 (FIG. 5A); storage node devices 138 (e.g., capacitors) may be formed over and in electrical communication with at least some of the first routing structures 136 within the array region 102 (FIG. 5A); fourth contact structures 140 may be formed over and in electrical communication with at least some of the third contact structures 132 within the socket region 108 (FIG. 5D); and a second routing tier 142 including second routing structures 144 may be formed over the storage node devices 138 and the fourth contact structures 140.

With continued collective reference to FIGS. 5A through 5D, the first routing structures 136 of the first routing tier 134 may be employed to facilitate electrical communication between additional features (e.g., structures, materials, devices) coupled thereto. The first routing structures 136 may each individually be formed of and include conductive material. By way of non-limiting example, the first routing structures 136 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the first routing structures 136 are formed of and include W.

Figures 5A, 5B:
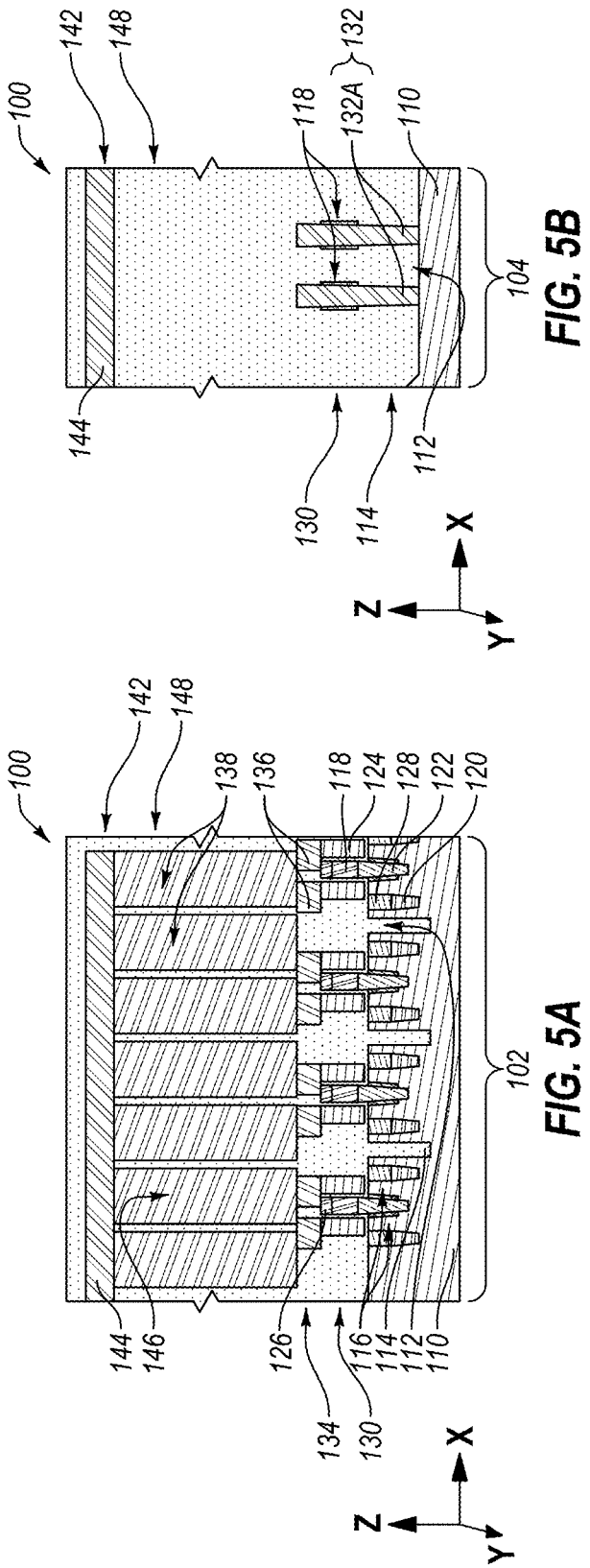
FIGS. 5A through 5D are simplified, partial longitudinal cross-sectional views of the array region (FIG. 5A), the digit line exit region (FIG. 5B), the word line exit region (FIG. 5C), and the socket region (FIG. 5D) shown in FIGS. 2A through 2D, respectively, at another processing stage of the method of forming the microelectronic device following the processing stage of FIGS. 4A through 4D.

Referring to FIG. 5A, within the array region 102, at least some of the first routing structures 136 may be formed and configured to couple the access devices 116 (e.g., access devices) to the storage node devices 138 (e.g., capacitors) to form memory cells 146 (e.g., DRAM cells) within the array region 102. Each memory cell 146 may individually include one of the access devices 116; one of the storage node devices 138; one of the second contact structures 124 interposed between the access device 116 and the storage node device 138; and one of the first routing structures 136 interposed between the second contact structure 124 and the storage node device 138. At least some of the first routing structures 136 within the array region 102 may, for example, be configured and employed as redistribution material (RDM) structures (also referred to as "redistribution layer" (RDL) structures) to effectively shift (e.g., stagger, adjust, modify) lateral positions of semiconductor pillars of the access devices 116 to accommodate a desired arrangement (e.g., a hexagonal close packed arrangement) of the storage node devices 138 vertically over and in electrical communication with the access devices 116.

While FIGS. 5A through 5D show the formation of a single (e.g., only one) first routing tier 134 including first routing structures 136, multiple (e.g., more than one) first routing tiers 134 each individually including a desired arrangement (e.g., pattern) of first routing structures 136 may be formed. By way of non-limiting example, two or more (e.g., three or more) of the first routing tiers 134 may be formed, wherein different first routing tiers 134 are vertically offset from one another and each individually include a desired arrangement of first routing structures 136 therein. At least some of the first routing structures 136 within at least one of the first routing tiers 134 may be coupled to at least some of the first routing structures 136 within at least one other of the first routing tiers 134 by way of conductive interconnect structures.

Referring again to FIG. 5A, within the array region 102, the storage node devices 138 may individually be formed and configured to store a charge representative of a programmable logic state of the memory cell 146 including the storage node device 138. In some embodiments, the storage node devices 138 comprise capacitors. During use and operation, a charged capacitor may represent a first logic state, such as a logic 1; and an uncharged capacitor may represent a second logic state, such as a logic 0. Each of the storage node devices 138 may, for example, be formed to include a first electrode (e.g., a bottom electrode), a second electrode (e.g., a top electrode), and a dielectric material between the first electrode and the second electrode.

Figures 5C, 5D:
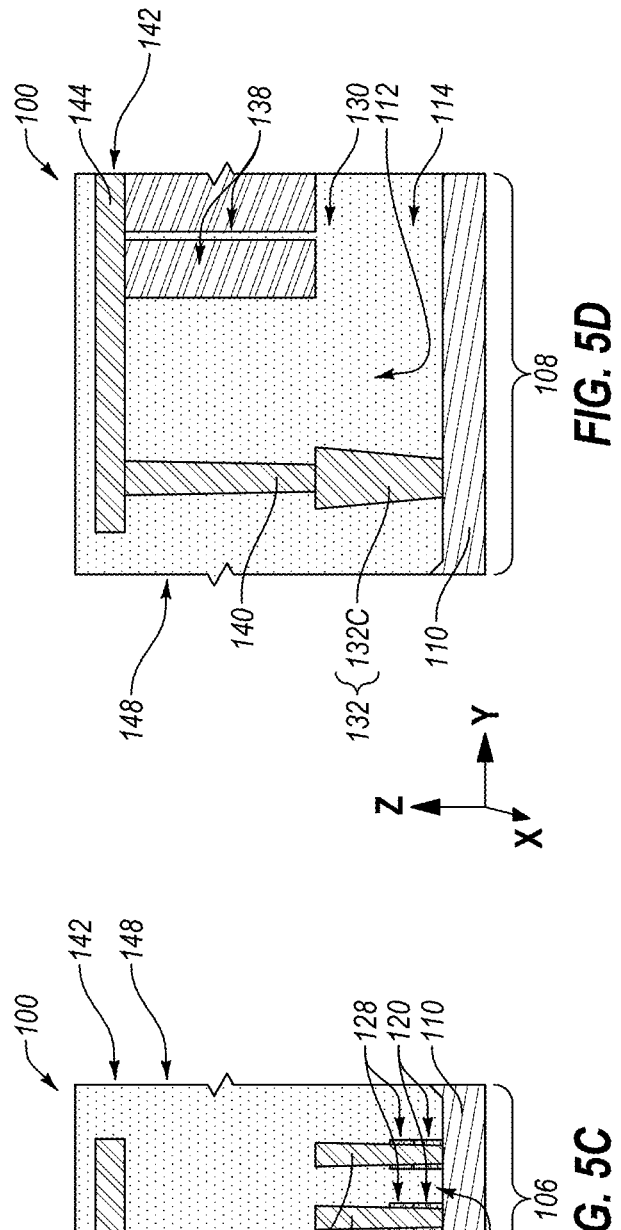

Referring to next to FIG. 5D, within the socket region 108, at least some of the fourth contact structures 140 may be formed to be coupled to at least some of the third contact structures 132. The fourth contact structures 140 may individually be formed of and include conductive material. By way of non-limiting example, the fourth contact structures 140 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, each of the fourth contact structures 140 is formed of and includes W. Each of the fourth contact structures 140 may be substantially homogeneous, or one or more of the fourth contact structures 140 may individually be heterogeneous. In some embodiments, each of the fourth contact structures 140 is substantially homogeneous. In additional embodiments, each of the fourth contact structures 140 is heterogeneous. Each fourth contact structure 140 may, for example, be formed of and include a stack of at least two different conductive materials.

As shown in FIG. 5D, within the socket region 108, one or more groups of storage node devices 138 (e.g., capacitors) may, optionally, also be formed. If formed within the socket region 108, the storage node devices 138 may be coupled to at least some of the second routing structures 144 positioned within the socket region 108. If formed, the storage node devices 138 may be employed to enhance the performance of a microelectronic device formed through the methods of the disclosure. The storage node devices 138 may, for example, subsequently (e.g., following completion of additional processing stages of the method of forming the microelectronic device) be coupled to and employed to power additional devices (e.g., control logic devices, access devices) of the microelectronic device. In some embodiments, the storage node devices 138 are subsequently coupled to and employed to power control logic devices comprising complementary metal-oxide-semiconductor (CMOS) circuitry. As described in further detail below, the control logic devices may be components of an additional, separately formed microelectronic device structure (e.g., a third microelectronic device structure) that is subsequently attached to the first microelectronic device structure 100 to facilitate the formation of a microelectronic device of the disclosure. The storage node devices 138 formed within socket region 108 may be coupled to (e.g., by way of one or more of the second routing structures 144, one or more of the fourth contact structures 140, one or more of the third contact structures 132, one or more additional routing structures, and one or more additional contact structures) to BEOL structures to subsequently be formed, as also described in further detail below.

Referring collectively to FIGS. 5A through 5D, the second routing structures 144 of the second routing tier 142 may be employed to facilitate electrical communication between additional features (e.g., structures, materials, devices) coupled thereto. In some embodiments, one or more of the second routing structures 144 are formed to horizontally extend between and couple at least some of the storage node devices 138 (and, hence, the memory cells 146) (FIG. 5A) within the array region 102 (FIG. 5A) to one or more of the fourth contact structures 140 (FIG. 5D) within the socket region 108 (FIG. 5D). In additional embodiments, one or more of the second routing structures 144 are formed to horizontally extend between and couple at least some of the storage node devices 138 (FIG. 5D) within the socket region 108 (FIG. 5D) to one or more of the fourth contact structures 140 (FIG. 5D) within the socket region 108 (FIG. 5D). The second routing structures 144 may each be formed of and include conductive material. By way of non-limiting example, the second routing structures 144 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, each of the second routing structures 144 of the second routing tier 142 is formed of and includes W.

With continued reference to FIGS. 5A through 5D, a third isolation material 148 may be formed on or over portions of at least the second isolation material 130, the first routing structures 136, the storage node devices 138 (FIGS. 5A and 5D), the fourth contact structures 140 (FIG. 5D), and the second routing structures 144. The third isolation material 148 may be formed of and include at least one insulative material. A material composition of the third isolation material 148 may be substantially the same as a material composition of the second isolation material 130, or the material composition of the third isolation material 148 may be different than the material composition of the second isolation material 130. In some embodiments, the third isolation material 148 is formed of and includes a dielectric oxide material, such as $SiO_x$ (e.g., $SiO_2$). The third isolation material 148 may be substantially homogeneous, or the third isolation material 148 may be heterogeneous. In some embodiments, the third isolation material 148 is substantially homogeneous. In additional embodiments, the third isolation material 148 is heterogeneous. The third isolation material 148 may, for example, be formed of and include a stack of at least two different dielectric materials. As shown in FIGS. 5A through 5D, an upper surface of third isolation material 148 may be formed to be substantially planar and to vertically overlie upper surfaces of the second routing structures 144.

Referring next to FIGS. 6A through 6D, illustrated are simplified, partial longitudinal cross-sectional views, from the directional perspectives previously described, of the array region 102 (FIG. 6A), the digit line exit region 104 (FIG. 6B), the word line exit region 106 (FIG. 6C), and the socket region 108 (FIG. 6D) at a processing stage of the method of forming the microelectronic device following the processing stage previously described with reference to FIGS. 5A through 5D. As collectively depicted in FIGS. 6A through 6D, a second microelectronic device structure 150 (e.g., a second wafer) including a base structure 152 and a fourth isolation material 154 may be attached to the third isolation material 148 to form a first microelectronic device structure assembly 156. The first microelectronic device structure assembly 156 may then be vertically inverted (e.g., flipped upside down in the Z-direction), and an upper portion of the first base semiconductor structure 110 (FIGS. 5A through 5D) may be removed to expose (e.g., uncover) the first isolation material 114 within the filled trenches 112 (FIGS. 5A through 5D) and form a first semiconductor tier 158 including first semiconductor structures 160 separated from one another by remaining portions of the first isolation material 114. Thereafter, sacrificial structures 162 (e.g., sacrificial pad structures) may be formed to physically contact at least some of the third contact structures 132, and a fifth isolation material 164 may be formed on or over surfaces of the sacrificial structures 162, the first semiconductor structures 160, and the first isolation material 114.

The base structure 152 of the second microelectronic device structure 150 comprises a base material or construction upon which additional features (e.g., materials, structures, devices) are formed. In some embodiments, the base structure 152 comprises a wafer. The base structure 152 may be formed of and include one or more of semiconductor material (e.g., one or more of a silicon material, such as monocrystalline silicon or polycrystalline silicon (also referred to herein as "polysilicon"); silicon-germanium; germanium; gallium arsenide; a gallium nitride; gallium phosphide; indium phosphide; indium gallium nitride; and aluminum gallium nitride), a base semiconductor material on a supporting structure, glass material (e.g., one or more of borosilicate glass (BSP), phosphosilicate glass (PSG), fluorosilicate glass (FSG), borophosphosilicate glass (BPSG), aluminosilicate glass, an alkaline earth boro-aluminosilicate glass, quartz, titania silicate glass, and soda-lime glass), and ceramic material (e.g., one or more of poly-aluminum nitride (p-AlN), silicon on poly-aluminum nitride (SOPAN), aluminum nitride (AlN), aluminum oxide (e.g., sapphire; $\alpha$-$Al_2O_3$), and silicon carbide). By way of non-limiting example, the base structure 152 may comprise a semiconductor wafer (e.g., a silicon wafer), a glass wafer, or a ceramic wafer. The base structure 152 may include one or more layers, structures, and/or regions formed therein and/or thereon.

The fourth isolation material 154 of the second microelectronic device structure 150 may be formed of and include at least one insulative material. A material composition of the fourth isolation material 154 may be substantially the same as a material composition of the third isolation material 148; or the material composition of the fourth isolation material 154 may be different than the material composition of the third isolation material 148. In some embodiments, the fourth isolation material 154 is formed of and includes a dielectric oxide material, such as $SiO_x$ (e.g., $SiO_2$). The fourth isolation material 154 may be substantially homogeneous, or the fourth isolation material 154 may be heterogeneous. In some embodiments, the fourth isolation material 154 is substantially homogeneous. In additional embodiments, the fourth isolation material 154 is heterogeneous. The fourth isolation material 154 may, for example, be formed of and include a stack of at least two different dielectric materials.

To attach the second microelectronic device structure 150 to the third isolation material 148, the second microelectronic device structure 150 may be vertically inverted (e.g., flipped upside down in the Z-direction), the fourth isolation material 154 thereof may be provided in physical contact with the third isolation material 148, and the fourth isolation material 154 and the third isolation material 148 may be exposed to annealing conditions to form bonds (e.g., oxide-to-oxide bonds) between the fourth isolation material 154 and the third isolation material 148. By way of non-limiting example, the fourth isolation material 154 and the third isolation material 148 may be exposed to a temperature greater than or equal to about 400° C. (e.g., within a range of from about 400° C. to about 800° C., greater than about 800° C.) to form oxide-to-oxide bonds between the third isolation material 148 and the fourth isolation material 154. In some embodiments, the third isolation material 148 and the fourth isolation material 154 are exposed to at least one temperature greater than about 800° C. to form oxide-to-oxide bonds between the third isolation material 148 and the fourth isolation material 154.

As shown in FIGS. 6A through 6D, bonding the fourth isolation material 154 to the third isolation material 148 may form a first connected isolation structure 166. In FIGS. 6A through 6D, the fourth isolation material 154 and the third isolation material 148 of the first connected isolation structure 166 are distinguished from one another by way of a dashed line. However, the fourth isolation material 154 to the third isolation material 148 may be integral and continuous with one another. Put another way, the first connected isolation structure 166 may be a substantially monolithic structure including the fourth isolation material 154 as a first region thereof, and the third isolation material 148 as a second region thereof. For the first connected isolation structure 166, the fourth isolation material 154 thereof may be attached to the third isolation material 148 thereof without a bond line.

Still collectively referring to FIGS. 6A through 6D, the upper portion of the first base semiconductor structure 110 (FIGS. 5A through 5D) vertically overlying the filled trenches 112 (FIGS. 5A through 5D) following the vertical inversion of the first microelectronic device structure assembly 156 may be removed using at least one conventional wafer thinning process (e.g., a conventional chemical-mechanical planarization (CMP) process; a conventional etching process, such as a conventional dry etching process, or a conventional wet etching process). The first semiconductor structures 160 may be formed to exhibit a desired vertical height (e.g., in the Z-direction) through the material removal process. The material removal process may also remove portions (e.g., upper portions following the vertical inversion of the first microelectronic device structure assembly 156) of the first isolation material 114. In addition, within the digit line exit region 104 (FIG. 6B), the word line exit region 106 (FIG. 6C), and the socket region 108 (FIG. 6D), the material removal process may partially expose the third contact structures 132. The material removal process may also remove portions (e.g., upper portions following the vertical inversion of the first microelectronic device structure assembly 156) of the third contact structures 132.

Figures 6A, 6B:
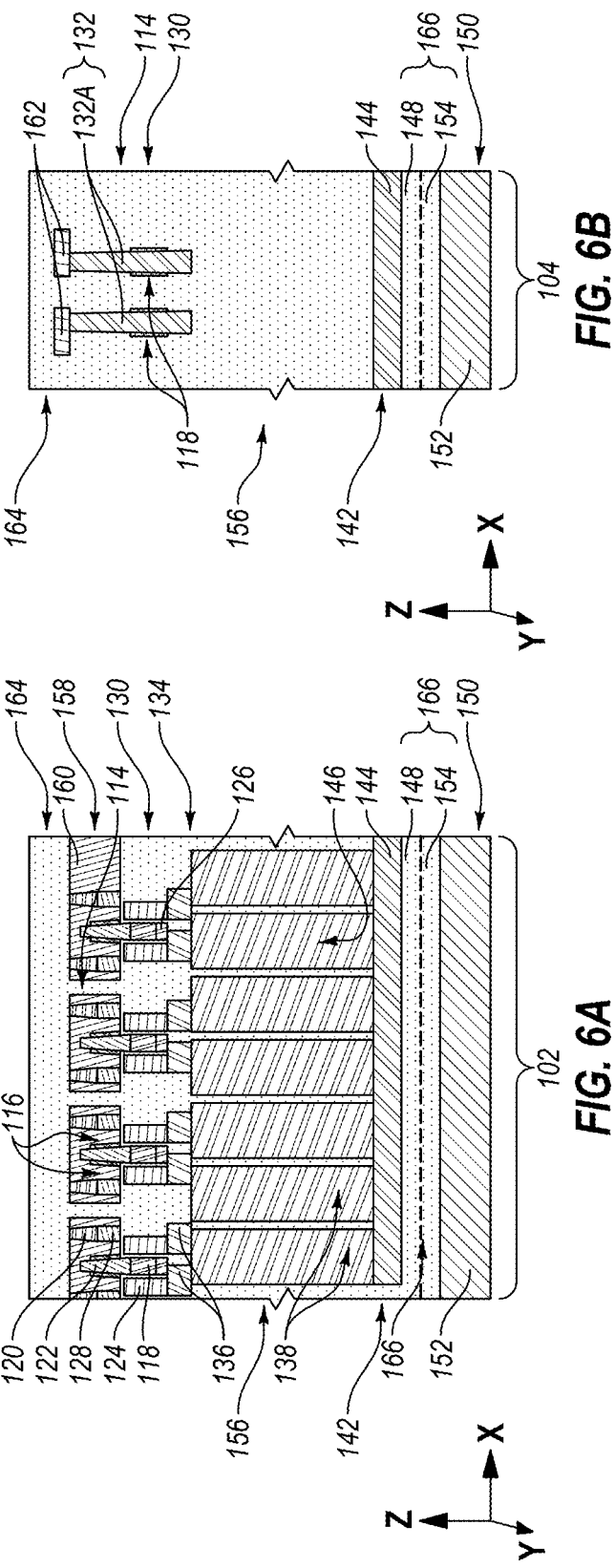
FIGS. 6A through 6D are simplified, partial longitudinal cross-sectional views of the array region (FIG. 6A), the digit line exit region (FIG. 6B), the word line exit region (FIG. 6C), and the socket region (FIG. 6D) shown in FIGS. 2A through 2D, respectively, at another processing stage of the method of forming the microelectronic device following the processing stage of FIGS. 5A through 5D.
Figures 6C, 6D:
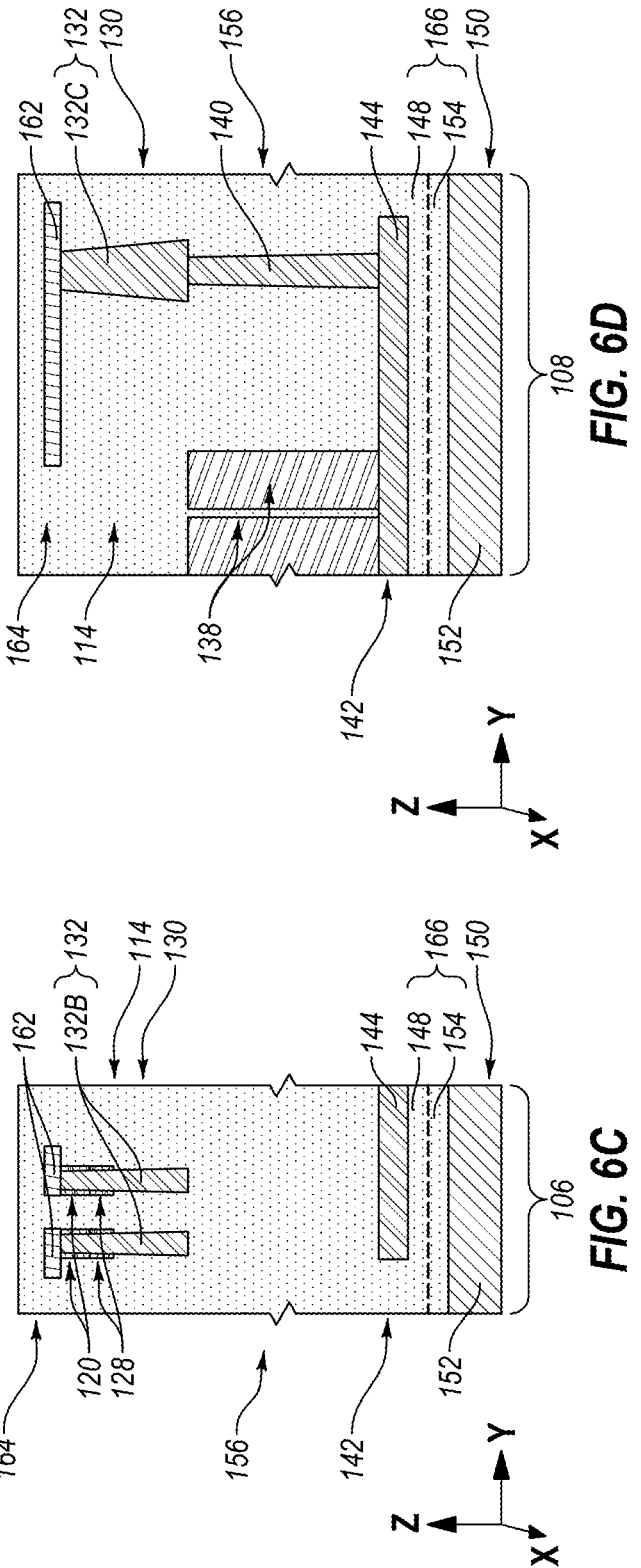

Referring to FIGS. 6B through 6D, the sacrificial structures 162 may be formed to have desirable geometric configurations (e.g., shapes, dimensions) and horizontal positions (e.g., in the X-direction and in the Y-direction). The geometric configurations, horizontal positions, and horizontal spacing of the sacrificial structures 162 at least partially depends on the geometric configurations, horizontal positions, and horizontal spacing of the third contact structures 132. Individual sacrificial structures 162 may be formed to at least partially horizontally overlap individual third contact structures 132. In some embodiments, each sacrificial structure 162 is formed to substantially cover an upper surface of the third contact structure 132 in physical contact therewith. Individual sacrificial structures 162 may be formed to have horizontal dimensions (e.g., in the X-direction and in the Y-direction) greater than or equal to corresponding horizontal dimensions of individual third contact structures 132 in physical contact therewith.

The sacrificial structures 162 may be formed of and include at least one material (e.g., at least one dielectric material) that may be selectively removed relative to the fifth isolation material 164, the first isolation material 114, and the third contact structures 132. For example, the sacrificial structures 162 may be selectively etchable relative to the fifth isolation material 164 during common (e.g., collective, mutual) exposure to a first etchant, and the fifth isolation material 164 may be selectively etchable relative to the sacrificial structures 162 during common exposure to a second, different etchant. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. A material composition of the sacrificial structures 162 is different than the material compositions of the fifth isolation material 164, the first isolation material 114, and the third contact structures 132. As a non-limiting example, the sacrificial structures 162 may comprise at least one insulative material having a different material composition than insulative material(s) of the fifth isolation material 164 and the first isolation material 114. In some embodiments, the sacrificial structures 162 are formed of and include one or more of at least one dielectric nitride material (e.g., $SiN_y$, such as $Si_3N_4$), and at least one dielectric oxynitride material (e.g., $SiO_xN_y$). The sacrificial structures 162 may individually be substantially homogeneous, or the sacrificial structures 162 may individually be heterogeneous.

Referring collectively to FIGS. 6A through 6D, the fifth isolation material 164 formed to cover surfaces of the first semiconductor structures 160 (FIG. 6A), the sacrificial structures 162 (FIGS. 6B through 6D), and the first isolation material 114 (FIGS. 6A through 6D) may be formed of and include at least one insulative material. A material composition of the fifth isolation material 164 may be substantially the same as a material composition of the first isolation material 114, or the material composition of the fifth isolation material 164 may be different than the material composition of the first isolation material 114. In some embodiments, the fifth isolation material 164 is formed of and includes a dielectric oxide material, such as $SiO_x$ (e.g., $SiO_2$). The fifth isolation material 164 may be substantially homogeneous, or the fifth isolation material 164 may be heterogeneous. In some embodiments, the fifth isolation material 164 is substantially homogeneous. In additional embodiments, the fifth isolation material 164 is heterogeneous. The fifth isolation material 164 may, for example, be formed of and include a stack of at least two different dielectric materials. As shown in FIGS. 6A through 6D, an upper surface of the fifth isolation material 164 may be formed to be substantially planar and to vertically overlie upper surfaces of the sacrificial structures 162 (FIGS. 6B through 6D).

Figures 7A, 7B:
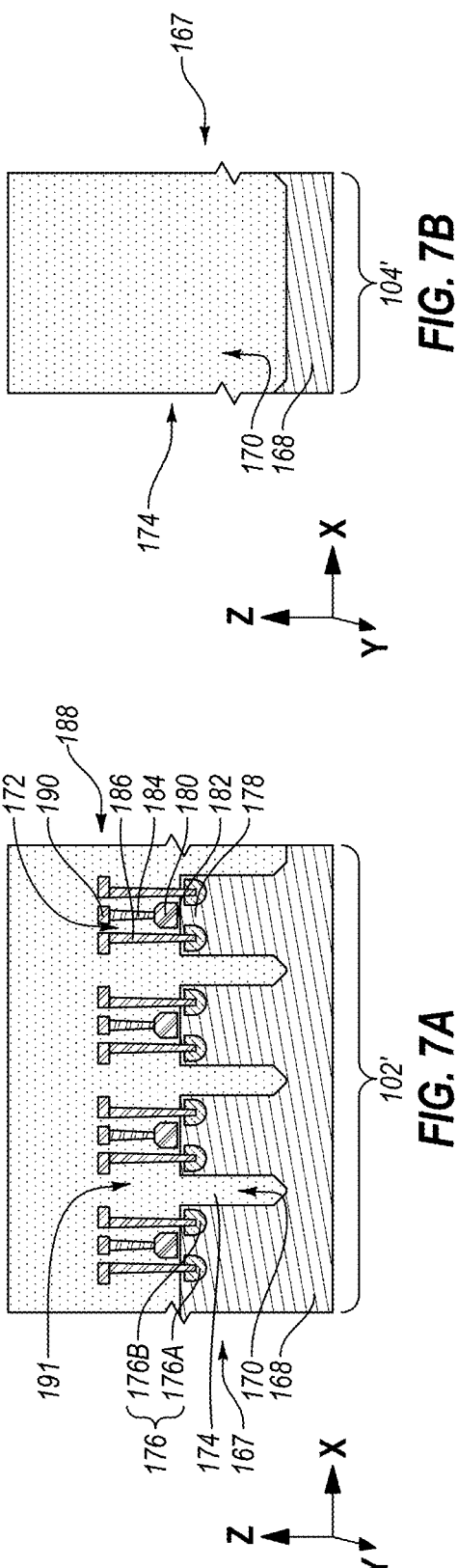
FIGS. 7A through 7D are simplified, partial longitudinal cross-sectional views of an array region (FIG. 7A), a digit line exit region (FIG. 7B), a word line exit region (FIG. 7C), and a socket region (FIG. 7D) of an additional microelectronic device structure, at another processing stage of the method of forming the microelectronic device.
Figures 7C, 7D:
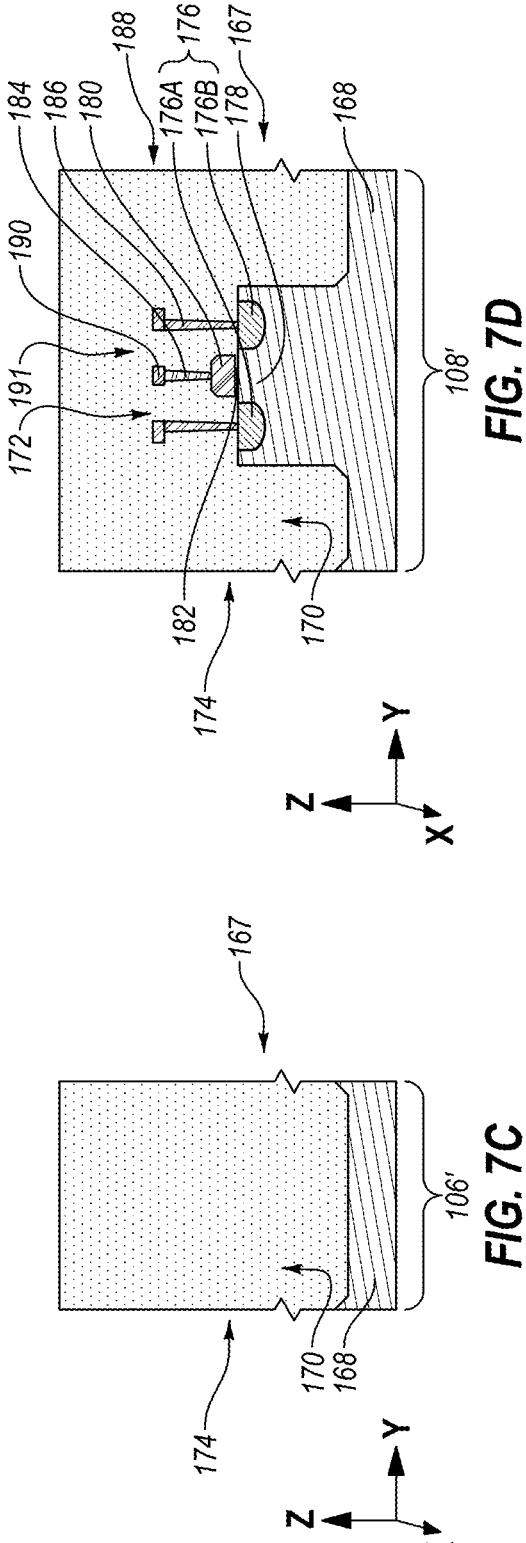
Figures 8A, 8B:
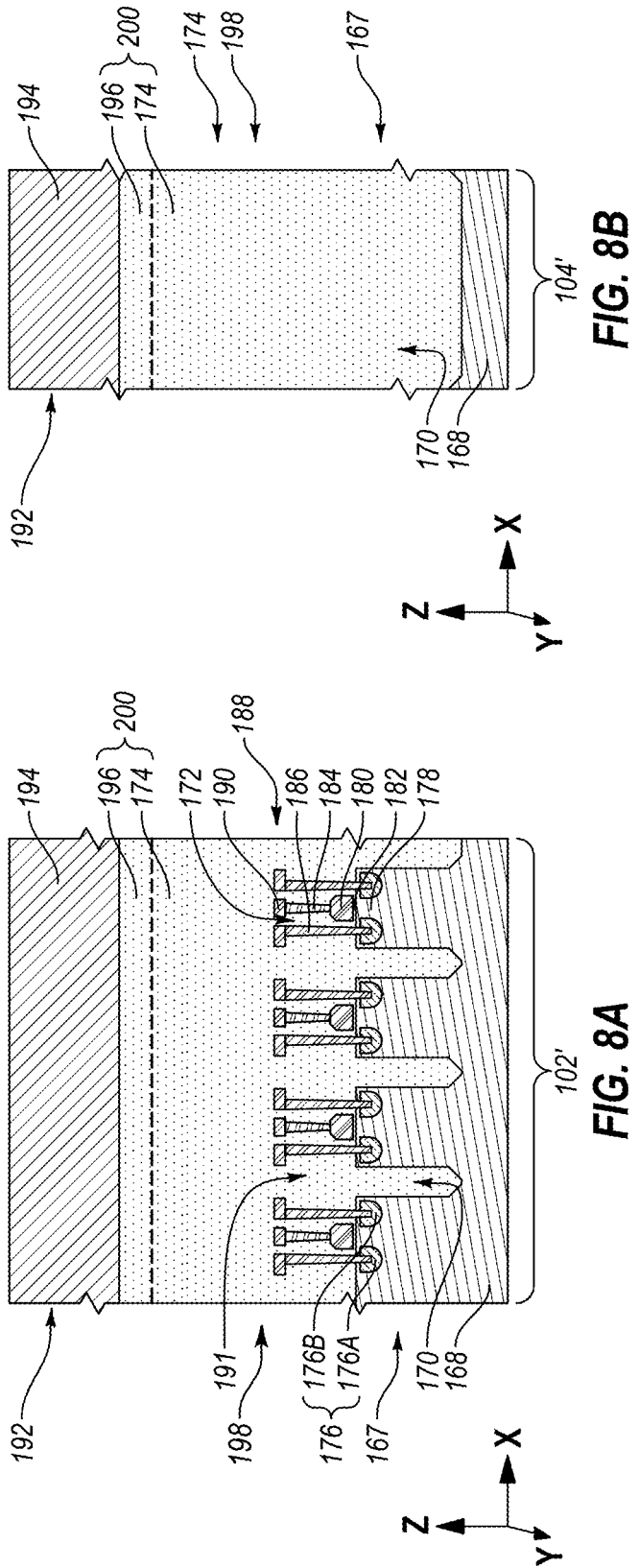
FIGS. 8A through 8D are simplified, partial longitudinal cross-sectional views of the array region (FIG. 8A), the digit line exit region (FIG. 8B), the word line exit region (FIG. 8C), and the socket region (FIG. 8D) shown in FIGS. 7A through 7D, respectively, at another processing stage of the method of forming the microelectronic device following the processing stage of FIGS. 7A through 7D.
Figures 8C, 8D:
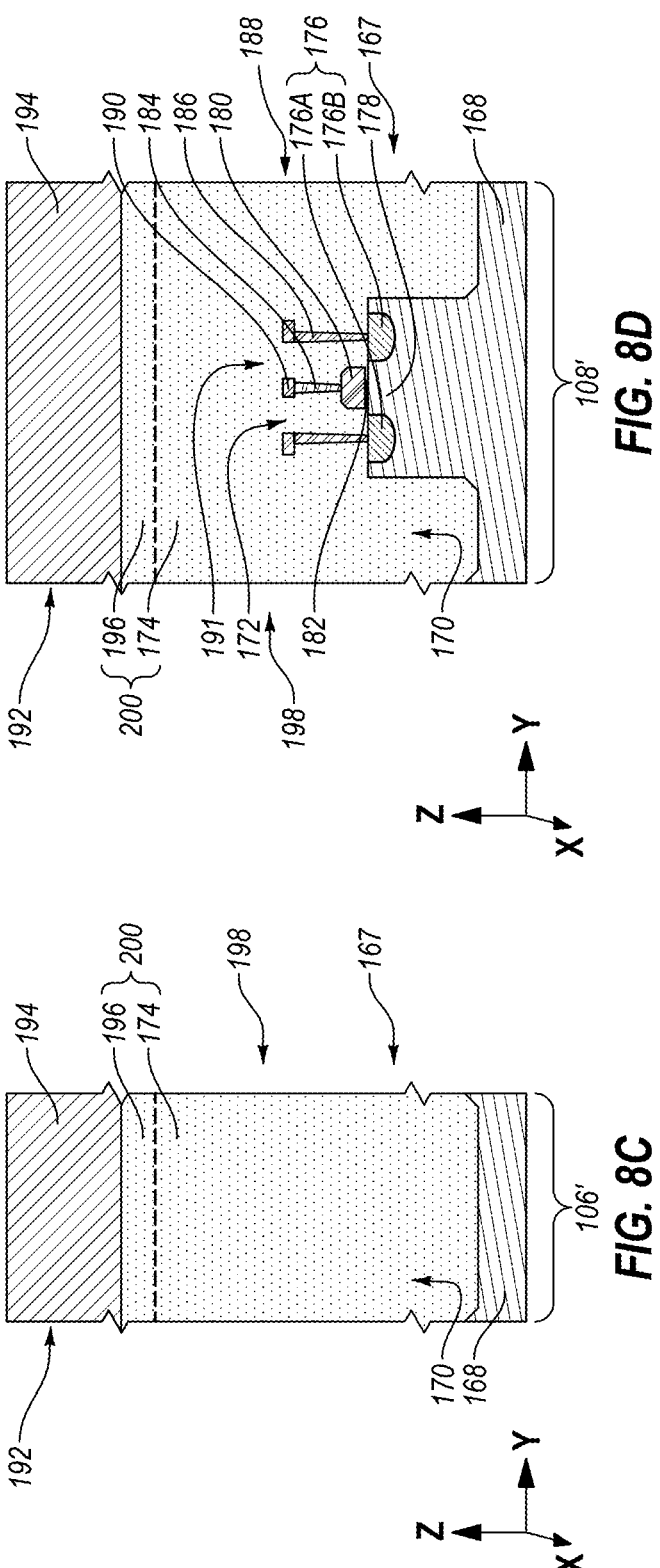

Referring next to FIGS. 7A through 7D, illustrated are simplified, partial longitudinal cross-sectional views of different regions of a third microelectronic device structure 167 (e.g., a third wafer) formed separate from the first microelectronic device structure assembly 156 (FIGS. 6A through 6D). The third microelectronic device structure 167 may be formed to have an arrangement of different regions (e.g., array regions, digit line exit regions, word line exit regions, socket regions) corresponding to (e.g., substantially the same as) the arrangement of different regions (e.g., the array regions 102, the digit line exit regions 104, the word line exit regions 106, the socket regions 108) previously described with reference to FIGS. 1 through 6D. FIG. 7A illustrates a simplified, partial longitudinal cross-sectional view from the perspective of the Y-direction (so as to depict an XZ-plane) of an array region 102' of the third microelectronic device structure 167. FIG. 7B illustrates a simplified, partial longitudinal cross-sectional view from the perspective of the Y-direction (so as to depict an XZ-plane) of a digit line exit region 104' of the third microelectronic device structure 167. FIG. 7C illustrates a simplified, partial longitudinal cross-sectional view from the perspective of the X-direction (so as to depict a YZ-plane) of a word line exit region 106' of the third microelectronic device structure 167. FIG. 7D illustrates a simplified, partial longitudinal cross-sectional view from the perspective of the X-direction (so as to depict a YZ-plane) of a socket region 108' of the third microelectronic device structure 167.

As shown in FIGS. 7A through 7D, the third microelectronic device structure 167 may be formed to include a second base semiconductor structure 168, additional filled trenches 170, transistors 172 (FIGS. 7A and 7D), a sixth isolation material 174, fourth contact structures 184 (FIGS. 7A and 7D), fifth contact structures 186 (FIGS. 7A and 7D), and at least one third routing tier 188 (FIGS. 7A and 7D) including third routing structures 190 (FIGS. 7A and 7D). The additional filled trenches 170 vertically extend (e.g., in the Z-direction) into the second base semiconductor structure 168. The transistors 172 at least partially vertically overlie the second base semiconductor structure 168 and the additional filled trenches 170. The fourth contact structures 184 and fifth contact structures 186 contact the transistors 172. Some of the third routing structures 190 contact some of the fourth contact structures 184, and some other of the third routing structures 190 contact some of the fifth contact structures 186. The sixth isolation material 174 may substantially cover and surround the second base semiconductor structure 168, the transistors 172, the fourth contact structures 184, the fifth contact structures 186, and the third routing structures 190.

The second base semiconductor structure 168 comprises a base material or construction upon which additional features (e.g., materials, structures, devices) of the third microelectronic device structure 167 are formed. The second base semiconductor structure 168 may comprise a semiconductor structure (e.g., a semiconductor wafer), or a base semiconductor material on a supporting structure. For example, the second base semiconductor structure 168 may comprise a conventional silicon substrate (e.g., a conventional silicon wafer), or another bulk substrate comprising a semiconductor material. In some embodiments, the second base semiconductor structure 168 comprises a silicon wafer. The second base semiconductor structure 168 may include one or more layers, structures, and/or regions formed therein and/or thereon.

The additional filled trenches 170 may comprise trenches (e.g., openings, vias, apertures) within the second base semiconductor structure 168 that are at least partially (e.g., substantially) filled with the sixth isolation material 174. The additional filled trenches 170 may, for example, be employed as STI structures within the second base semiconductor structure 168. The additional filled trenches 170 may be formed to vertically extend partially (e.g., less than completely) through the second base semiconductor structure 168. Each of the additional filled trenches 170 may be formed to exhibit substantially the same dimensions and shape as each other of the additional filled trenches 170, or at least one of the additional filled trenches 170 may be formed to exhibit one or more of different dimensions and a different shape than at least one other of the additional filled trenches 170. As a non-limiting example, each of the additional filled trenches 170 may be formed to exhibit substantially the same vertical dimension(s) and substantially the same vertical cross-sectional shape(s) as each other of the additional filled trenches 170; or at least one of the additional filled trenches 170 may be formed to exhibit one or more of different vertical dimension(s) and different vertical cross-sectional shape(s) than at least one other of the additional filled trenches 170. In some embodiments, the additional filled trenches 170 are all formed to vertically extend to and terminate at substantially the same depth within the second base semiconductor structure 168. In additional embodiments, at least one of the additional filled trenches 170 is formed to vertically extend to and terminate at a relatively deeper depth within the second base semiconductor structure 168 than at least one other of the additional filled trenches 170. As another non-limiting example, each of the additional filled trenches 170 may be formed to exhibit substantially the same horizontal dimension(s) and substantially the same horizontal cross-sectional shape(s) as each other of the additional filled trenches 170; or at least one of the additional filled trenches 170 may be formed to exhibit one or more of different horizontal dimension(s) (e.g., relatively larger horizontal dimension(s), relatively smaller horizontal dimension(s)) and different horizontal cross-sectional shape(s) than at least one other of the additional filled trenches 170. In some embodiments, at least one of the additional filled trenches 170 is formed to have one or more different horizontal dimensions (e.g., in the X-direction and/or in the Y-direction) than at least one other of the additional filled trenches 170.

Referring collectively to FIGS. 7A and 7D, the transistors 172 may individually be formed to include conductively doped regions 176, a channel region 178, a gate structure 180, and a gate dielectric material 182. For a transistor 172, the conductively doped regions 176 may be formed within the second base semiconductor structure 168 (e.g., within a relatively elevated portion formed within portions (e.g., relatively elevated portions) of the second base semiconductor structure 168 horizontally neighboring the additional filled trenches 170 horizontally neighboring at least one of the additional filled trenches 170); the channel region 178 may be within the second base semiconductor structure 168 and may be horizontally interposed between the conductively doped regions 176 thereof; the gate structure 180 may vertically overlie the channel region 178; and the gate dielectric material 182 (e.g., a dielectric oxide) may be vertically interposed (e.g., in the Z-direction) between the gate structure 180 and the channel region 178. The conductively doped regions 176 of an individual transistor 172 may include a source region 176A and a drain region 176B.

Referring collectively to FIGS. 7A and 7D, for an individual transistor 172, the conductively doped regions 176 thereof may comprise semiconductor material of the second base semiconductor structure 168 doped with one or more desired conductivity-enhancing dopants. In some embodiments, the conductively doped regions 176 of the transistor 172 comprise semiconductor material (e.g., silicon) doped with at least one N-type dopant (e.g., one or more of phosphorus, arsenic, antimony, and bismuth). In some of such embodiments, the channel region 178 of the transistor 172 comprises the semiconductor material doped with at least one P-type dopant (e.g., one or more of boron, aluminum, and gallium). In some other of such embodiments, the channel region 178 of the transistor 172 comprises substantially undoped semiconductor material (e.g., substantially undoped silicon). In additional embodiments, for an individual transistor 172, the conductively doped regions 176 thereof comprise semiconductor material (e.g., silicon) doped with at least one P-type dopant (e.g., one or more of boron, aluminum, and gallium). In some of such additional embodiments, the channel region 178 of the transistor 172 comprises the semiconductor material doped with at least one N-type dopant (e.g., one or more of phosphorus, arsenic, antimony, and bismuth). In some other of such additional embodiments, the channel region 178 of the transistor 172 comprises substantially undoped semiconductor material (e.g., substantially undoped silicon).

Still referring collectively to FIGS. 7A and 7D, the gate structures 180 (e.g., gate electrodes) may individually horizontally extend (e.g., in the X-direction) between and be employed by multiple transistors 172. The gate structures 180 may be formed of and include conductive material. The gate structures 180 may individually be substantially homogeneous, or the gate structures 180 may individually be heterogeneous. In some embodiments, the gate structures 180 are each substantially homogeneous. In additional embodiments, the gate structures 180 are each heterogeneous. Individual gate structures 180 may, for example, be formed of and include a stack of at least two different conductive materials.

Still referring to FIGS. 7A and 7D, the fourth contact structures 184 may individually be formed to vertically extend between and couple the gate structures 180 (and, hence, the transistors 172) to one or more of the third routing structures 190 of the third routing tier 188. The fourth contact structures 184 may individually be formed of and include conductive material. By way of non-limiting example, the fourth contact structures 184 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the fourth contact structures 184 are formed of and include W. In additional embodiments, the fourth contact structures 184 are formed of and include Cu.

As also shown in FIGS. 7A and 7D, the fifth contact structures 186 may be formed to vertically extend between and couple the conductively doped regions 176 (e.g., the source region 176A, the drain region 176B) of the transistors 172 to some of the third routing structures 190 of the third routing tier 188. The fifth contact structures 186 may individually be formed of and include conductive material. By way of non-limiting example, the fifth contact structures 186 may be formed of and include one or more of at least one metal, at least one alloy, and at least one conductive metal-containing material (e.g., a conductive metal nitride, a conductive metal silicide, a conductive metal carbide, a conductive metal oxide). A material composition of the fifth contact structures 186 may be substantially the same as a material composition of the fourth contact structures 184, or the material composition of one or more of the fifth contact structures 186 may be different than the material composition of one or more of the fourth contact structures 184. In some embodiments, the fifth contact structures 186 are formed of and include W. In additional embodiments, the fifth contact structures 186 are formed of and include Cu.

Referring collectively to FIGS. 7A through 7D, the third routing structures 190 of the third routing tier 188 may be formed of and include conductive material. By way of non-limiting example, the third routing structures 190 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the third routing structures 190 are formed of and include W. In additional embodiments, the third routing structures 190 are formed of and include Cu. At least some of the third routing structures 190 may be employed as local routing structures of a microelectronic device (e.g., a memory device, such as a DRAM device).

While FIGS. 7A through 7D show the formation of a single (e.g., only one) third routing tier 188 including third routing structures 190, multiple (e.g., more than one) third routing tiers 188 each individually including a desired arrangement (e.g., pattern) of third routing structures 190 may be formed. By way of non-limiting example, two or more (e.g., three or more) of the third routing tiers 188 may be formed, wherein different third routing tiers 188 are vertically offset from one another and each individually include a desired arrangement of third routing structures 190 therein. At least some of the third routing structures 190 within at least one of the third routing tiers 188 may be coupled to at least some of the third routing structures 190 within at least one other of the third routing tiers 188 by way of conductive interconnect structures.

With continued collective reference to FIGS. 7A through 7D, the transistors 172, the third routing structures 190, the fourth contact structures 184, the fifth contact structures 186 may form control logic circuitry of various control logic devices 191 (FIG. 7A) configured to control various operations of various features (e.g., the memory cells 146 (FIG. 6A)) of a microelectronic device (e.g., a memory device, such as a DRAM device) to be formed through the methods of the disclosure. In some embodiments, the control logic devices 191 comprise CMOS circuitry. As a non-limiting example, the control logic devices 191 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., main word line drivers, sub word line drivers (SWD)), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, array multiplexers (MUX), error checking and correction (ECC) devices, self-refresh/wear leveling devices, and other chip/deck control circuitry. Different regions (e.g., the array region 102' (FIG. 7A), the socket region 108' (FIG. 7D)) may have different control logic devices 191 formed within horizontal boundaries thereof.

With returned collective reference to FIGS. 7A through 7D, the sixth isolation material 174 covering and surrounding the second base semiconductor structure 168, the transistors 172 (FIGS. 7A and 7D), the gate structures 180 (FIGS. 7A and 7D), the fourth contact structures 184 (FIGS. 7A and 7D), the fifth contact structures 186 (FIGS. 7A and 7D), and the third routing structures 190 (FIGS. 7A and 7D) may be formed of and include at least one insulative material. A material composition of the sixth isolation material 174 may be substantially the same as a material composition of the fifth isolation material 164 (FIGS. 6A through 6D) of the first microelectronic device structure assembly 156 (FIGS. 6A through 6D), or the material composition of the sixth isolation material 174 may be different than the material composition of the fifth isolation material 164 (FIGS. 6A through 6D). In some embodiments, the sixth isolation material 174 is formed of and includes a dielectric oxide material, such as $SiO_x$ (e.g., $SiO_2$). The sixth isolation material 174 may be substantially homogeneous, or the sixth isolation material 174 may be heterogeneous. In some embodiments, the sixth isolation material 174 is substantially homogeneous. In additional embodiments, the sixth isolation material 174 is heterogeneous. The sixth isolation material 174 may, for example, be formed of and include a stack of at least two different dielectric materials. As shown in FIGS. 7A through 7D, an upper surface of the sixth isolation material 174 may be formed to be substantially planar and to vertically overlie upper surfaces of the third routing structures 190 (FIGS. 7A and 7D).

Referring next to FIGS. 8A through 8D, illustrated are simplified, partial longitudinal cross-sectional views, from the directional perspectives previously described, of the array region 102' (FIG. 8A), the digit line exit region 104' (FIG. 8B), the word line exit region 106' (FIG. 8C), and the socket region 108' (FIG. 8D) at a processing stage of the method of forming the microelectronic device following the processing stage previously described with reference to FIGS. 7A through 7D. As collectively depicted in FIGS. 8A through 8D, a fourth microelectronic device structure 192 (e.g., a fourth wafer) including an additional base structure 194 and a seventh isolation material 196 may be attached to the sixth isolation material 174 of the third microelectronic device structure 167 to form a second microelectronic device structure assembly 198.

The additional base structure 194 of the fourth microelectronic device structure 192 comprises a base material or construction upon which additional features (e.g., materials, structures, devices) are formed. In some embodiments, the additional base structure 194 comprises a wafer. The additional base structure 194 may be formed of and include one or more of semiconductor material (e.g., one or more of a silicon material, such as monocrystalline silicon or polycrystalline silicon (also referred to herein as "polysilicon"); silicon-germanium; germanium; gallium arsenide; a gallium nitride; gallium phosphide; indium phosphide; indium gallium nitride; and aluminum gallium nitride), a base semiconductor material on a supporting structure, glass material (e.g., one or more of BSP, PSG, FSG, BPSG, aluminosilicate glass, an alkaline earth boro-aluminosilicate glass, quartz, titania silicate glass, and soda-lime glass), and ceramic material (e.g., one or more of p-AlN, SOPAN, AlN, aluminum oxide (e.g., sapphire; $\alpha$-$Al_2O_3$), and silicon carbide).

By way of non-limiting example, the additional base structure 194 may comprise a semiconductor wafer (e.g., a silicon wafer), a glass wafer, or a ceramic wafer. The additional base structure 194 may include one or more layers, structures, and/or regions formed therein and/or thereon.

The seventh isolation material 196 of the fourth microelectronic device structure 192 may be formed of and include at least one insulative material. A material composition of the seventh isolation material 196 may be substantially the same as a material composition of the sixth isolation material 174 of the third microelectronic device structure 167; or the material composition of the seventh isolation material 196 may be different than the material composition of the sixth isolation material 174. In some embodiments, the seventh isolation material 196 is formed of and includes a dielectric oxide material, such as $SiO_x$ (e.g., $SiO_2$). The seventh isolation material 196 may be substantially homogeneous, or the seventh isolation material 196 may be heterogeneous. In some embodiments, the seventh isolation material 196 is substantially homogeneous. In additional embodiments, the seventh isolation material 196 is heterogeneous. The seventh isolation material 196 may, for example, be formed of and include a stack of at least two different dielectric materials.

To attach the fourth microelectronic device structure 192 to the sixth isolation material 174 of the third microelectronic device structure 167, the fourth microelectronic device structure 192 may be vertically inverted (e.g., flipped upside down in the Z-direction), the seventh isolation material 196 thereof may be provided in physical contact with the sixth isolation material 174, and the seventh isolation material 196 and the sixth isolation material 174 may be exposed to annealing conditions to form bonds (e.g., oxide-to-oxide bonds) between the seventh isolation material 196 and the sixth isolation material 174. By way of non-limiting example, the seventh isolation material 196 and the sixth isolation material 174 may be exposed to a temperature greater than or equal to about 400° C. (e.g., within a range of from about 400° C. to about 800° C., greater than about 800° C.) to form oxide-to-oxide bonds between the sixth isolation material 174 and the seventh isolation material 196. In some embodiments, the sixth isolation material 174 and the seventh isolation material 196 are exposed to at least one temperature greater than about 800° C. to form oxide-to-oxide bonds between the sixth isolation material 174 and the seventh isolation material 196.

As shown in FIGS. 8A through 8D, bonding the seventh isolation material 196 to the sixth isolation material 174 may form a second connected isolation structure 200. In FIGS. 8A through 8D, the seventh isolation material 196 and the sixth isolation material 174 of the second connected isolation structure 200 are distinguished from one another by way of a dashed line. However, the seventh isolation material 196 to the sixth isolation material 174 may be integral and continuous with one another. Put another way, the second connected isolation structure 200 may be a substantially monolithic structure including the seventh isolation material 196 as a first region thereof, and the sixth isolation material 174 as a second region thereof. For the second connected isolation structure 200, the seventh isolation material 196 thereof may be attached to the sixth isolation material 174 thereof without a bond line.

Referring next to FIGS. 9A through 9D, illustrated are simplified, partial longitudinal cross-sectional views, from the directional perspectives previously described, of the array region 102' (FIG. 9A), the digit line exit region 104' (FIG. 9B), the word line exit region 106' (FIG. 9C), and the socket region 108' (FIG. 9D) at a processing stage of the method of forming the microelectronic device following the processing stage previously described with reference to FIGS. 8A through 8D. As collectively depicted in FIGS. 9A through 9D, the second microelectronic device structure assembly 198 may be vertically inverted (e.g., flipped upside down in the Z-direction), and an upper portion of the second base semiconductor structure 168 (FIGS. 8A through 8D) may be removed to expose (e.g., uncover) the sixth isolation material 174 within the additional filled trenches 170 (FIGS. 8A through 8D) and form a second semiconductor tier 202 (FIGS. 9A and 9D) including second semiconductor structures 204 separated from one another by remaining portions of the sixth isolation material 174. Thereafter, an eighth isolation material 206 may be formed on or over surfaces of the second semiconductor structures 204 and the sixth isolation material 174.

The upper portion of the second base semiconductor structure 168 (FIGS. 8A through 8D) vertically overlying the additional filled trenches 170 (FIGS. 8A through 8D) following the vertical inversion of the second microelectronic device structure assembly 198 may be removed using at least one conventional wafer thinning process (e.g., a conventional CMP process; a conventional etching process, such as a conventional dry etching process, or a conventional wet etching process). The second semiconductor structures 204 may be formed to exhibit a desired vertical height (e.g., in the Z-direction) through the material removal process. The material removal process may also remove portions (e.g., upper portions following the vertical inversion of the second microelectronic device structure assembly 198) of the sixth isolation material 174.

Referring collectively to FIGS. 9A through 9D, the eighth isolation material 206 formed to cover the second semiconductor structures 204 (FIGS. 9A and 9D) and the sixth isolation material 174 may be formed of and include at least one insulative material. A material composition of the eighth isolation material 206 may be substantially the same as a material composition of the sixth isolation material 174, or the material composition of the eighth isolation material 206 may be different than the material composition of the sixth isolation material 174. In some embodiments, the eighth isolation material 206 is formed of and includes a dielectric oxide material, such as $SiO_x$ (e.g., $SiO_2$). The eighth isolation material 206 may be substantially homogeneous, or the eighth isolation material 206 may be heterogeneous. In some embodiments, the eighth isolation material 206 is substantially homogeneous. In additional embodiments, the eighth isolation material 206 is heterogeneous. The eighth isolation material 206 may, for example, be formed of and include a stack of at least two different dielectric materials. As shown in FIGS. 9A through 9D, an upper surface of the eighth isolation material 206 may be formed to be substantially planar.

Referring next to FIGS. 10A through 10D, illustrated are simplified, partial longitudinal cross-sectional views, from the directional perspectives previously described, of the array region 102 (FIG. 10A), the digit line exit region 104 (FIG. 10B), the word line exit region 106 (FIG. 10C), and the socket region 108 (FIG. 10D) previously described with reference to FIGS. 6A through 6D at a processing stage of the method of forming the microelectronic device following the processing stages previously described with reference to FIGS. 6A through 6D and FIGS. 9A through 9D. As depicted in FIGS. 10A through 10D, following the processing stage previously described with reference to FIGS. 9A through 9B, the second microelectronic device structure assembly 198 may be vertically inverted (e.g., flipped upside down in the Z-direction) and the eighth isolation material 206 thereof may be attached (e.g., bonded, such as through oxide-oxide bonding) to the fifth isolation material 164 of the first microelectronic device structure assembly 156 to form a third microelectronic device structure assembly 208. Attaching (e.g., bonding) the eighth isolation material 206 of the second microelectronic device structure assembly 198 to the fifth isolation material 164 of the first microelectronic device structure assembly may form a third connected isolation structure 210 of the third microelectronic device structure assembly 208. Following the attachment of the eighth isolation material 206 to the fifth isolation material 164, the additional base structure 194 (FIGS. 9A through 9D) of the second microelectronic device structure assembly 198 may be removed.

As depicted in FIGS. 10A through 10D, the second microelectronic device structure assembly 198 may be attached to the first microelectronic device structure assembly 156 such that array regions 102' (FIG. 9A), digit line exit regions 104' (FIG. 9B), word line exit region 106' (FIG. 9C), and socket regions 108' (FIG. 9D) of the second microelectronic device structure assembly 198 horizontally overlap (e.g., are substantially horizontally aligned with) array regions 102 (FIG. 6A), digit line exit regions 104 (FIG. 6B), word line exit regions 106 (FIG. 6C), and socket regions 108 (FIG. 6D) of the first microelectronic device structure assembly 156, respectively. Thus, in FIGS. 10A through 10D, the array region 102 (FIG. 10A), the digit line exit region 104 (FIG. 10B), the word line exit region 106 (FIG. 10C), and the socket region 108 (FIG. 10D) respectively include features of the array region 102' (FIG. 9A), the digit line exit region 104' (FIG. 9B), the word line exit region 106' (FIG. 9C), and the socket region 108' (FIG. 9D) of the second microelectronic device structure assembly 198 following the processing stage previously described with reference to FIGS. 9A through 9D. While the different regions shown in FIGS. 10A through 10D were previously described as different regions of the first microelectronic device structure 100 (FIGS. 1 and 2A through 2D) and of the first microelectronic device structure assembly 156 (FIGS. 6A through 6D) formed by processing the first microelectronic device structure 100 according to the methods of the disclosure, it will be understood that these regions become regions of a microelectronic device of the disclosure formed using the first microelectronic device structure assembly 156 and the second microelectronic device structure assembly 198, as described in further detail below. Thus, these different regions are not limited to the features (e.g., structures, materials, devices) and/or portions of features of the first microelectronic device structure 100 and the first microelectronic device structure assembly 156. Instead, these regions evolve through the methods of the disclosure to encompass and include additional features (e.g., additional structures, additional materials, additional devices), portions of additional features, and/or modified features.

To form the third microelectronic device structure assembly 208, the eighth isolation material 206 of the second microelectronic device structure assembly 198 may be provided in physical contact with the fifth isolation material 164 of the first microelectronic device structure assembly 156, and then the eighth isolation material 206 and the fifth isolation material 164 may be exposed to annealing conditions to form bonds (e.g., oxide-to-oxide bonds) between the eighth isolation material 206 and the fifth isolation material 164. By way of non-limiting example, the eighth isolation material 206 and the fifth isolation material 164 may be exposed to a temperature greater than or equal to about 400° C. (e.g., within a range of from about 400° C. to about 800° C., greater than about 800° C.) to form oxide-to-oxide bonds between the eighth isolation material 206 and the fifth isolation material 164. In some embodiments, the eighth isolation material 206 and the fifth isolation material 164 are exposed to at least one temperature greater than about 800° C. to form oxide-to-oxide bonds between the eighth isolation material 206 and the fifth isolation material 164.

In FIGS. 10A through 10D, the eighth isolation material 206 and the fifth isolation material 164 of the third connected isolation structure 210 are distinguished from one another by way of a dashed line. However, the eighth isolation material 206 and the fifth isolation material 164 may be integral and continuous with one another. Put another way, third connected isolation structure 210 may be a substantially monolithic structure including the eighth isolation material 206 as a first region thereof, and the fifth isolation material 164 as a second region thereof. For the third connected isolation structure 210, the eighth isolation material 206 thereof may be attached to the fifth isolation material 164 thereof without a bond line.

Figures 9A, 9B:
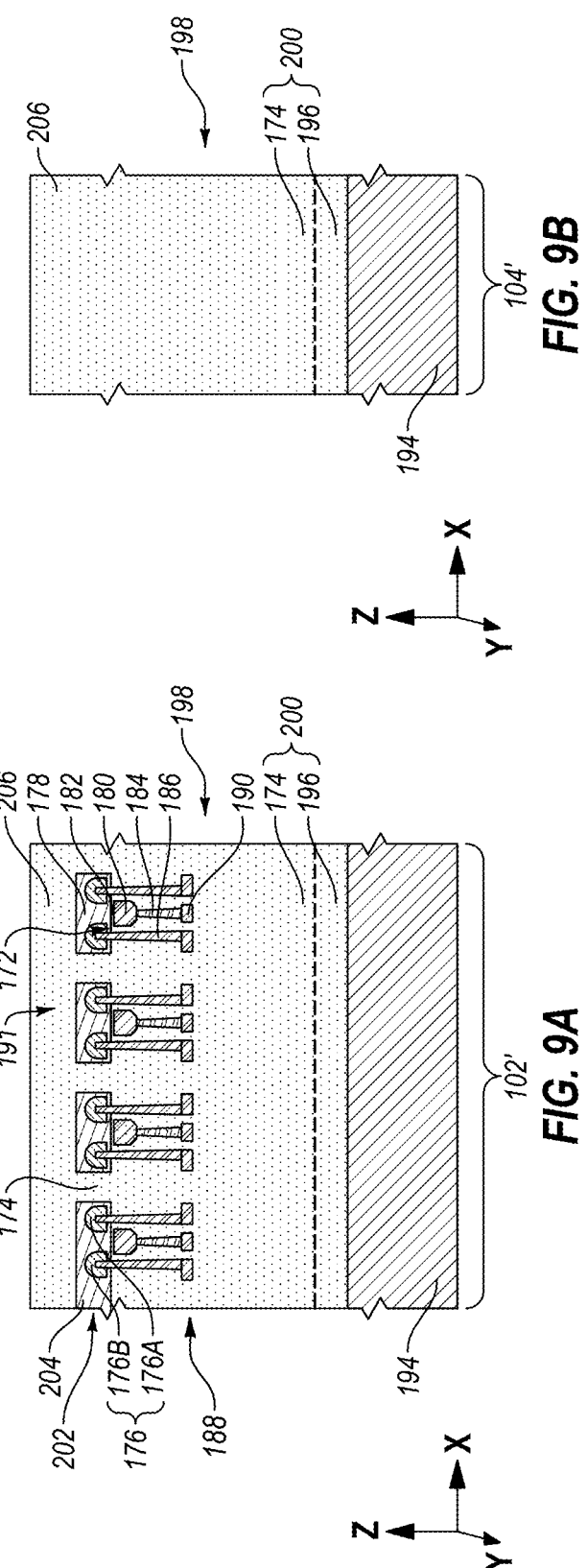
FIGS. 9A through 9D are simplified, partial longitudinal cross-sectional views of the array region (FIG. 9A), the digit line exit region (FIG. 9B), the word line exit region (FIG. 9C), and the socket region (FIG. 9D) shown in FIGS. 7A through 7D, respectively, at another processing stage of the method of forming the microelectronic device following the processing stage of FIGS. 8A through 8D.
Figures 9C, 9D:
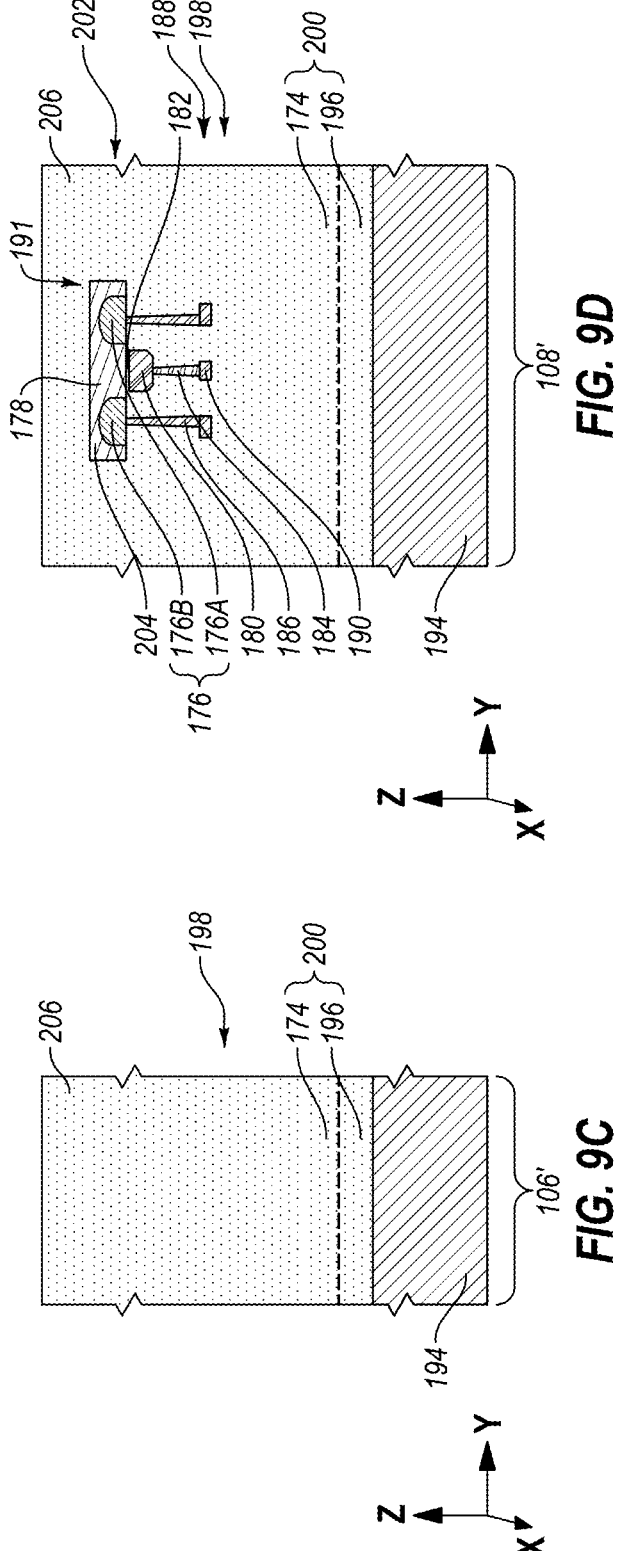
Figures 10A, 10B:
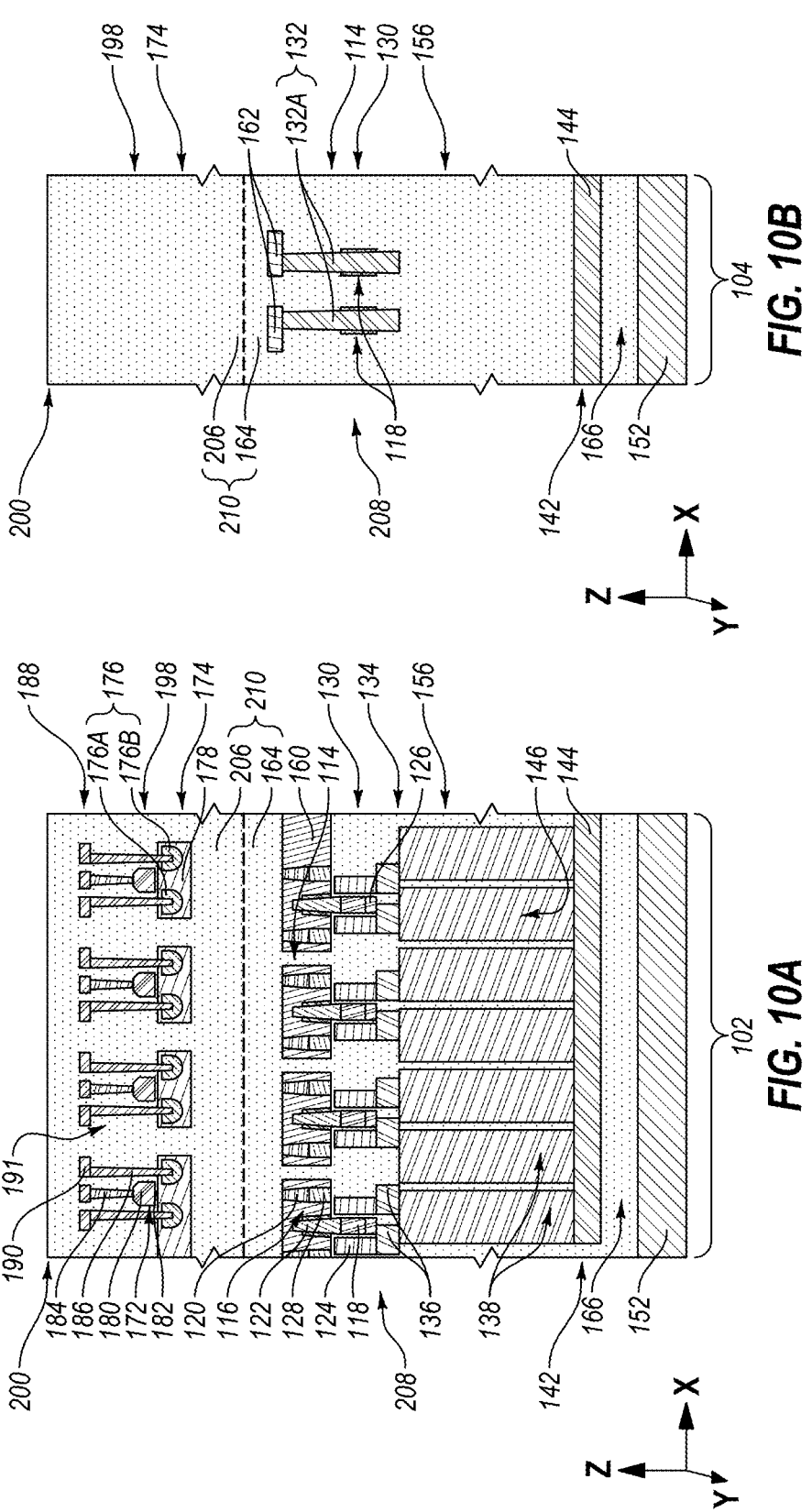
FIGS. 10A through 10D are simplified, partial longitudinal cross-sectional views of the array region (FIG. 10A), the digit line exit region (FIG. 10B), the word line exit region (FIG. 10C), and the socket region (FIG. 10D) shown in FIGS. 2A through 2D, respectively, at another processing stage of the method of forming the microelectronic device following the processing stage of FIGS. 6A through 6D and the processing stage of FIGS. 9A through 9D.
Figures 10C, 10D:
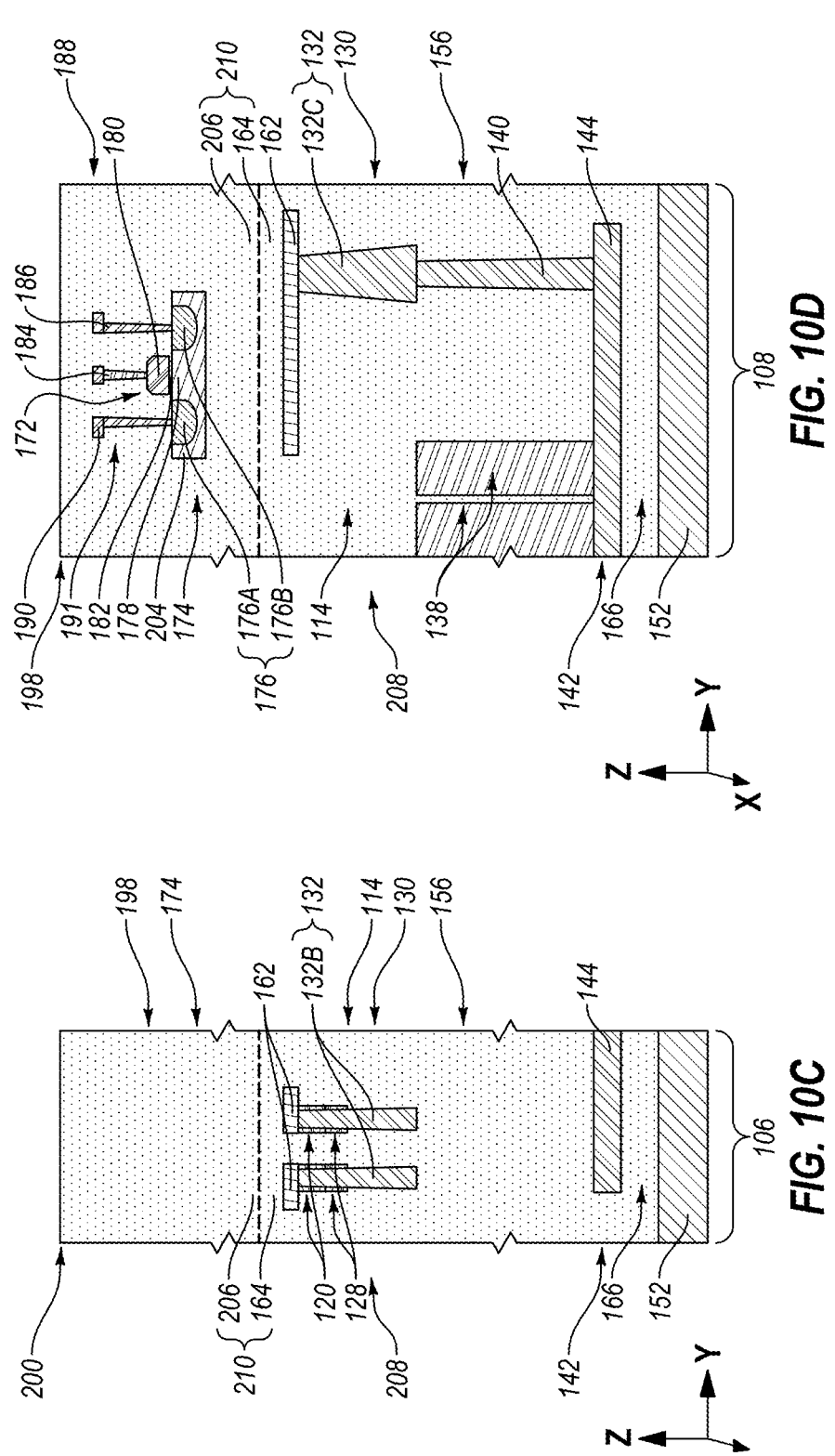

In additional embodiments, the third microelectronic device structure 167 previously described with reference to FIGS. 7A through 7D is attached to the first microelectronic device structure assembly 156 without forming the second microelectronic device structure assembly 198 through the processing acts previously described with reference to FIGS. 8A through 9D. For example, the third microelectronic device structure 167 (FIGS. 7A through 7D) may be vertically inverted, the sixth isolation material 174 thereof may be provided on the fifth isolation material 164 of the first microelectronic device structure assembly 156, and then the sixth isolation material 174 and fifth isolation material 164 may be subjected to annealing conditions (e.g., a temperature greater than or equal to about 400° C., such as within a range of from about 400° C. to about 800° C., or greater than about 800° C.) to form bonds (e.g., oxide-to-oxide bonds) between the sixth isolation material 174 and fifth isolation material 164. Thereafter, an upper portion of the second base semiconductor structure 168 (FIGS. 7A through 7D) vertically overlying the additional filled trenches 170 (FIGS. 7A through 7D) may be removed in a manner similar to that previously described with reference to FIGS. 9A through 9D to form the second semiconductor tier 202 (FIGS. 9A and 9D) including the second semiconductor structures 204 (FIGS. 9A and 9D). In such embodiments, the orientations of the control logic devices 191 (FIGS. 10A and 10D) (including the control logic circuitry thereof, such as the transistors 172, the third routing structures 190, the fourth contact structures 184, and the fifth contact structures 186) are vertically inverted relative to the orientations depicted in FIGS. 10A and 10D. For example, in such embodiments, the gate structures 180 of the transistors 172 are positioned relatively more vertically proximate the access devices 116 than in the configuration described above with reference to FIGS. 10A through 10D. Attaching and acting upon the third microelectronic device structure 167 (FIGS. 7A through 7D) in this manner (e.g., as an alternative to the processing acts and stage previously described with reference to FIGS. 8A through 10D) may, for example, be employed when a different routing and interconnect scheme for a microelectronic device of the disclosure is desirable.

Referring next to FIGS. 11A through 11D, illustrated are simplified, partial longitudinal cross-sectional views, from the directional perspectives previously described, of the array region 102 (FIG. 11A), the digit line exit region 104

Figures 11A, 11B:
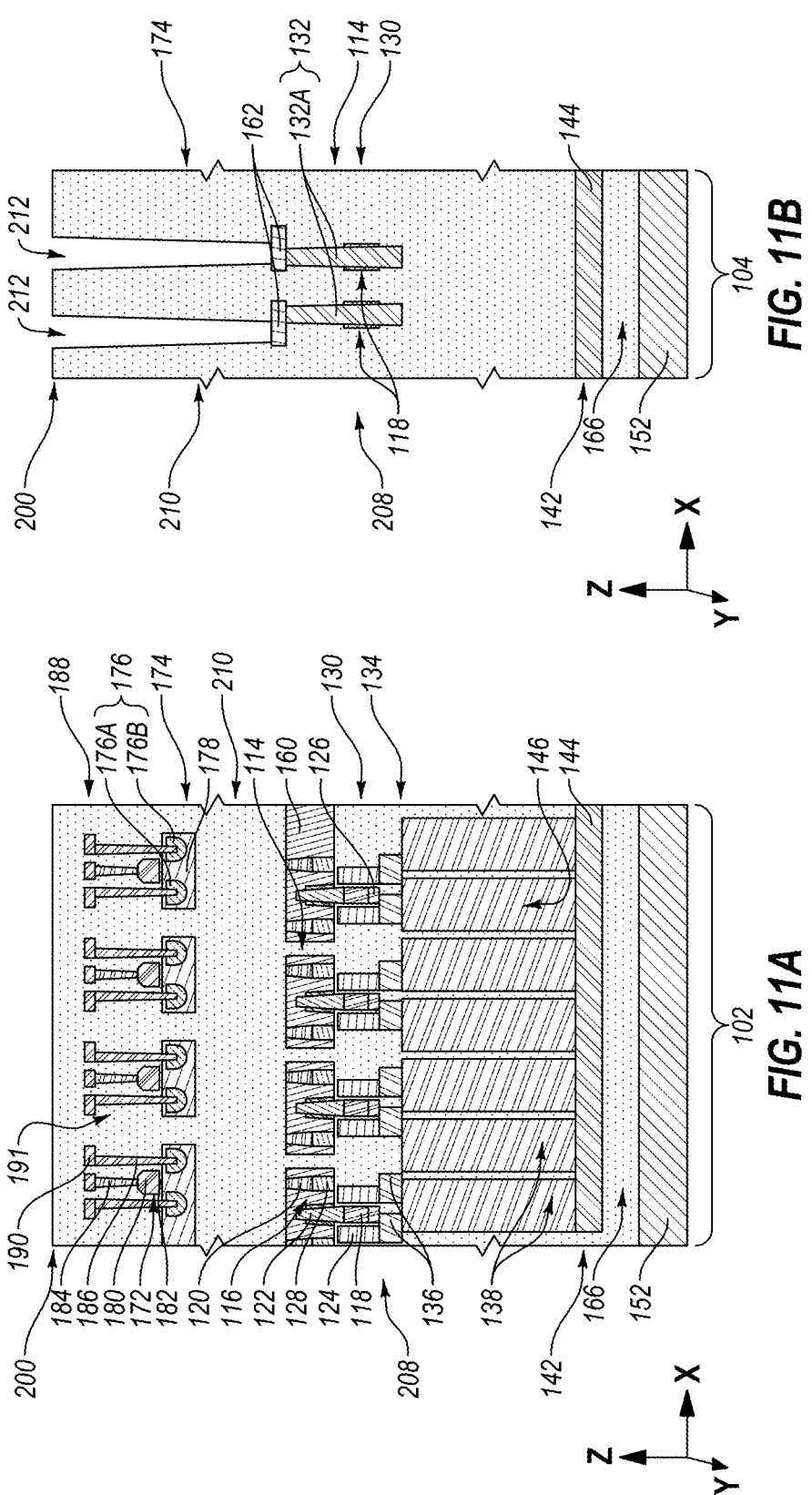
FIGS. 11A through 11D are simplified, partial longitudinal cross-sectional views of the array region (FIG. 11A), the digit line exit region (FIG. 11B), the word line exit region (FIG. 11C), and the socket region (FIG. 11D) shown in FIGS. 2A through 2D, respectively, at another processing stage of the method of forming the microelectronic device following the processing stage of FIGS. 10A through 10D.
Figures 11C, 11D:
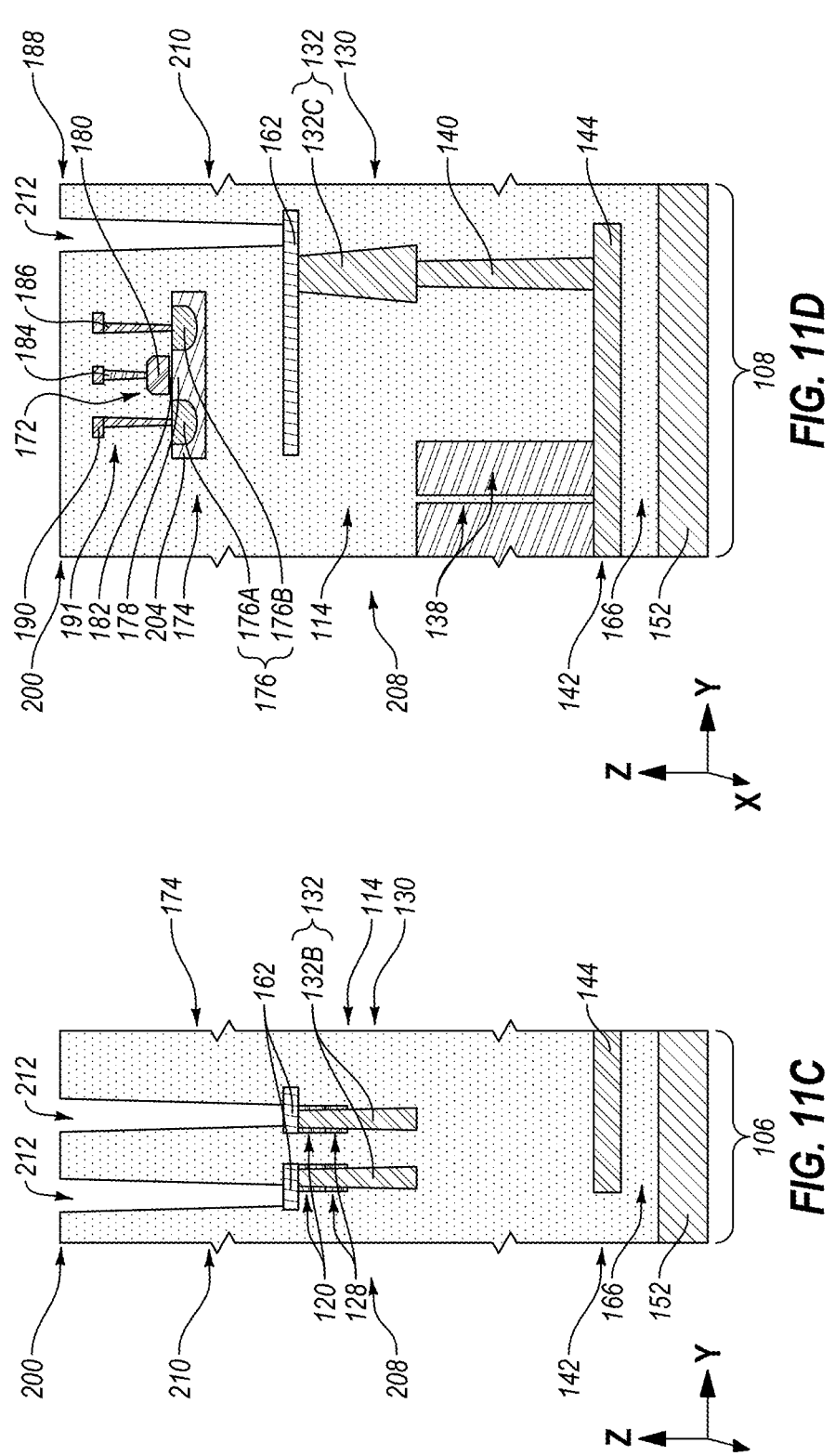

(FIG. 11B), the word line exit region 106 (FIG. 11C), and the socket region 108 (FIG. 11D) at a processing stage of the method of forming the microelectronic device following the processing stage previously described with reference to FIGS. 10A through 10D. As collectively depicted in FIGS. 11A through 11D, contact openings 212 (FIGS. 11B through 11D) may be formed to vertically extend to and expose (e.g., uncover) portions of the sacrificial structures 162 (FIGS. 11B through 11D). As shown in FIGS. 11B through 11D, the contact openings 212 may be formed to vertically extend through portions of the second connected isolation structure 200, the sixth isolation material 174, and the third connected isolation structure 210 vertically overlying the sacrificial structures 162. The contact openings 212 may be formed to terminate at or below uppermost vertical boundaries (e.g., uppermost surfaces) of the sacrificial structures 162. Lowermost vertical boundaries of the contact openings 212 may vertically overlie lowermost vertical boundaries (e.g., lowermost surfaces) of the sacrificial structures 162.

As described in further detail below, the contact openings 212 may be employed to remove (e.g., exhume) the sacrificial structures 162 and facilitate the formation of additional contact structures (e.g., sixth contact structures) in contact (e.g., physical contact, electrical contact) with the third contact structures 132 (FIGS. 11B through 11D). The formation of the contact openings 212, as well as the subsequent formation of the additional contact structures using the sacrificial structures 162 and the contact openings 212, may reduce contact misalignment risks and/or alleviate the need for relatively complex contact alignment operations and systems as compared to conventional methods of the forming contact structures in contact with other contact structures.

Referring collectively to FIGS. 11B through 11D, a geometric configuration (e.g., shape, dimensions), horizontal position (e.g., in the X-direction and in the Y-direction), and horizontal spacing of each of the contact openings 212 at least partially depends on the geometric configurations, horizontal positions, and horizontal spacing of the sacrificial structures 162. The contact openings 212 may be formed to be at least partially (e.g., substantially) horizontally overlap (e.g., in the X-direction and in the Y-direction) the sacrificial structures 162. In addition, the contact openings 212 may each be formed to have horizontal dimensions (e.g., in the X-direction and in the Y-direction) less than or equal to (e.g., less than) corresponding horizontal dimensions of the sacrificial structure 162 exposed thereby.

In some embodiments, the contact openings 212 are formed to exhibit substantially the same geometric configurations (e.g., substantially the same shapes and substantially the same dimensions) as one another. For example, each of the contact openings 212 may be formed to exhibit a substantially circular horizontal cross-sectional shape and may have substantially the same horizontal dimensions (e.g., diameter) as each of the other contact openings 212. In additional embodiments, one or more of the contact openings 212 is formed to exhibit a different geometric configuration (e.g., a different shape, such as a non-circular horizontal cross-sectional shape; and/or one or more different horizontal dimensions) than one or more other of the contact openings 212.

The contact openings 212 may be formed by subjecting portions of the second connected isolation structure 200, the sixth isolation material 174, and the third connected isolation structure 210 vertically overlying the sacrificial structures 162 to one or more conventional material removal processes (e.g., one or more conventional etching processes, such as one or more conventional anisotropic dry etching process), which are not described in detail herein.

Figures 12A, 12B:
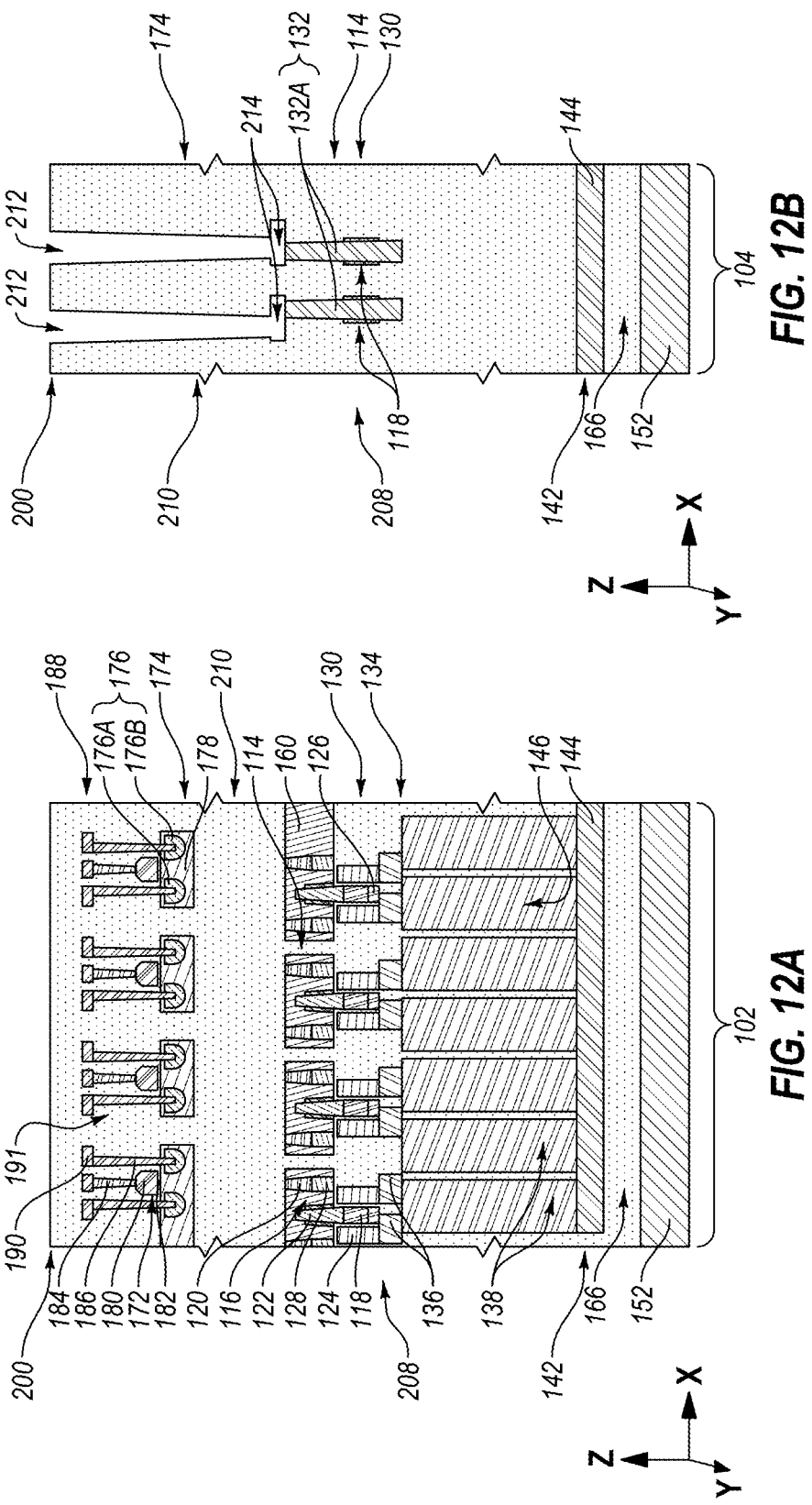
FIGS. 12A through 12D are simplified, partial longitudinal cross-sectional views of the array region (FIG. 12A), the digit line exit region (FIG. 12B), the word line exit region (FIG. 12C), and the socket region (FIG. 12D) shown in FIGS. 2A through 2D, respectively, at another processing stage of the method of forming the microelectronic device following the processing stage of FIGS. 11A through 11D.
Figures 12C, 12D:
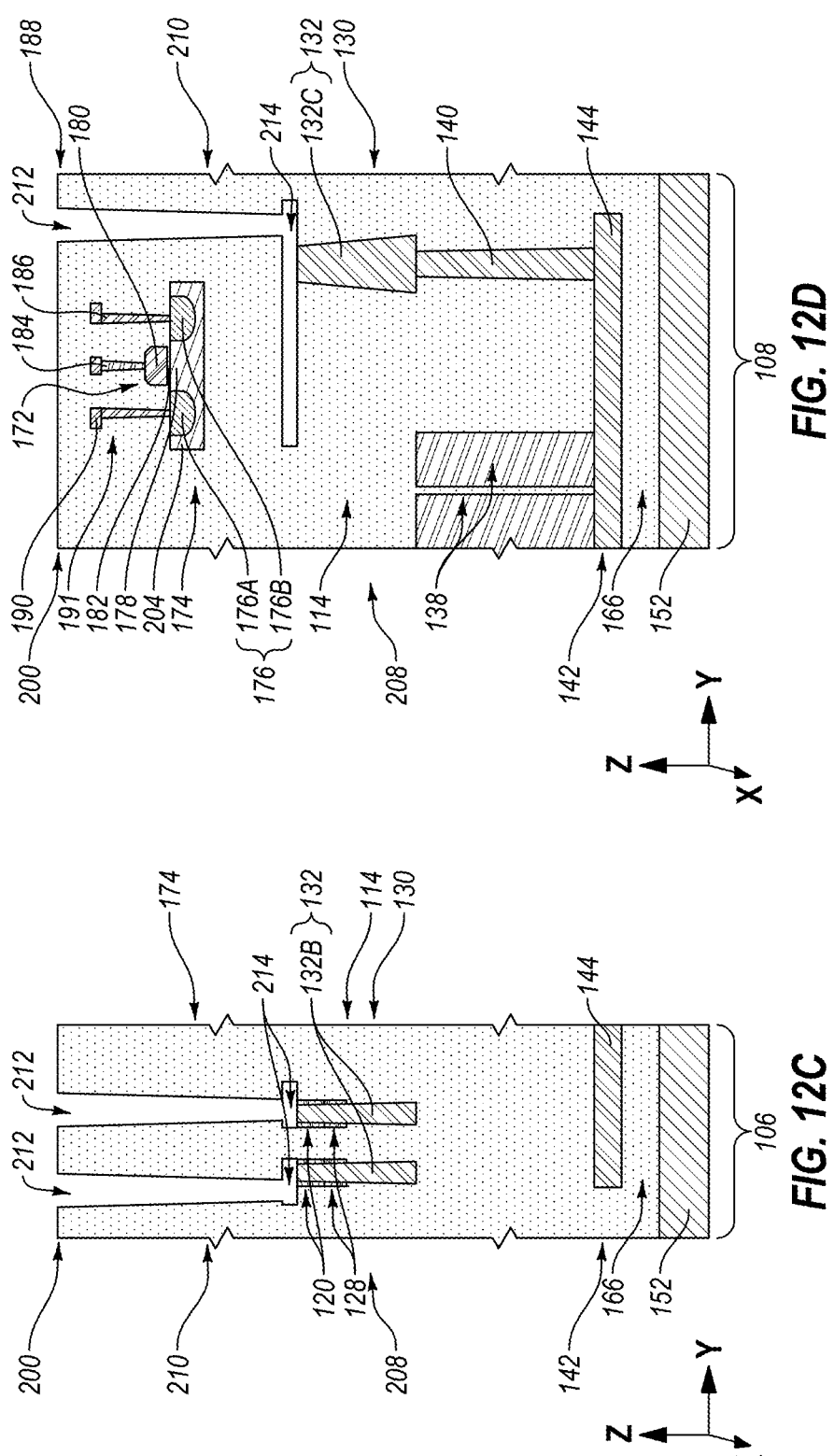

Referring next to FIGS. 12A through 12D, illustrated are simplified, partial longitudinal cross-sectional views, from the directional perspectives previously described, of the array region 102 (FIG. 12A), the digit line exit region 104 (FIG. 12B), the word line exit region 106 (FIG. 12C), and the socket region 108 (FIG. 12D) at a processing stage of the method of forming the microelectronic device following the processing stage previously described with reference to FIGS. 11A through 11D. As collectively depicted in FIGS. 12A through 12D, the sacrificial structures 162 (FIGS. 12B through 12D) may be selectively removed (e.g., selectively etched and exhumed) through the contact openings 212 to form void spaces 214 (e.g., open volumes). The void spaces 214 may have geometric configurations (e.g., shapes, dimensions) and positions corresponding to (e.g., substantially the same as) the geometric configurations and positions of the sacrificial structures 162 (FIGS. 12B through 12D). In addition, the void spaces 214 may expose (e.g., uncover) portions of the third contact structures 132 (FIGS. 11B through 11D) (e.g., upper surfaces of the third contact structures 132) previously covered by the sacrificial structures 162 (FIGS. 12B through 12D).

To form the void spaces 214, the third microelectronic device structure assembly 208 may be exposed to at least one chemical species (e.g., at least etchant) that selectively removes (e.g., selectively etches) the sacrificial structures 162 (FIGS. 12B through 12D) relative to the second connected isolation structure 200, the sixth isolation material 174, the third connected isolation structure 210, the third contact structures 132, and the first isolation material 114. The chemical species may, for example, etch the sacrificial structures 162 (FIGS. 12B through 12D) at a rate that is at least about five times (5×) greater (e.g., at least about ten times (10×) greater, at least about twenty times (20×) greater, at least about forty times (40×) greater) than rate(s) at which the chemical species etches the second connected isolation structure 200, the sixth isolation material 174, the third connected isolation structure 210, the third contact structures 132, and the first isolation material 114. By way of non-limiting example, if the second connected isolation structure 200, the sixth isolation material 174, the third connected isolation structure 210, and the first isolation material 114 are formed of and include a dielectric oxide material (e.g., $SiO_x$, such as $SiO_2$) and the sacrificial structures 162 (FIGS. 12B through 12D) are formed of and include a dielectric nitride material (e.g., $SiN_y$, such as $Si_3N_4$), the third microelectronic device structure assembly 208 may be treated with phosphoric acid ($H_3PO_4$) to selectively remove the sacrificial structures 162 (FIGS. 12B through 12D) through the contact openings 212 and form the void spaces 214.

Referring next to FIGS. 13A through 13D, illustrated are simplified, partial longitudinal cross-sectional views, from the directional perspectives previously described, of the array region 102 (FIG. 13A), the digit line exit region 104 (FIG. 13B), the word line exit region 106 (FIG. 13C), and the socket region 108 (FIG. 13D) at a processing stage of the method of forming the microelectronic device following the processing stage previously described with reference to FIGS. 12A through 12D. As collectively depicted in FIGS. 13A through 13D, sixth contact structures 216 (FIGS. 13B through 13D) may be formed within the contact openings 212 (FIGS. 12B through 12D) and the void spaces 214 (FIGS. 12B through 12D). The sixth contact structures 216 may substantially fill the contact openings 212 (FIGS. 12B through 12D) and the void spaces 214 (FIGS. 12B through 12D). Individual sixth contact structures 216 may be formed to contact (e.g., physically contact, electrically contact) individual third contact structures 132.

Figures 13A, 13B:
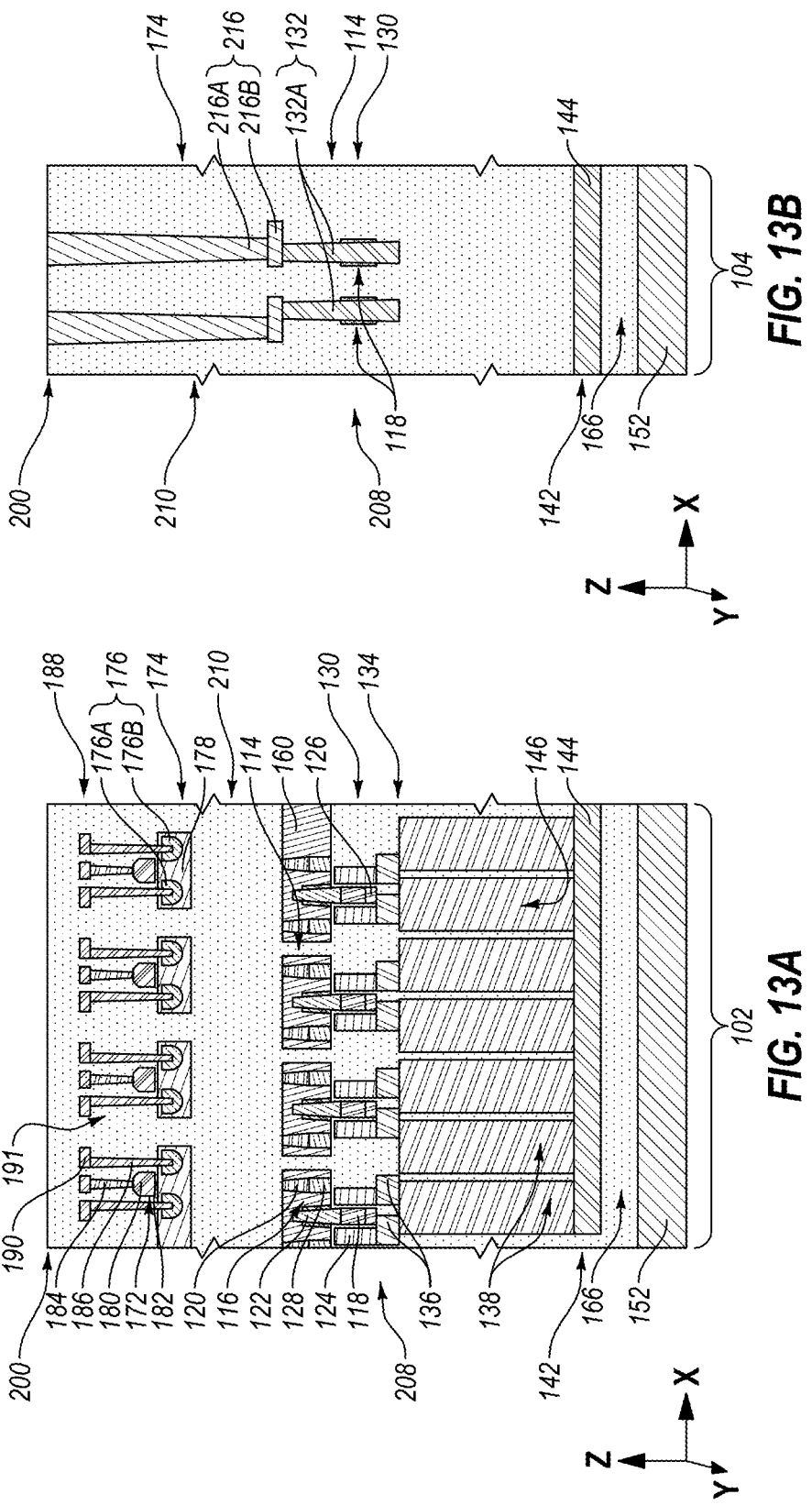
FIGS. 13A through 13D are simplified, partial longitudinal cross-sectional views of the array region (FIG. 13A), the digit line exit region (FIG. 13B), the word line exit region (FIG. 13C), and the socket region (FIG. 13D) shown in FIGS. 2A through 2D, respectively, at another processing stage of the method of forming the microelectronic device following the processing stage of FIGS. 12A through 12D.
Figures 13C, 13D:
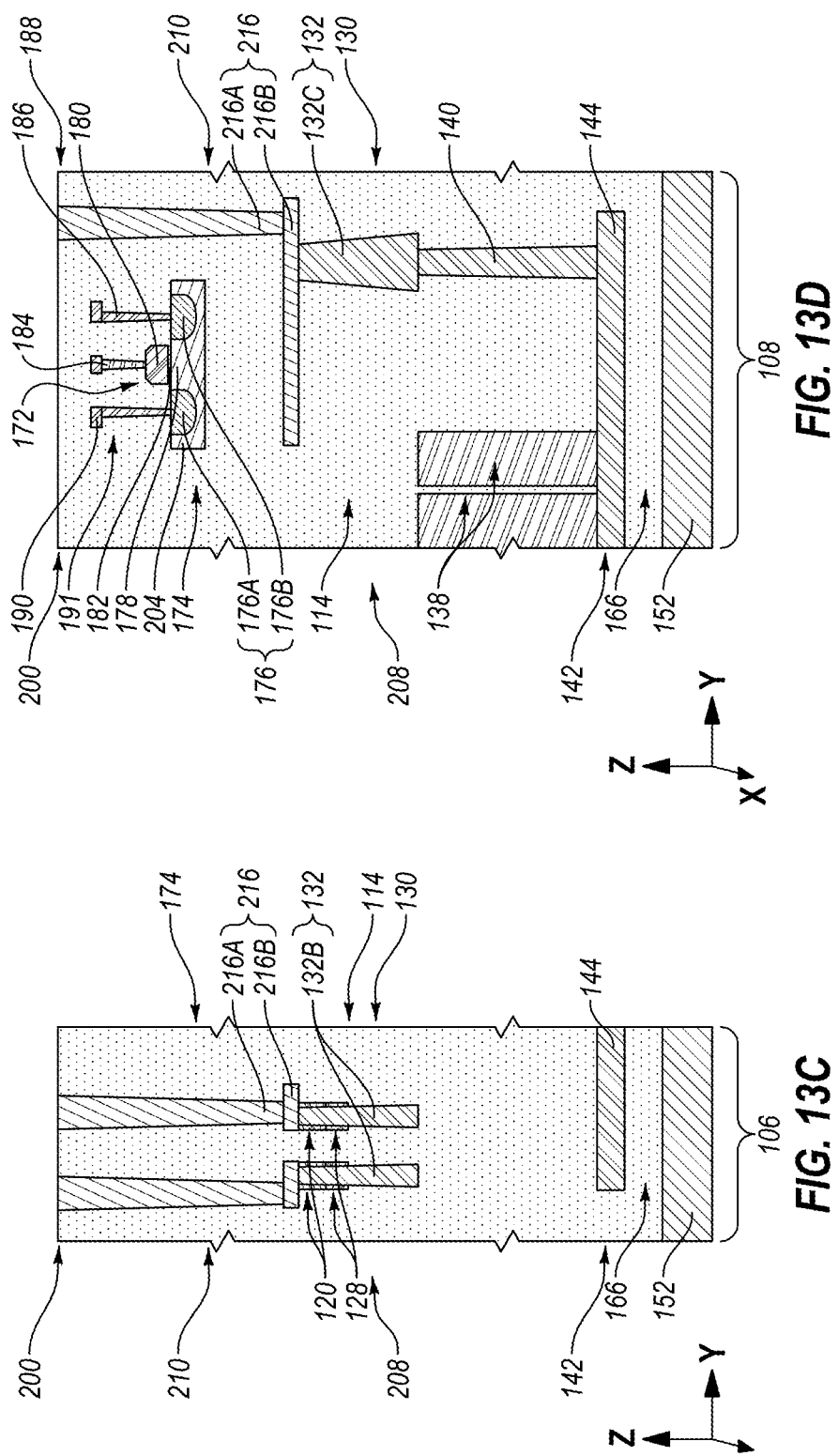

Referring collectively to FIGS. 13B through 13D, each of the sixth contact structures 216 may be formed to include a first region 216A (e.g., an upper region) and a second region 216B (e.g., a lower region). For an individual sixth contact structure 216, the first region 216A thereof may be positioned within boundaries (e.g., vertical boundaries, horizontal boundaries) of the contact opening 212 (FIGS. 12B through 12D) in which the sixth contact structure 216 is formed, and the second region 216B thereof may be positioned within boundaries (e.g., vertical boundaries, horizontal boundaries) of the void space 214 (FIGS. 12B through 12D) in which the sixth contact structure 216 is formed. A geometric configuration (e.g., shape, dimensions) of the first region 216A may be substantially the same as a geometric configuration of the contact opening 212 (FIGS. 12B through 12D); and geometric configuration of the second region 216B may be substantially the same as a geometric configuration of the void space 214 (FIGS. 12B through 12D). As shown in FIGS. 12B through 12D, for an individual sixth contact structure 216, the second region 216B may vertically underlie (e.g., in the Z-direction) the first region 216A, and the second region 216B may horizontally extend (e.g., in the X-direction, in the Y-direction) beyond horizontal boundaries of the first region 216A. For each of the sixth contact structures 216, the first region 216A thereof may be integral and continuous with the second region 216B thereof. Put another way, each sixth contact structure 216 may be formed to be a substantially monolithic structure including the first region 216A and the second region 216B.

The sixth contact structures 216 (including the first regions 216A and the second regions 216B thereof) may be formed of and include conductive material. By way of non-limiting example, the sixth contact structures 216 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the sixth contact structures 216 are each individually formed of and include W. Each of the sixth contact structures 216 may be substantially homogeneous, or one or more of the sixth contact structures 216 may individually be heterogeneous. In some embodiments, each of the sixth contact structures 216 is substantially homogeneous. In additional embodiments, each of the sixth contact structures 216 is heterogeneous. Each sixth contact structure 216 may, for example, be formed of and include a stack of at least two different conductive materials.

Figures 14A, 14B:
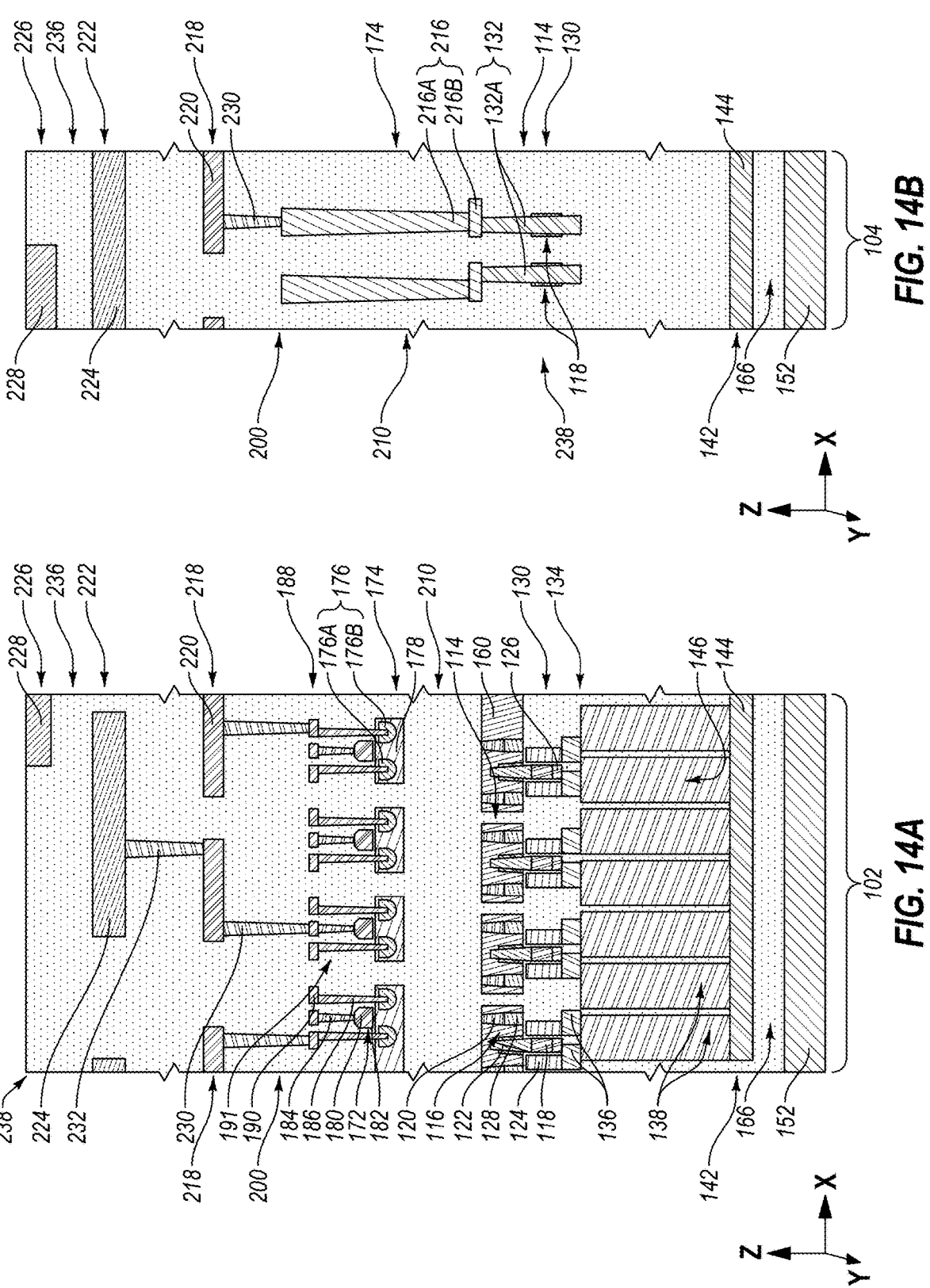
FIGS. 14A through 14D are simplified, partial longitudinal cross-sectional views of the array region (FIG. 14A), the digit line exit region (FIG. 14B), the word line exit region (FIG. 14C), and the socket region (FIG. 14D) shown in FIGS. 2A through 2D, respectively, at another processing stage of the method of forming the microelectronic device following the processing stage of FIGS. 13A through 13D.
Figures 14C, 14D:
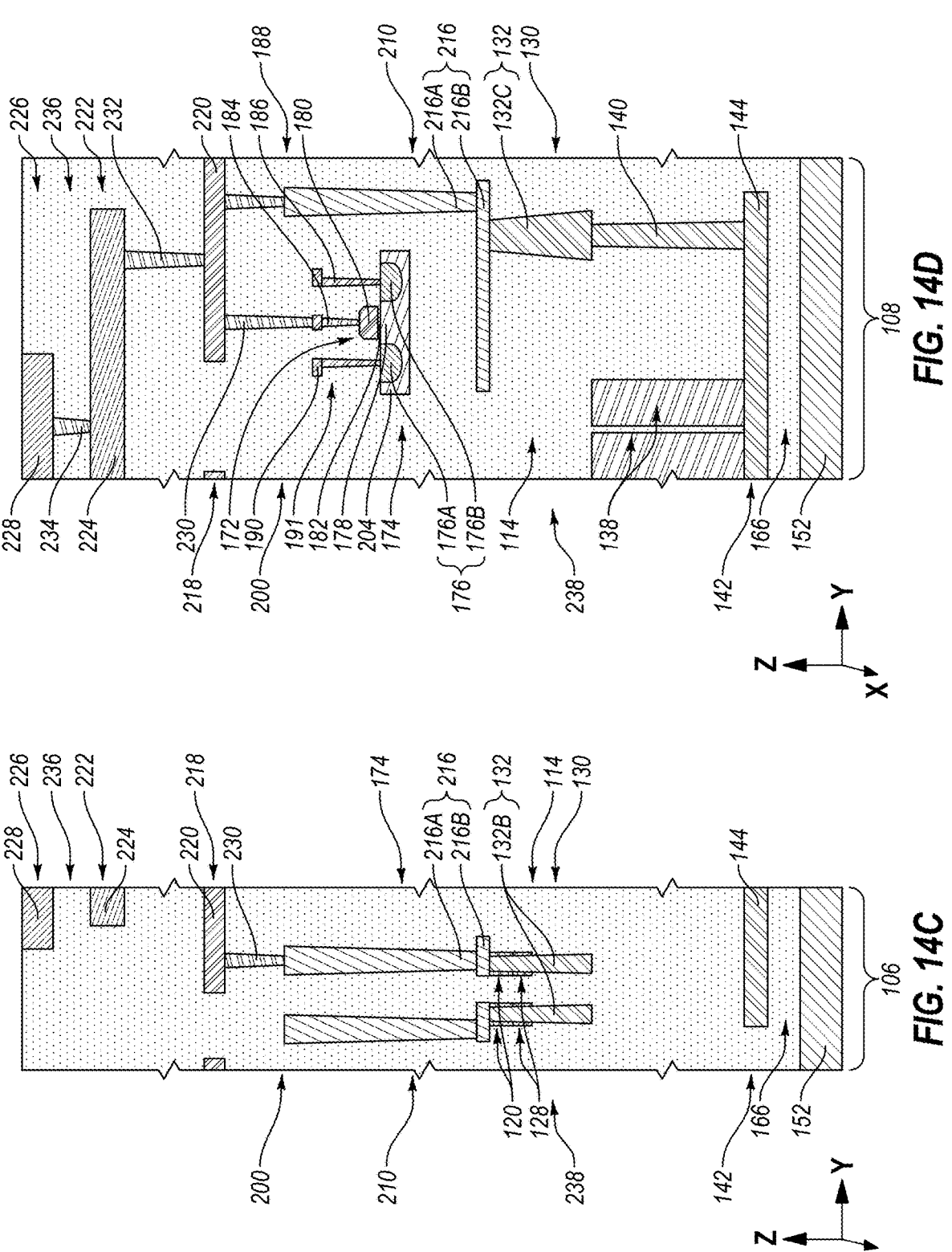

Referring next to FIGS. 14A through 14D, illustrated are simplified, partial longitudinal cross-sectional views, from the directional perspectives previously described, of the array region 102 (FIG. 14A), the digit line exit region 104 (FIG. 14B), the word line exit region 106 (FIG. 14C), and the socket region 108 (FIG. 14D) at a processing stage of the method of forming the microelectronic device following the processing stage previously described with reference to FIGS. 13A through 13D. As collectively depicted in FIGS. 14A through 14D, BEOL structures may be formed over the third routing tier 188. For example, at least one fourth routing tier 218 including fourth routing structures 220 may be formed over the third routing tier 188; at least one fifth routing tier 222 including fifth routing structures 224 may be formed over the fourth routing tier 218; and at least one sixth routing tier 226 including sixth routing structures 228 may be formed over the fifth routing tier 222. One or more of the fourth routing structures 220 of the fourth routing tier 218 may be coupled to one or more of the third routing structures 190 of the third routing tier 188 and/or one or more of the sixth contact structures 216 by way of seventh contact structures 230. In addition, one or more of the fifth routing structures 224 of the fifth routing tier 222 may be coupled to one or more of the fourth routing structures 220 of the fourth routing tier 218 by way of eighth contact structures 232 (FIGS. 14A and 14C). Furthermore, one or more of the sixth routing structures 228 (e.g., one or more conductive pad structures) of the sixth routing tier 226 may be coupled to one or more of the fifth routing structures 224 of the fifth routing tier 222 by way of ninth contact structures 234 (FIG. 14D). In additional embodiments, at least some (e.g., all) of the ninth contact structures 234 (FIG. 14D) are omitted (e.g., are not formed), and one or more of the sixth routing structures 228 of the sixth routing tier 226 are formed to directly physically contact one or more of the fifth routing structures 224 of the fifth routing tier 222.

Referring to FIG. 14D, in some embodiments, at least some of the fourth routing structures 220, the fifth routing structures 224, and the sixth routing structures 228 are formed to be in electrical communication with at least some of the second routing structures 144 coupled to the memory cells 146 (FIG. 14A) within the array region 102 (FIG. 14A) by way of at least one deep contact assembly extending between the at least some of the fourth routing structures 220 and at least some of the second routing structures 144 within the socket region 108. As shown in FIG. 14D, the deep contact assembly may include some of the contact structures (e.g., at least one of the ninth contact structures 234 (if any), at least one of the eighth contact structures 232, at least one of the seventh contact structures 230, at least one of the sixth contact structures 216, at least one of the third contact structures 132, and at least one of the fourth contact structures 140) located within the socket region 108, as well the routing structures within the socket region 108 coupled to the some of the contact structures.

The fourth routing structures 220, the fifth routing structures 224, the sixth routing structures 228, the seventh contact structures 230, the eighth contact structures 232 (FIGS. 14A and 14D), and the ninth contact structures 234 (FIG. 14D) (if any) may each be formed of and include conductive material. By way of non-limiting example, the fourth routing structures 220, the fifth routing structures 224, the sixth routing structures 228, the seventh contact structures 230, the eighth contact structures 232 (FIGS. 14A and 14D), and the ninth contact structures 234 (FIG. 14D) may individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the fourth routing structures 220 are each formed of and include W; the fifth routing structures 224 are each formed of and include Cu; the sixth routing structures 228 are formed of and include Al; and the seventh contact structures 230, the eighth contact structures 232 (FIGS. 14A and 14D), and the ninth contact structures 234 (FIG. 14D) are each formed of and include W.

Still referring to collectively to FIGS. 14A through 14D, a ninth isolation material 236 may be formed on or over portions of at least the fourth routing structures 220, the fifth routing structures 224, the sixth routing structures 228, the seventh contact structures 230, the eighth contact structures 232 (FIGS. 14A and 14D), and the ninth contact structures 234 (FIG. 14D) (if any). The ninth isolation material 236 may be formed of and include at least one insulative material. In some embodiments, the ninth isolation material 236 is formed of and includes a dielectric oxide material, such as $SiO_x$ (e.g., $SiO_2$). The ninth isolation material 236 may be substantially homogeneous, or the ninth isolation material 236 may be heterogeneous. In some embodiments, the ninth isolation material 236 is substantially homogeneous. In additional embodiments, the ninth isolation material 236 is heterogeneous. The ninth isolation material 236 may, for example, be formed of and include a stack of at least two different dielectric materials. In addition, one or more openings may be formed within the ninth isolation material 236 (e.g., within a portion of the ninth isolation material 236 within the socket region 108 (FIG. 14D)) to expose (and, hence, facilitate access to) one or more portions of one or more of the sixth routing structures 228 (e.g., one or more conductive pad structures) of the sixth routing tier 226.

As shown in FIGS. 14A through 14D, the method described above with reference to FIGS. 1 through 14D may effectuate the formation of a microelectronic device 238 (e.g., a memory device, such as a DRAM device) including the features (e.g., structures, materials, devices) previously described herein. In some embodiments, at least some of the fourth routing structures 220, the fifth routing structures 224, and the sixth routing structures 228 are employed as global routing structures for the microelectronic device 238. The fourth routing structures 220, the fifth routing structures 224, and the sixth routing structures 228 may, for example, be configured to receive global signals from an external bus, and to relay the global signals to other features (e.g., structures, devices) of the microelectronic device 238.

Thus, in accordance with embodiments of the disclosure, a method of forming a microelectronic device comprises forming a microelectronic device structure assembly comprising memory cells, digit lines coupled to the memory cells, word lines coupled to the memory cells, and isolation material overlying the memory cells, the digit lines, and the word lines. An additional microelectronic device structure assembly comprising control logic devices and additional isolation material overlying the control logic devices is formed. The additional isolation material of the additional microelectronic device structure assembly is bonded to the isolation material of the microelectronic device structure assembly to attach the additional microelectronic device structure assembly to the microelectronic device structure assembly. The memory cells are electrically connected to at least some of the control logic devices after bonding the additional isolation material to the isolation material.

Figure 15:
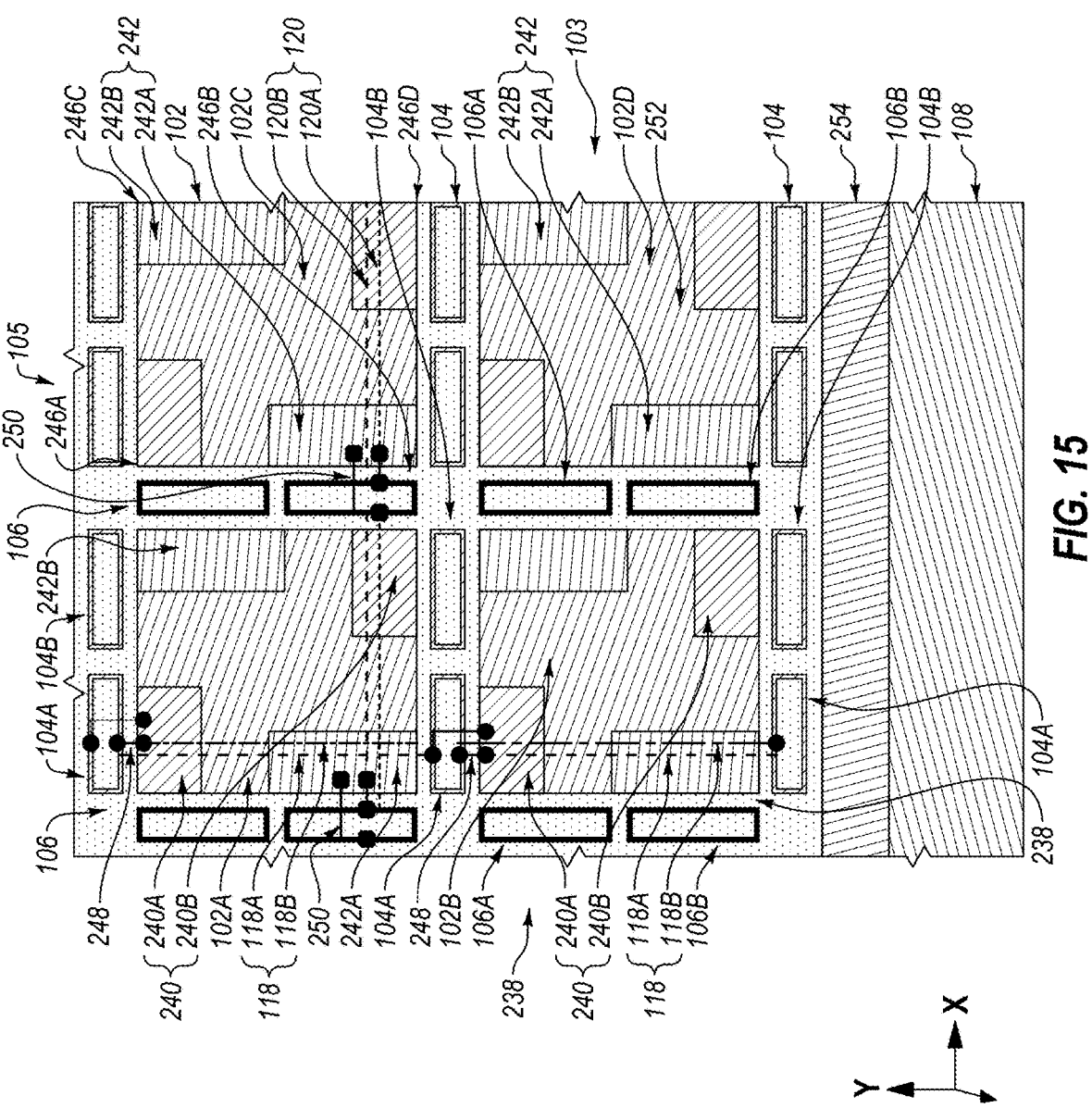
FIG. 15 is a simplified plan view of a microelectronic device, in accordance with an embodiment of the disclosure.

Referring next to FIG. 15, depicted is a simplified plan view of the microelectronic device 238 illustrating an arrangement of different control logic sections (described in further detail below) within individual different regions (e.g., the array regions 102, such as the first array region 102A, the second array region 102B, the third array region 102C, and the fourth array region 102D; the socket regions 108) of the microelectronic device 238, as well as routing arrangements to different control logic devices (e.g., corresponding to the control logic devices 191 (FIG. 14A)) within the different control logic sections, in accordance with embodiments of the disclosure. The different control logic devices of the different control logic sections may be positioned vertically above (e.g., in the Z-direction) the memory cells 146 (FIG. 14A) of the microelectronic device 238. At least some of the different control logic devices may be coupled to the memory cells 146 (FIG. 14A) in the manner previously described with reference to FIGS. 14A through 14D. For clarity and ease of understanding the description, not all features (e.g., structures, materials, devices) of the microelectronic device 238 previously described with reference to FIGS. 14A through 14D are illustrated in FIG. 15.

As shown in FIG. 15, within a horizontal area of each array region 102, the microelectronic device 238 may be formed to include a desired arrangement of sense amplifier (SA) sections 240 and sub-word line driver (SWD) sections 242. The SA sections 240 may include SA devices coupled to the digit lines 118 of the microelectronic device 238, as described in further detail below. The digit lines 118 may vertically underlie (e.g., in the Z-direction) the SA devices of the SA sections 240 within the microelectronic device 238. The SWD sections 242 may include SWD devices coupled to the word lines 120 of the microelectronic device 238, as also described in further detail below. The word lines 120 may vertically underlie (e.g., in the Z-direction) the SWD devices of the SWD sections 242 within the microelectronic device 238.

The SA sections 240 within a horizontal area of an individual array region 102 (e.g., the first array region 102A, the second array region 102B, the third array region 102C, or the fourth array region 102D) may include a first SA section 240A and a second SA section 240B. For an individual array region 102, the first SA section 240A and the second SA section 240B may be positioned at or proximate opposite corners (e.g., diagonally opposite corners) of the array region 102 than one another. For example, as shown in FIG. 15, for an individual array region 102, the first SA section 240A may be positioned at or proximate a first corner 246A of the array region 102, and the second SA section 240B may be positioned at or proximate a second corner 246B of the array region 102 located diagonally opposite (e.g., kitty-corner) the first corner 246A.

For each SA section 240 (e.g., the first SA section 240A, the second SA section 240B) within an individual array region 102, the SA devices of the SA section 240 may be coupled to a group of the digit lines 118 horizontally extending (e.g., in the Y-direction) through the array region 102 by way of digit line routing and contact structures 248. The digit line routing and contact structures 248 may, for example, correspond to some of the routing structures (e.g., some of the fourth routing structures 220 (FIGS. 14A and 14B)) and some of the contact structures (e.g., some of the seventh contact structures 230 (FIGS. 14A and 14B); some of the sixth contact structures 216 (FIGS. 14A and 14B); some of the first group 132A (FIG. 14B) of the third contact structures 132 (FIG. 14B)) previously described herein.

The SA devices of the SA sections 240 of array regions 102 horizontally neighboring one another in the Y-direction (e.g., the first array region 102A and the second array region 102B; the third array region 102C and the fourth array region 102D) may be coupled to different groups of digit lines 118 than one another. For example, each of the SA sections 240 (e.g., each of the first SA section 240A and the second SA section 240B) of the first array region 102A may include so-called "even" SA devices coupled to even digit lines 118B of the microelectronic device 238 by way of the digit line routing and contact structures 248 associated with the SA sections 240; and each of the SA sections 240 (e.g., each of the first SA section 240A and the second SA section 240B) of the second array region 102B may include so-called "odd" SA devices coupled to odd digit lines 118A of the microelectronic device 238 by way of the digit line routing and contact structures 248 associated with the SA sections 240; or vice versa. The even digit lines 118B of the microelectronic device 238 may horizontally alternate with the odd digit lines 118A of the microelectronic device 238 in the X-direction. The SA devices of each of the SA sections 240 of the first array region 102A may not be coupled to any odd digit lines 118A; and the SA devices of each of the SA sections 240 of the second array region 102B may not be coupled to any even digit lines 118B; or vice versa. Similarly, each of the SA sections 240 (e.g., each of the first SA section 240A and the second SA section 240B) of the third array region 102C horizontally neighboring the first array region 102A in the X-direction may include additional even SA devices coupled to additional even digit lines 118B of the microelectronic device 238 by way of the digit line routing and contact structures 248 associated with the SA sections 240; and each of the SA sections 240 (e.g., each of the first SA section 240A and the second SA section 240B) of the fourth array region 102D horizontally neighboring the second array region 102B in the X-direction may include additional odd SA devices coupled to additional odd digit lines 118A of the microelectronic device 238 by way of the digit line routing and contact structures 248 associated with the SA sections 240; or vice versa.

As shown in FIG. 15, the SA devices (e.g., odd SA devices or even SA devices) within an individual SA section 240 of an individual array region 102 may be coupled to digit lines (e.g., odd digit lines 118A or even digit lines 118B) horizontally extending through the array region 102, and may also be coupled to additional digit lines (e.g., additional odd digit lines 118A or additional even digit lines 118B) horizontally extending through another array region 102 horizontally neighboring the array region 102 in the Y-direction. For example, some odd SA devices within the first SA section 240A of the second array region 102B may be coupled to odd digit lines 118A horizontally extending through the second array region 102B by way of some digit line routing and contact structures 248 extending to and through the first digit line exit subregion 104A horizontally neighboring the second array region 102B in the Y-direction; and some additional odd SA devices within the first SA section 240A of the second array region 102B may be coupled to additional odd digit lines 118A horizontally extending through the first array region 102A by way of some additional digit line routing and contact structures 248 extending to and through the first digit line exit subregion 104A. As another example, some even SA devices within the second SA section 240B of the first array region 102A may be coupled to even digit lines 118B horizontally extending through the first array region 102A by way of some digit line routing and contact structures 248 extending to and through the second digit line exit subregion 104B horizontally neighboring the first array region 102A in the Y-direction; and some additional even SA devices within the second SA section 240B of the first array region 102A may be coupled to additional even digit lines 118B horizontally extending through the second array region 102B by way of some additional digit line routing and contact structures 248 extending to and through the second digit line exit subregion 104B.

With maintained reference to FIG. 15, the SWD sections 242 within a horizontal area of an individual array region 102 (e.g., the first array region 102A, the second array region 102B, the third array region 102C, or the fourth array region 102D) may include a first SWD section 242A and a second SWD section 242B. For an individual array region 102, the first SWD section 242A and the second SWD section 242B may be positioned at or proximate different corners than the first SA section 240A and a second SA section 240B. In addition, the corner of the array region 102 associated with first SWD section 242A may oppose (e.g., diagonally oppose) the corner of the array region 102 associated with second SWD section 242B. For example, as shown in FIG. 15, for an individual array region 102, the first SWD section 242A may be positioned at or proximate a third corner 246C of the array region 102, and the second SWD section 242B may be positioned at or proximate a fourth corner 246D of the array region 102 located diagonally opposite (e.g., kitty-corner) the third corner 246C.

For each SWD section 242 (e.g., the first SWD section 242A, the second SWD section 242B) within an individual array region 102, the SWD devices of the SWD section 242 may be coupled to a group of the word lines 120 horizontally extending (e.g., in the X-direction) through the array region 102 by way of word line routing and contact structures 250. The word line routing and contact structures 250 may, for example, correspond to some of the routing structures (e.g., some of the fourth routing structures 220 (FIGS. 14A and 14C)) and some of the contact structures (e.g., some of the seventh contact structures 230 (FIGS. 14A and 14C); some of the sixth contact structures 216 (FIG. 14C); some of the second group 132B (FIG. 14C) of the third contact structures 132 (FIG. 14C)) previously described herein.

The SWD devices of the SWD sections 242 of array regions 102 horizontally neighboring one another in the X-direction (e.g., the first array region 102A and the third array region 102C; the second array region 102B and the fourth array region 102D) may be coupled to different groups of word lines 120 than one another. For example, each of the SWD sections 242 (e.g., each of the first SWD section 242A and the second SWD section 242B) of the first array region 102A may include so-called "even" SWD devices coupled to even word lines 120B of the microelectronic device 238 by way of the word line routing and contact structures 250 associated with the SWD sections 242; and each of the SWD sections 242 (e.g., each of the first SWD section 242A and the second SWD section 242B) of the third array region 102C may include so-called "odd" SWD devices coupled to odd word lines 120A of the microelectronic device 238 by way of the word line routing and contact structures 250 associated with the SWD sections 242; or vice versa. The even word lines 120B of the microelectronic device 238 may horizontally alternate with the odd word lines 120A of the microelectronic device 238 in the Y-direction. The SWD devices of each of the SWD sections 242 of the first array region 102A may not be coupled to any odd word lines 120A; and the SWD devices of each of the SWD sections 242 of the third array region 102C may not be coupled to any even word lines 120B; or vice versa. Similarly, each of the SWD sections 242 (e.g., each of the first SWD section 242A and the second SWD section 242B) of the second array region 102B horizontally neighboring the first array region 102A in the Y-direction may include additional even SWD devices coupled to additional even word lines 120B of the microelectronic device 238 by way of the word line routing and contact structures 250 associated with the SWD sections 242; and each of the SWD sections 242 (e.g., each of the first SWD section 242A and the second SWD section 242B) of the fourth array region 102D horizontally neighboring the third array region 102C in the Y-direction may include additional odd SWD devices coupled to additional odd word lines 120A of the microelectronic device 238 by way of the word line routing and contact structures 250 associated with the SWD sections 242; or vice versa.

As shown in FIG. 15, the SWD devices (e.g., odd SWD devices or even SWD devices) within an individual SWD section 242 of an individual array region 102 may be coupled to word lines (e.g., odd word lines 120A or even word lines 120B) horizontally extending through the array region 102, and may also be coupled to additional word lines (e.g., additional odd word lines 120A or additional even word lines 120B) horizontally extending through another array region 102 horizontally neighboring the array region 102 in the X-direction. For example, some odd SWD devices within the first SWD section 242A of the third array region 102C may be coupled to odd word lines 120A horizontally extending through the third array region 102C by way of some word line routing and contact structures 250 extending to and through the second word line exit subregion 106B horizontally neighboring the third array region 102C in the X-direction; and some additional odd SWD devices within the first SWD section 242A of the third array region 102C may be coupled to additional odd word lines 120A horizontally extending through the first array region 102A by way of some additional word line routing and contact structures 250 extending to and through the second word line exit subregion 106B. As another example, some even SWD devices within the second SWD section 242B of the first array region 102A may be coupled to even word lines 120B horizontally extending through the first array region 102A by way of some word line routing and contact structures 250 extending to and through the first word line exit subregion 106A horizontally neighboring the first array region 102A in the X-direction; and some additional even SWD devices within the second SWD section 242B of the first array region 102A may be coupled to additional even word lines 120B horizontally extending through the third array region 102C by way of some additional word line routing and contact structures 250 extending to and through the first word line exit subregion 106A.

With maintained reference to FIG. 15, within a horizontal area of each array region 102, the microelectronic device 238 may include additional control logic sections individually including additional control logic devices (e.g., control logic devices other than SA devices and SWD devices). For example, for each array region 102, additional control logic sections 252 may be positioned horizontally between (e.g., at relatively more horizontally central positions within the array region 102) the SA sections 240 and the SWD sections 242. The additional control logic sections 252 may include, but are not limited to, column decoder device sections including column decoder device, and main word line (MWD) sections including MWD devices.

Still referring to FIG. 15, within a horizontal area of each socket region 108, the microelectronic device 238 may include further control logic sections 254 individually including further control logic devices (e.g., control logic devices in addition to those located within the horizontal areas of the array regions 102). For example, for each socket region 108, one or more further control logic sections 254 may be positioned horizontally between deep contact structures assemblies (e.g., vertically extending from one or more of the fifth routing structures 224 (FIG. 14D) to one or more of the second routing structures 144 (FIG. 14D)) within the socket region 108 and the array regions 102 horizontally neighboring the socket region 108. At least some of the further control logic devices within the further control logic sections 254 may have different configurations and different operational functions than the control logic devices located within the horizontal areas of the array regions 102. By way of non-limiting example, the further control logic sections 254 may include bank logic sections including bank logic devices.

Thus, in accordance with embodiments of the disclosure, a method of forming a microelectronic device comprises forming a first semiconductor wafer comprising access devices within array regions, digit lines coupled to the access devices and terminating within digit line exit regions neighboring the array regions, and word lines coupled to the access devices and terminating within word line exit regions neighboring the array regions. Digit line contact structures extending through and in contact with the digit lines within the digit line exit regions are formed. Word line contact structures extending through and in contact with the word lines within the word line exit regions are formed. Capacitors are formed over and in electrical communication with the access devices to form memory cells within the array regions. A second semiconductor wafer comprising control logic devices is formed. The second semiconductor wafer is attached to the first semiconductor wafer such that at least some of the control logic devices of the second semiconductor wafer are positioned within the array regions of the first semiconductor wafer. Additional contact structures are formed over the digit line contact structures and the word line contact structures. Some of the additional contact structures are in contact with the digit line contact structures. Some other of the additional contact structures are in contact with the word line contact structures. Routing structures are formed over the control logic devices and the additional contact structures. The routing structures are in electrical communication with the control logic devices and the memory cells.

Furthermore, in accordance with embodiments of the disclosure, a microelectronic device comprises array regions, digit line exit regions, and word line exit regions. The array regions individually comprise memory cells, digit lines, word lines, and control logic devices. The memory cells comprise access devices and storage node devices. The digit lines are coupled to the access devices and extend in a first direction. The word lines are coupled to the access devices and extend in a second direction orthogonal to the first direction. The control logic devices are over and in electrical communication with the memory cells. The digit line exit regions horizontally alternate with the array regions in the first direction. The digit line exit regions individually comprise portions of the digit lines extending beyond the array regions adjacent thereto, digit line contact structures extending through at least some of the portions of the digit lines, contact structures on the digit line contact structures, and routing structures coupled to the contact structures. The contact structures individually comprise a lower region, and an upper region integral and continuous with the lower region and having smaller horizontal dimensions than the lower region. The word line exit regions horizontally alternate with the array regions in the second direction. The word line exit regions individually comprise portions of the word lines extending beyond the array regions adjacent thereto, word line contact structures extending through at least some of the portions of the word lines, additional contact structures on the word line contact structures, and additional routing structures coupled to the additional contact structures. The additional contact structures individually comprise an additional lower region, and an additional upper region integral and continuous with the additional lower region and having smaller horizontal dimensions than the additional lower region.

Figure 16:
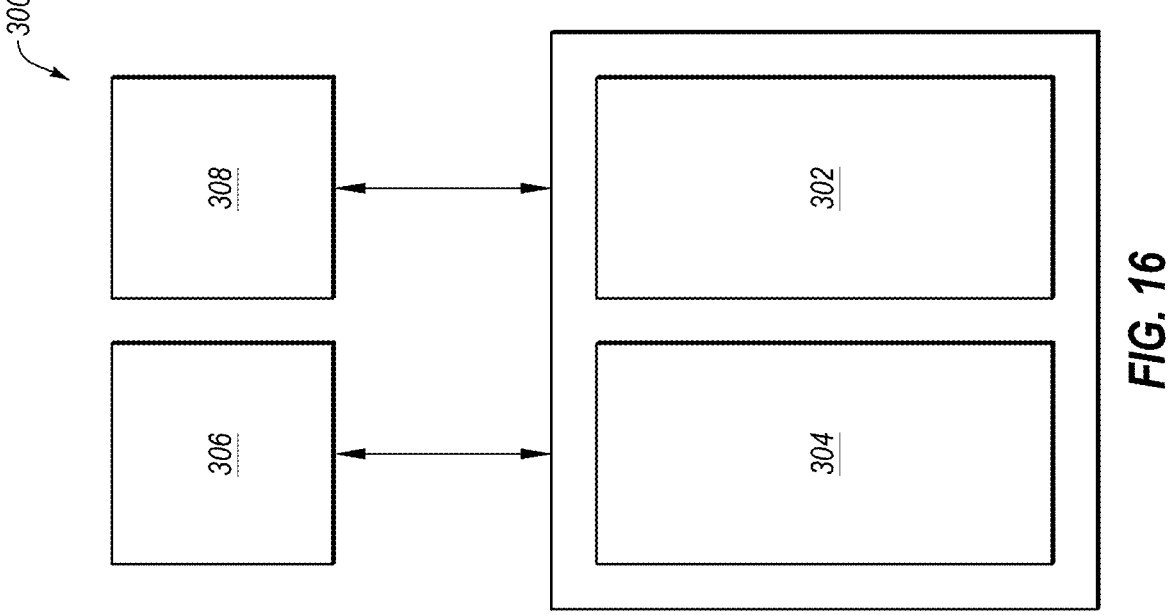
FIG. 16 is a schematic block diagram of an electronic system, in accordance with an embodiment of the disclosure.

Microelectronic devices (e.g., the microelectronic device 238 (FIGS. 14A through 14D)) in accordance with embodiments of the disclosure may be used in embodiments of electronic systems of the disclosure. For example, FIG. 16 is a block diagram illustrating an electronic system 300 according to embodiments of the disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 300 includes at least one memory device 302. The memory device 302 may comprise, for example, a microelectronic device (e.g., the microelectronic device 238 (FIGS. 14A through 14D)) previously described herein. The electronic system 300 may further include at least one electronic signal processor device 304 (often referred to as a "microprocessor"). The electronic signal processor device 304 may, optionally, comprise a microelectronic device (e.g., the microelectronic device 238 (FIGS. 14A through 14D)) previously described herein. While the memory device 302 and the electronic signal processor device 304 are depicted as two (2) separate devices in FIG. 16, in additional embodiments, a single (e.g., only one) memory/processor device having the functionalities of the memory device 302 and the electronic signal processor device 304 is included in the electronic system 300. In such embodiments, the memory/processor device may include a microelectronic device (e.g., the microelectronic device 238 (FIGS. 14A through 14D)) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 comprise a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosure, an electronic system comprises an input device, an output device, a processor device operably connected to the input device and the output device, and a memory device operably connected to the processor device. The memory device comprises memory array regions, a digit line contact region between two of the memory array regions neighboring one another in a first direction, and a word line contact region between two other of the memory array regions neighboring one another in a second direction perpendicular to the first direction. The memory array regions each comprise dynamic random-access memory (DRAM) cells, digit lines coupled to the DRAM cells, word lines coupled to the DRAM cells, and control logic circuitry overlying and in electrical communication with the DRAM cells. The digit line contact region comprises end portions of some of the digit lines extending past horizontal boundaries of the two of the memory array regions; digit line contacts coupled to and extending completely through the end portions of the some of the digit lines; contact structures on the digit line contacts and individually comprising a lower region and an upper region integral and continuous with the lower region, the upper region having smaller horizontal dimensions than the lower region; and routing structures over and coupled to the contact structures. The word line contact region comprises end portions of some of the word lines extending past horizontal boundaries of the two other of the memory array regions; word line contacts coupled to and extending completely through the end portions of the some of the word lines; additional contact structures on the word line contacts and individually comprising an additional lower region and an additional upper region integral and continuous with the additional lower region, the additional upper region having smaller horizontal dimensions than the additional lower region; and additional routing structures over and coupled to the additional contact structures.

The structures, devices, and methods of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. The structures, devices, and methods of the disclosure may also improve scalability, efficiency, and simplicity as compared to conventional structures, conventional devices, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment may be combined with elements and features disclosed in relation to other embodiments of the disclosure.

What is claimed is:

1. A method of forming a microelectronic device, comprising:

forming a microelectronic device structure assembly comprising memory cells, digit lines coupled to the memory cells, word lines coupled to the memory cells, and isolation material overlying the memory cells, the digit lines, and the word lines, wherein forming the microelectronic device structure assembly comprises:

forming a first microelectronic device structure comprising a first base semiconductor structure, the digit lines, the word lines, and access devices of the memory cells coupled to the digit lines and the word lines;

forming contact structures coupled to the digit lines within digit line exit regions neighboring the access devices in a first horizontal direction;

forming additional contact structures coupled to the word lines within word line exit regions neighboring the access devices in a second horizontal direction;

forming further contact structures within socket regions;

after forming the further contact structures, forming storage node devices of the memory cells over and in electrical communication with the access devices of the memory cells; and forming routing structures over the storage node devices of the memory cells, at least some of the routing structures coupled to the further contact structures and in electrical communication with the storage node devices;

forming an additional microelectronic device structure assembly comprising control logic devices and additional isolation material overlying the control logic devices;

bonding the additional isolation material of the additional microelectronic device structure assembly to the isolation material of the microelectronic device structure assembly to attach the additional microelectronic device structure assembly to the microelectronic device structure assembly; and electrically connecting the memory cells to at least some of the control logic devices after bonding the additional isolation material to the isolation material.

2. The method of claim 1, further comprising forming capacitors within the socket regions, at least some of the capacitors coupled to one or more of the further contact structures.

3. The method of claim 1, further comprising selecting the isolation material of the microelectronic device structure assembly and the additional isolation material of the additional microelectronic device structure assembly to each comprise a dielectric oxide material.

4. The method of claim 1, further comprising:

bonding a second microelectronic device structure over the routing structures to form a first assembly comprising the first microelectronic device structure, the contact structures, the additional contact structures, the memory cells, the routing structures, and the second microelectronic device structure;

vertically inverting the first assembly;

removing a section of the first base semiconductor structure after vertically inverting the first assembly to expose portions of the contact structures, and the additional contact structures;

forming sacrificial structures on the exposed portions of the contact structures and the additional contact structures; and forming the isolation material over the memory cells and the sacrificial structures.

5. The method of claim 4, wherein forming an additional microelectronic device structure assembly comprises:

forming a third microelectronic device structure comprising a second base semiconductor structure and the control logic devices at least partially overlying the second base semiconductor structure;

bonding a fourth microelectronic device structure over the control logic devices to form a second assembly comprising the third microelectronic device structure and the fourth microelectronic device structure;

vertically inverting the second assembly;

removing a section of the second base semiconductor structure after vertically inverting the second assembly; and forming the additional isolation material over the control logic devices.

6. The method of claim 5, further comprising:

removing a portion of the fourth microelectronic device structure of the additional microelectronic device structure after attaching the additional microelectronic device structure to the microelectronic device structure; and forming contact openings vertically extending through a remaining portion of the additional microelectronic device structure and the isolation material of the microelectronic device structure to expose the sacrificial structures;

selectively removing the sacrificial structures, after forming the contact openings, to form void spaces in communication with the contact openings; and filling the contact openings and the void spaces with conductive material to form additional contact structures.

7. The method of claim 1, further comprising:

forming routing structures over the control logic devices and in electrical communication with the control logic devices and the memory cells; and forming pad structures over and in electrical communication with the routing structures.

8. The method of claim 7, wherein:

forming routing structures over the control logic devices comprises:

forming tungsten routing structures over the control logic devices and in electrical communication with the control logic devices and the memory cells; and forming copper routing structures over and in electrical communication with the tungsten routing structures; and forming pad structures comprises forming aluminum pad structures over and in electrical communication with the copper routing structures.

9. A method of forming a microelectronic device, comprising:

forming a first semiconductor wafer comprising access devices within array regions, digit lines coupled to the access devices and terminating within digit line exit regions neighboring the array regions, and word lines coupled to the access devices and terminating within word line exit regions neighboring the array regions;

forming digit line contact structures extending through and in contact with the digit lines within the digit line exit regions;

forming word line contact structures extending through and in contact with the word lines within the word line exit regions;

forming capacitors over and in electrical communication with the access devices to form memory cells within the array regions;

forming a second semiconductor wafer comprising control logic devices;

attaching the second semiconductor wafer to the first semiconductor wafer such that at least some of the control logic devices of the second semiconductor wafer are positioned within the array regions of the first semiconductor wafer;

forming additional contact structures over the digit line contact structures and the word line contact structures, some of the additional contact structures in contact with the digit line contact structures, some other of the additional contact structures in contact with the word line contact structures; and forming routing structures over the control logic devices and the additional contact structures, the routing structures in electrical communication with the control logic devices and the memory cells.

10. The method of claim 9, wherein attaching the second semiconductor wafer to the first semiconductor wafer comprises:

vertically inverting the second semiconductor wafer;

physically contacting a first dielectric oxide material of the first semiconductor wafer with a second dielectric oxide material of the first semiconductor wafer after vertically inverting the second semiconductor wafer; and annealing the first dielectric oxide material and the second dielectric oxide material after physically contacting the first dielectric oxide material with the second dielectric oxide material to form oxide-oxide bonds between the first dielectric oxide material and the second dielectric oxide material.

11. The method of claim 9, further comprising:

forming further contact structures within socket regions of the first semiconductor wafer prior to attaching the second semiconductor wafer to the first semiconductor wafer, the socket region horizontally offset from the digit line exit regions and the word line exit regions; and forming yet some other of the additional contact structures over and in contact with the further contact structures.

12. The method of claim 11, further comprising forming additional capacitors within the socket regions of the first semiconductor wafer and in electrical communication with at least some of the further contact structures, at least some of the additional capacitors in electrical communication with at least some of the control logic devices of the second semiconductor wafer after forming the routing structures.

13. The method of claim 9, wherein:

forming digit line contact structures comprises forming the digit line contact structures to physically contact the digit lines and a semiconductor material of the first semiconductor wafer underlying the digit lines; and forming word line contact structures comprises forming the word line contact structures to physically contact word lines and the semiconductor material of the first semiconductor wafer.

14. The method of claim 13, further comprising, before attaching the second semiconductor wafer to the first semiconductor wafer:

vertically inverting the first semiconductor wafer after forming the digit line contact structures and the word line contact structures;

removing a portion of the semiconductor material to expose surfaces of the digit line contact structures and the word line contact structures;

forming sacrificial dielectric structures on the exposed surfaces of the digit line contact structures and the word line contact structures; and forming a dielectric oxide material over the sacrificial dielectric structures and remaining portions of the semiconductor material.

15. The method of claim 14, wherein forming additional contact structures over the digit line contact structures and the word line contact structures comprises:

forming contact openings vertically extending through additional dielectric oxide material of the second semiconductor wafer and the dielectric oxide material overlying the sacrificial dielectric structures to expose the sacrificial dielectric structures;

exhuming the sacrificial dielectric structures through the contact openings to form open volumes, the open volumes re-exposing the surfaces of the digit line contact structures and the word line contact structures; and filling the contact openings and the open volumes with conductive material to form the additional contact structures.

16. A method of forming a microelectronic device, comprising:

forming an assembly comprising:

an array of volatile memory cells;

digit lines coupled to the array of volatile memory cells and extending in parallel in a first direction;

digit line contact structures extending through and in contact with the digit lines;

word lines coupled to the array of volatile memory cells and extending in parallel in a second direction orthogonal to the first direction;

word line contact structures extending through and in contact with the word lines;

dielectric oxide material overlying the array of volatile memory cells, the digit lines, and the word lines; and forming an additional assembly comprising control logic circuitry and additional dielectric oxide material overlying the control logic circuitry;

bonding the additional dielectric oxide material of the additional assembly to the dielectric oxide material of the assembly to attach the additional assembly to the assembly;

forming contact structures coupled to the digit lines and the word lines after bonding the additional dielectric oxide material of the additional assembly to the dielectric oxide material of the assembly; and forming routing structures vertically over and coupled to the contact structures and the control logic circuitry.

17. The method of claim 16, wherein:

forming contact structures coupled to the digit lines and the word lines comprises:

forming some of the contact structures over and in contact with the digit line contact structures; and forming some other of the contact structures over and in contact with the word line contact structures; and forming routing structures vertically over and coupled to the contact structures and the control logic circuitry comprises:

forming some of the routing structures to horizontally extend from some of the contact structures to sense amplifier devices of the control logic circuitry; and forming some other of the routing structures to horizontally extend from the some other of the contact structures to sub-word line driver devices of the control logic circuitry.

* * * * *